(12) United States Patent
Yabuki et al.

(10) Patent No.: US 8,728,712 B2
(45) Date of Patent: May 20, 2014

(54) POLYMERIZABLE COMPOSITION

(71) Applicant: Fujifilm Corporation, Tokyo (JP)

(72) Inventors: Yoshiharu Yabuki, Shizuoka (JP); Kimi Ikeda, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 13/752,927

(22) Filed: Jan. 29, 2013

(65) Prior Publication Data

US 2013/0143164 A1  Jun. 6, 2013

Related U.S. Application Data

(63) Continuation of application No. PCT/JP2011/067922, filed on Jul. 29, 2011.

(30) Foreign Application Priority Data

Jul. 29, 2010 (JP) .................................. 2010-171224

(51) Int. Cl.
*H01L 21/02* (2006.01)
*C08K 13/02* (2006.01)
*C08J 3/28* (2006.01)

(52) U.S. Cl.
USPC .............................................. 430/311; 522/9

(58) Field of Classification Search
None
See application file for complete search history.

(56) References Cited

U.S. PATENT DOCUMENTS

| | | |
|---|---|---|
| 2005/0056903 A1 | 3/2005 | Yamamoto et al. |
| 2012/0129090 A1 | 5/2012 | Mamak et al. |
| 2012/0244473 A1 | 9/2012 | Okuda et al. |

FOREIGN PATENT DOCUMENTS

| | | |
|---|---|---|
| EP | 2 508 947 A1 | 10/2012 |
| EP | 2 572 243 | 3/2013 |
| JP | 2008-257045 A | 10/2008 |
| JP | 2009-194396 A | 8/2009 |
| JP | 2009-205029 A | 9/2009 |
| JP | 4492760 B1 | 6/2010 |
| WO | 2010/046285 A2 | 4/2010 |
| WO | 2011/067998 A1 | 6/2011 |
| WO | 2011-067998 A1 | 6/2011 |
| WO | 2011/145742 A1 | 11/2011 |

OTHER PUBLICATIONS

Machine translation of JP 4492760 B1 to Fujita et al. (Jun. 30, 2010).*
Schroeder et al. Polymer International, 60(9), 2011, 1362-1369.*
BASF's Fanal Blue D 6340 Data Sheet, retrieved on Aug. 16, 2013.*
Machine translation of JP 2009-053249 A to Yano et al. (Mar. 12, 2009).*
"Fanal Blue D 6340"; Data Sheet on Product Safety; BASF The Chemical Company; printed Jan. 22, 2007; 1 page total.
International Search Report (PCT/ISA/210), issued Sep. 20, 2011, in corresponding International Application No. PCT/JP2011/067922.

(Continued)

*Primary Examiner* — Vu A Nguyen

(74) *Attorney, Agent, or Firm* — Sughrue Mion, PLLC

(57) ABSTRACT

Provided is a polymerizable composition containing (A) a polymerization initiator, (B) a polymerizable compound, (C) at least either a tungsten compound or a metal boride, (D) a compound having a maximum absorption wavelength between 300 nm and 450 nm and assuming that the maximum absorbance between 300 nm and 450 nm is 1, having an absorbance of 0.3 or less at a wavelength of 550 nm, and (E) an alkali-soluble binder.

15 Claims, 10 Drawing Sheets

(56) References Cited

OTHER PUBLICATIONS

Written Opinion (PCT/ISA/237), issued Sep. 20, 2011, in corresponding International Application No. PCT/JP2011/067922.
Office Action dated Jan. 14, 2014 issued by the Japanese Patent Office in corresponding Japanese Application No. 2010-171224.
"Fanal® pigments for printing inks", BASF, Technical Information (Aug. 1991), retrieved on Dec. 27, 2013, URL, http://www.basf.com.mx/specialty_colorants/pdfs/fanal_pigments_2552e.pdf, 2 pgs total.
Extended European Search Report issued Apr. 3, 2014, in corresponding European Patent Application No. 11812659.8.

* cited by examiner

POLYMERIZABLE COMPOSITION

CROSS REFERENCE TO RELATED APPLICATIONS

This is a continuation of International Application No. PCT/JP2011/067922 filed Jul. 29, 2011, which claims priority from Japanese Patent Application No. 2010-171224 filed Jul. 29, 2010, the contents of all of which are incorporated herein by reference.

TECHNICAL FIELD

The present invention relates to a polymerizable composition. More specifically, the present invention relates to a polymerizable composition suitably usable for the formation of a solder resist.

BACKGROUND ART

Conventionally, in the case of forming a permanent pattern such as solder resist, a photosensitive layer is formed on an objective member by using a method of spin-coating a photosensitive composition in a liquid form, a screen printing method, a method of forming and drying a coated film according to a spray printing method, or a method of coating and drying a photosensitive composition on a temporary support to obtain a laminate film having a photosensitive layer and transferring only the photosensitive layer onto a member by means of a vacuum laminator or a roll laminator. As for the method to form a permanent pattern such as solder resist, there is known, for example, a method where a photosensitive layer is formed by the method above on a silicon wafer on which a permanent pattern is formed, a silicon wafer having wiring thereon, or a substrate such as copper-lined laminate board, and the photosensitive layer of the laminate is exposed, then developed to form a pattern and subjected to a curing treatment or the like, thereby forming a permanent pattern.

This permanent pattern formation is also applied to a package substrate interposed between a semiconductor chip and a printed board. As for the package substrate, higher density packaging is recently demanded, and reduction in the wiring pitch, increase in the strength of a solder resist layer, enhancement of the insulating property, thin film formation and the like are proceeding. In turn, resistance to repeated cold/hot impacts (thermal cycle test resistance, TCT resistance) is more keenly demanded. Also, reduction in the via diameter and in view of mounting, a rectangular pattern profile are required.

Furthermore, the photosensitive composition for the formation of a permanent pattern represented by such a solder resist is demanded to ensure that even when a member having a permanent pattern is placed under high-temperature high-humidity conditions, deformation of the permanent pattern or separation of the permanent pattern from the base material does not occur. For example, when such a defect is generated in a solder resist, there arises a problem that a wiring covered with the solder resist develops a dendrite and adjacent wirings are electrically conducted unintentionally. Therefore, it is also important that the solder resist has excellent durability against high temperature and high humidity.

On the other hand, a solid-state imaging device (image sensor) used in cellular phones, digital cameras, digital videos, monitoring cameras and the like is a photoelectric conversion device having an integrated circuit formed using the production technique of a semiconductor device. In recent years, with reduction in size and weight of a cellular phone or a digital camera, the solid-state imaging device is required to be more downsized.

For downsizing the solid-state imaging device, a technique of applying a through-electrode or thinning a silicon wafer has been proposed (see, for example, JP-A-2009-194396 (the term "JP-A" as used herein means an "unexamined published Japanese patent application")). Downsizing can be realized by polishing and thereby thinning the silicon wafer, but due to thinning of the silicon wafer, light at a wavelength of 800 nm or more is liable to be transmitted, though the effect of blocking light at 800 nm or less is maintained. A photodiode used in the solid-state imaging device reacts also to light at a wavelength of 800 to 1,200 nm, and transparency to light at a wavelength of 800 nm or more is found to cause a new problem that the pictorial quality is deteriorated.

The solid-state imaging device has a configuration that a color filter and a lens are provided adjacently to one side of a photodiode, an infrared cut filter is present in the vicinity of the color filter or lens to cut light at a wavelength of 800 to 1,200 nm, and a metal wiring, a solder resist and the like are present on the opposite side of the color filter. For example, the space between metal wirings is filled with a solder resist in many cases, but there is a problem that infrared light such as leakage light intruding into the inside of a cellular phone, a digital camera or the like cannot be cut by the solder resist. To cope with this problem, a technique of further providing an infrared-blocking layer on the outer side of the solder resist poor in the light-blocking effect for infrared light and thereby ensuring the infrared-blocking effect has been conventionally employed. However, a height difference due to wiring or the like is generally present on the solder resist and an infrared-blocking layer material can be hardly coated to a uniform thickness on a substrate surface having a height difference, which gives rise to a problem that if a thin portion exists, light is transmitted therethrough.

In order to provide an infrared-blocking layer only in a desired portion, the composition preferably exhibits photosensitivity and has a photolithography performance enabling patterning by exposure. The light-blocking photosensitive composition having a photolithography performance includes a black resist using carbon black employed for the formation of an LCD color filter. The carbon black has a high light-blocking effect in the visible region but exhibits a low light-blocking effect in the infrared region and when it is attempted to apply such a black resist as a solder resist, if carbon black is added in an amount large enough to ensure the required light-blocking effect in the infrared region, this causes a problem that the light-blocking effect in the visible region becomes excessively high, light at a shorter wavelength than the visible region, which is usually employed for image formation and used at the exposure to high-pressure mercury lamp, KrF, ArF or the like, is also cut to incur reduction in the sensitivity, making it impossible to obtain sufficient photo-curability, and an excellent pattern cannot be obtained even through a development step using an alkali developer.

Also, at present, an infrared-blocking layer is separately provided after forming a solder resist by a coating method and therefore, in the solder resist formation and the infrared-blocking layer formation, steps such as coating, exposure, development and post-heating must be performed a plurality of times, which leads to a cumbersome process and a rise in the cost. In this regard, improvements are required.

For meeting the requirement, it has been attempted to impart a light-blocking effect to the solder resist itself, and, for example, a black solder resist composition containing a black colorant, a colorant other than black, and a polyfunctional epoxy compound has been proposed (see, for example, JP-A-2008-257045). However, this composition is characterized in that the content of the black colorant is kept low by using a colorant other than black in combination, and is practically insufficient from the standpoint of satisfying both light-blocking effect, particularly light-blocking effect in the infrared region, and pattern formability.

SUMMARY OF INVENTION

For the purpose of detecting the position of a semiconductor substrate by a visible light sensor in the process of producing a solid-state imaging device, an alignment mark in a protruded form is often provided at the predetermined position on the surface on the metal wiring and solder resist side (that is, the surface opposite the color filter or lens) of a semiconductor substrate of a solid-state imaging device.

In the case of the above-described configuration where an infrared-blocking layer is further provided on the outer side of the solder resist lacking the light-blocking effect for infrared light, it is considered that even when the infrared-blocking layer is a layer having a light-blocking effect also for visible light, the thickness of this layer need not be so large for the infrared-blocking purpose (because the infrared-blocking purpose can be achieved by a thinner film than the solder resist layer) and therefore, the detection by a visible light sensor does not face a serious trouble due to covering of the alignment mark with the infrared-blocking layer. However, particularly in the configuration where, as in JP-A-2008-257045, a black colorant is contained in the solder resist composition for imparting a light-blocking effect to the solder resist itself, when the alignment mark is covered with a solder resist layer, maybe due to the thickness of the solder resist layer, a trouble that the alignment mark is not detected by the visible light sensor is liable to more often occur.

Under these circumstances, a polymerizable composition ensuring excellent durability against high temperature and high humidity, high light-blocking effect in the infrared region, high light transparency in the visible region, and capability of forming an excellent pattern by alkali development is demanded at present. Above all, a polymerizable composition enabling realization of an excellent rectangular pattern independently of the material or the like of the substrate surface on which a pattern is provided, is keenly demanded.

Incidentally, JP-A-2009-205029 discloses a technique of using an inorganic near infrared absorber-containing layer as a near infrared-absorbing layer for an image display device, and, for example, a coating solution for near infrared-absorbing layer formation, containing a polymerizable compound, a polymerization initiator and a near infrared absorber, is described in working examples, but the layer obtained from this coating solution is not subjected to pattern formation through exposure and alkali development. Actually, this layer is, even in the unexposed region, insufficient in solubility for an alkali developer and has substantially no alkali developability.

The present invention has been made by taking into consideration these current circumstances, and the task of the present invention is to solve those conventional problems and attain the following object.

That is, an object of the present invention is to provide a polymerizable composition exhibiting high light-blocking effect in the infrared region and high light transparency in the visible region and being capable of forming a pattern having a rectangular cross-sectional shape as well as excellent durability (for example, durability against high temperature/high humidity, or adherence to substrate) by alkali development.

Another object of the present invention is to provide a polymerizable composition ensuring that the pattern obtained has a rectangular cross-sectional shape even when provided on a substrate surface without high light reflectivity or on a substrate surface with high light reflectivity (for example, metal surface).

The present invention has the following configurations, and the above-described objects can be attained by these configurations.

(1) A polymerizable composition containing:
    (A) a polymerization initiator,
    (B) a polymerizable compound,
    (C) at least either a tungsten compound or a metal boride,
    (D) a compound having a maximum absorption wavelength between 300 nm and 450 nm and assuming that the maximum absorbance between 300 nm and 450 nm is 1, having an absorbance of 0.3 or less at a wavelength of 550 nm, and
    (E) an alkali-soluble binder.

(2) The polymerizable composition as described in (1) above, wherein the alkali-soluble binder has an acid group.

(3) The polymerizable composition as described in (1) or (2) above, wherein the alkali-soluble binder has a crosslinking group.

(4) The polymerizable composition as described in any one of (1) to (3) above, wherein the alkali-soluble binder is a (meth)acrylic resin or a urethane-based resin.

(5) The polymerizable composition as described in (4), wherein the alkali-soluble binder is a urethane-based resin.

(6) The polymerizable composition as described in any one of (1) to (5) above, wherein the polymerizable composition contains the tungsten compound and the tungsten compound is represented by the following formula (I):

$$M_xW_yO_z \quad\quad\quad (I)$$

wherein M represents a metal, W represents tungsten, O represents oxygen,
$0.001 \leq x/y \leq 1.1$, and
$2.2 \leq z/y \leq 3.0$.

(7) The polymerizable composition as described in (6) above, wherein the M is an alkali metal.

(8) The polymerizable composition as described in any one of (1) to (7) above, wherein the polymerizable composition contains the metal boride and the metal boride is at least one member selected from the group consisting of lanthanum boride, praseodymium boride, neodymium boride, cerium boride, yttrium boride, titanium boride, zirconium boride, hafnium boride, vanadium boride, tantalum boride, chromium boride, molybdenum boride and tungsten boride.

(9) The polymerizable composition as described in (8) above, wherein the metal boride is lanthanum boride.

(10) The polymerizable composition as described in any one of (1) to (9) above, wherein the compound (D) is an ultraviolet absorber.

(11) The polymerizable composition as described in any one of (1) to (10) above, wherein the polymerizable compound is a polyfunctional polymerizable compound having a plurality of polymerizable groups within the molecule.

(12) The polymerizable composition as described in any one of (1) to (11) above, which further contains a filler.

(13) The polymerizable composition as described in any one of (1) to (12) above, which is used for a solder resist.

(14) The polymerizable composition as described in (13) above, wherein the solid content concentration is from 30 to 80 mass % and the viscosity at 25° C. is from 10 to 3,000 mPa·s.

The present invention preferably further has the following configurations.

(15) A photosensitive layer formed from the polymerizable composition described in any one of (1) to (14) above.
(16) A permanent pattern formed using the polymerizable composition described in any one of (1) to (14) above.
(17) The permanent pattern as described in (16) above, wherein the permanent pattern is a solder resist layer.
(18) The permanent pattern as described in (16) above, wherein the permanent pattern is an infrared-blocking film.
(19) A wafer-level lens having a lens and the permanent pattern described in (18) above formed in the circumferential edge part of the lens.
(20) A solid-state imaging device having the permanent pattern described in any one of (16) to (18) above.
(21) A solid-state imaging device comprising a solid-state imaging device substrate having formed on one surface thereof an imaging element part, and an infrared-blocking film provided on the other surface side of the solid-state imaging device substrate, wherein the infrared-blocking film is the permanent pattern described in (18) above.
(22) A pattern forming method comprising, in order, a step of forming the photosensitive layer described in (15) above, a step of pattern-exposing the photosensitive layer to cure the exposed area, and a step of removing the unexposed area by alkali development to form a permanent pattern.

According to the present invention, a polymerizable composition exhibiting high light-blocking effect in the infrared region and high light transparency in the visible region and being capable of forming a pattern with a rectangular cross-sectional shape as well as excellent durability (for example, durability against high temperature/high humidity, or adherence to substrate) by alkali development, can be provided.

Furthermore, according to the present invention, a polymerizable composition ensuring that the pattern obtained has a rectangular cross-sectional shape even when provided on a substrate surface without high light reflectivity or on a substrate surface with high light reflectivity (for example, metal surface), can be provided.

DESCRIPTION OF EMBODIMENT

Figure 1:
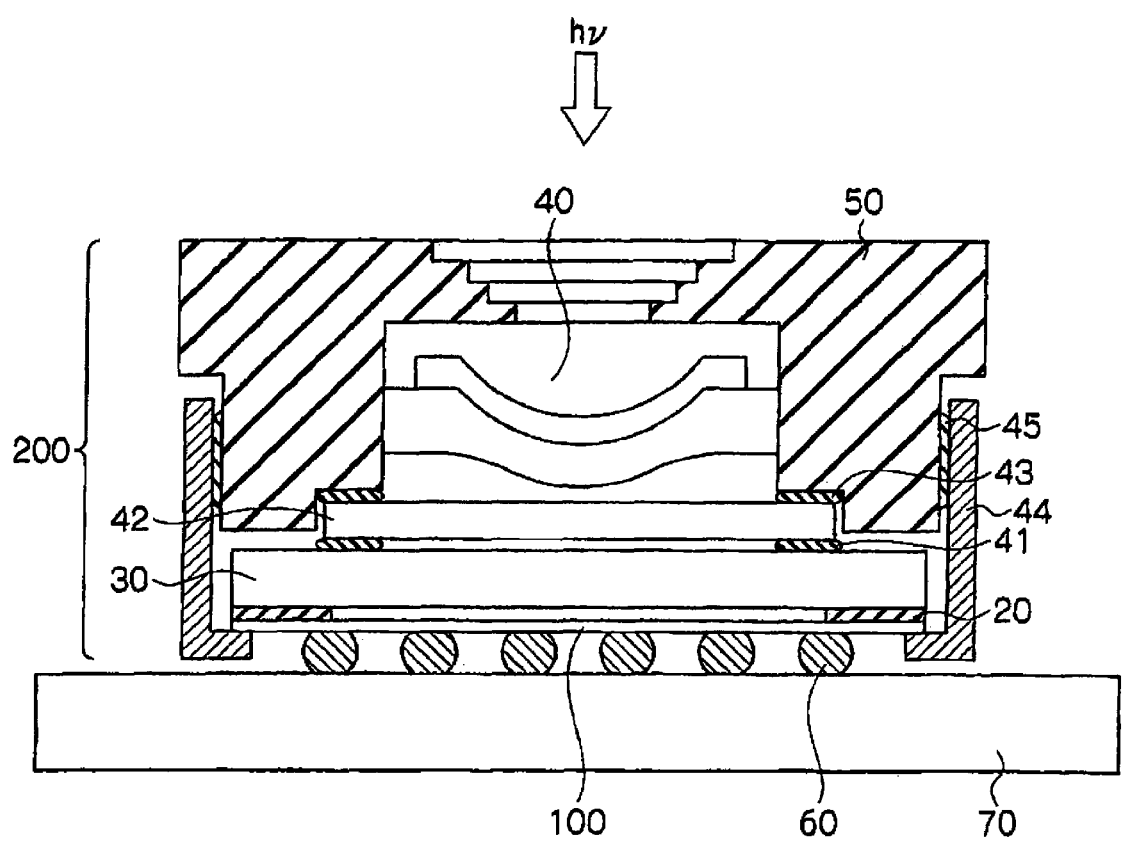
FIG. 1 is a schematic cross-sectional view showing the configuration of a camera module equipped with the solid-state imaging device according to an embodiment of the present invention.

The polymerizable composition of the present invention is described in detail below.

In the description of the present invention, when a group (atomic group) is denoted without specifying whether substituted or unsubstituted, the group includes both a group having no substituent and a group having a substituent. For example, "an alkyl group" includes not only an alkyl group having no substituent (unsubstituted alkyl group) but also an alkyl group having a substituent (substituted alkyl group). Also, in the description of the present invention, the viscosity value indicates the value at 25° C.

The polymerizable composition of the present invention contains (A) a polymerization initiator, (B) a polymerizable compound, (C) at least either a tungsten compound or a metal boride, (D) a compound having a maximum absorption between a wavelength of 300 nm and a wavelength of 450 nm and assuming that the maximum absorbance between 300 nm and 450 nm is 1, having an absorbance of 0.3 or less at a wavelength of 550 nm, and (E) an alkali-soluble binder, and, if desired, may contain an infrared-blocking material other than the compound (C), a dispersant, a sensitizer, a crosslinking agent, a curing accelerator, a filler, an elastomer, a surfactant and other components.

The polymerizable composition of the present invention is, for example, a negative composition and is typically a negative resist composition. The configuration of this composition is described below.

[1] (A) Polymerization Initiator

The polymerization initiator for use in the polymerizable composition of the present invention is not particularly limited as long as it has an ability of initiating the polymerization of the polymerizable compound by either one or both of light and heat, and the initiator may be appropriately selected according to the purpose but is preferably a photopolymerizable compound. In the case of initiating the polymerization by light, a compound having photosensitivity to light from ultraviolet region to visible region is preferred.

In the case of initiating the polymerization by heat, an initiator capable of decomposing at 150 to 250° C. is preferred.

The polymerization initiator which can be used in the present invention is preferably a compound having at least an aromatic group, and examples thereof include an acylphosphine compound, an acetophenone-based compound, an α-aminoketone compound, a benzophenone-based compound, a benzoin ether-based compound, a ketal derivative compound, a thioxanthone compound, an oxime compound, a hexaarylbiimidazole compound, a trihalomethyl compound, an azo compound, an organic peroxide, a diazonium compound, an iodonium compound, a sulfonium compound, an azinium compound, a benzoin ether-based compound, a ketal derivative compound, an onium salt compound such as metallocene compound, an organic boron salt compound, and a disulfone compound.

In view of sensitivity, an oxime compound, an acetophenone-based compound, an α-aminoketone compound, a trihalomethyl compound, a hexaarylbiimidazole compound, and a thiol compound are preferred.

Examples of the polymerization initiator suitable for the present invention are described below, but the present invention is not limited thereto.

Specific examples of the acetophenone-based compound include 2,2-diethoxyacetophenone, p-dimethylaminoacetophenone, 2-hydroxy-2-methyl-1-phenyl-propan-1-one, 4'-isopropyl-2-hydroxy-2-methyl-propiophenone, 1-hydroxy-cyclohexyl-phenyl-ketone, 2-benzyl-2-dimethylamino-1-(4-morpholinophenyl)-butan-1-one, 2-tolyl-2-dimethylamino-1-(4-morpholinophenyl)-butan-1-one, 2-methyl-1-[4-(methylthio)phenyl]-2-morpholinopropan-1-one, 2-methyl-1-(4-methylthiophenyl)-2-morpholinopropan-1-one, 2-(dimethylamino)-2-[(4-methylphenyl)methyl]-1-[4-(4-morpholinyl)phenyl]-1-butanone, and 2-methyl-1-(4-methylthiophenyl)-2-morpholinopropan-1-one.

The trihalomethyl compound is more preferably an s-triazine derivative where at least one mono-, di- or tri-halogen-substituted methyl group is bonded to an s-triazine ring, and specific examples thereof include 2,4,6-tris(monochloromethyl)-s-triazine, 2,4,6-tris(dichloromethyl)-s-triazine, 2,4,6-tris(trichloromethyl)-s-triazine, 2-methyl-4,6-bis(trichloromethyl)-s-triazine, 2-n-propyl-4,6-bis(trichloromethyl)-s-triazine, 2-(α,α,β-trichloroethyl)-4,6-bis(trichloromethyl)-s-triazine, 2-phenyl-4,6-bis(trichloromethyl)-s-triazine, 2-(p-methoxyphenyl)-4,6-bis(trichloromethyl)-s-triazine, 2-(3,4-epoxyphenyl)-4,6-bis(trichloromethyl)-s-triazine, 2-(p-chlorophenyl)-4,6-bis(trichloromethyl)-s-triazine, 2-[1-(p-methoxyphenyl)-2,4-butadienyl]-4,6-bis(trichloromethyl)-s-triazine, 2-styryl-4,6-bis(trichloromethyl)-s-triazine, 2-(p-methoxystyryl)-4,6-bis(trichloromethyl)-s-triazine, 2-(p-i-propyloxystyryl)-4,6-bis(trichloromethyl)-s-triazine, 2-(p-tolyl)-4,6-bis(trichloromethyl)-s-triazine, 2-(4-methoxynaphthyl)-4,6-bis(trichloromethyl)-s-triazine, 2-phenylthio-4,6-bis(trichloromethyl)-s-triazine, 2-benzylthio-4,6-bis(trichloromethyl)-s-triazine, 2,4,6-tris(dibromomethyl)-s-triazine, 2,4,6-tris(tribromomethyl)-s-triazine, 2-methyl-4,6-bis(tribromomethyl)-s-triazine, and 2-methoxy-4,6-bis(tribromomethyl)-s-triazine.

Examples of the hexaarylbiimidazole compound include various compounds described in JP-B-6-29285 (the term "JP-B" as used herein means an "examined Japanese patent publication"), U.S. Pat. Nos. 3,479,185, 4,311,783 and 4,622,286, specifically, 2,2'-bis(o-chlorophenyl)-4,4',5,5'-tetraphenylbiimidazole, 2,2'-bis(o-bromophenyl)-4,4',5,5'-tetraphenylbiimidazole, 2,2'-bis(o,p-dichlorophenyl)-4,4',5,5'-tetraphenylbiimidazole, 2,2'-bis(o-chlorophenyl)-4,4',5,5'-tetra(m-methoxyphenyl)biimidazole, 2,2'-bis(o,o'-dichlorophenyl)-4,4',5,5'-tetraphenylbiimidazole, 2,2'-bis(o-nitrophenyl)-4,4',5,5'-tetraphenylbiimidazole, 2,2'-bis(o-methylphenyl)-4,4',5,5'-tetraphenylbiimidazole, and 2,2'-bis(o-trifluorophenyl)-4,4',5,5'-tetraphenylbiimidazole.

Examples of the oxime compound include the compounds described in *J. C. S. Perkin II*, 1653-1660 (1979), *J. C. S. Perkin II*, 156-162 (1979), *Journal of Photopolymer Science and Technology*, 202-232 (1995), JP-A-2000-66385, JP-A-2000-80068 and JP-T-2004-534797 (the term "JP-T" as used herein means a published Japanese translation of a PCT patent application); IRGACURE OXE 01 (1,2-octanedione, 1-[4-(phenylthio)-, 2-(O-benzoyloxime)]) and IRGACURE OXE 02 (ethanone, 1-[9-ethyl-6-(2-methylbenzoyl)-9H-carbazol-3-yl]-, 1-(O-acetyloxime)), both produced by BASF Japan; and 2-(acetyloxyiminomethyl)thioxanthen-9-one.

Furthermore, the cyclic oxime compounds described in JP-A-2007-231000 and JP-A-2007-322744 may be also preferably used.

Most preferred are the oxime compound having a specific substituent described in JP-A-2007-269779 and the oxime compound having a thioaryl group described in JP-A-2009-191061.

Specifically, the oxime compound is preferably a compound represented by the following formula (1). Incidentally, the oxime compound may be a compound where the N—O bond of oxime is (E) form, a compound where the bond is (Z) form, or a compound where the bond is a mixture of (E) form and (Z) form.

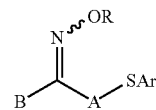

(1)

(wherein each of R and B independently represents a monovalent substituent, A represents a divalent organic group, and Ar represents an aryl group).

The monovalent substituent represented by R is preferably a monovalent nonmetallic atom group. Examples of the monovalent nonmetallic atom group include an alkyl group, an aryl group, an acyl group, an alkoxycarbonyl group, an aryloxycarbonyl group, a heterocyclic group, an alkylthiocarbonyl group, and an arylthiocarbonyl group. These groups may have one or more substituents. The substituent above may be further substituted with another substituent.

Examples of the substituent include a halogen atom, an aryloxy group, an alkoxycarbonyl group, an aryloxycarbonyl group, an acyloxy group, an acyl group, an alkyl group, and an aryl group.

The alkyl group which may have a substituent is preferably an alkyl group having a carbon number of 1 to 30, and specific examples thereof include a methyl group, an ethyl group, a propyl group, a butyl group, a hexyl group, an octyl group, a decyl group, a dodecyl group, an octadecyl group, an isopropyl group, an isobutyl group, a sec-butyl group, a tert-butyl group, a 1-ethylpentyl group, a cyclopentyl group, a cyclohexyl group, a trifluoromethyl group, a 2-ethylhexyl group, a phenacyl group, a 1-naphthoylmethyl group, a 2-naphthoylmethyl group, a 4-methylsulfanylphenacyl group, a 4-phenylsulfanylphenacyl group, a 4-dimethylaminophenacyl group, a 4-cyanophenacyl group, a 4-methylphenacyl group, a 2-methylphenacyl group, a 3-fluorophenacyl group, a 3-trifluoromethylphenacyl group, and a 3-nitrophenacyl group.

The aryl group which may have a substituent is preferably an aryl group having a carbon number of 6 to 30, and specific examples thereof include a phenyl group, a biphenyl group, a 1-naphthyl group, a 2-naphthyl group, a 9-anthryl group, a 9-phenanthryl group, a 1-pyrenyl group, a 5-naphthacenyl group, a 1-indenyl group, a 2-azulenyl group, a 9-fluorenyl group, a terphenyl group, a quaterphenyl group, an o-tolyl group, an m-tolyl group, a p-tolyl group, a xylyl group, an o-cumenyl group, an m-cumenyl group, a p-cumenyl group, a mesityl group, a pentalenyl group, a binaphthalenyl group, a ternaphthalenyl group, a quaternaphthalenyl group, a heptalenyl group, a biphenylenyl group, an indacenyl group, a fluoranthenyl group, an acenaphthylenyl group, an aceanthrylenyl group, a phenalenyl group, a fluorenyl group, an anthryl group, a bianthracenyl group, a teranthracenyl group, a quateranthracenyl group, an anthraquinolyl group, a phenanthryl group, a triphenylenyl group, a pyrenyl group, a chrysenyl group, a naphthacenyl group, a pleiadenyl group, a picenyl group, a perylenyl group, a pentaphenyl group, a pentacenyl group, a tetraphenylenyl group, a hexaphenyl group, a hexacenyl group, a rubicenyl group, a coronenyl group, a trinaphthylenyl group, a heptaphenyl group, a heptacenyl group, a pyranthrenyl group, and an ovalenyl group.

The acyl group which may have a substituent is preferably an acyl group having a carbon number of 2 to 20, and specific examples thereof include an acetyl group, a propanoyl group, a butanoyl group, a trifluoroacetyl group, a pentanoyl group, a benzoyl group, a 1-naphthoyl group, a 2-naphthoyl group, a 4-methylsulfanylbenzoyl group, a 4-phenylsulfanylbenzoyl group, a 4-dimethylaminobenzoyl group, a 4-diethylaminobenzoyl group, a 2-chlorobenzoyl group, a 2-methylbenzoyl group, a 2-methoxybenzoyl group, a 2-butoxybenzoyl group, a 3-chlorobenzoyl group, a 3-trifluoromethylbenzoyl group, a 3-cyanobenzoyl group, a 3-nitrobenzoyl group, a 4-fluorobenzoyl group, a 4-cyanobenzoyl group, and a 4-methoxybenzoyl group.

The alkoxycarbonyl group which may have a substituent is preferably an alkoxycarbonyl group having a carbon number of 2 to 20, and specific examples thereof include a methoxycarbonyl group, an ethoxycarbonyl group, a propoxycarbonyl group, a butoxycarbonyl group, a hexyloxycarbonyl group, an octyloxycarbonyl group, a decyloxycarbonyl group, an octadecyloxycarbonyl group, and a trifluoromethyloxycarbonyl group.

Specific examples of the aryloxycarbonyl group which may have a substituent include a phenoxycarbonyl group, a 1-naphthyloxycarbonyl group, a 2-naphthyloxycarbonyl group, a 4-methylsulfanylphenyloxycarbonyl group, a 4-phenylsulfanylphenyloxycarbonyl group, a 4-dimethylaminophenyloxycarbonyl group, a 4-diethylaminophenyloxycarbonyl group, a 2-chlorophenyloxycarbonyl group, a 2-methylphenyloxycarbonyl group, a 2-methoxyphenyloxycarbonyl group, a 2-butoxyphenyloxycarbonyl group, a 3-chlorophenyloxycarbonyl group, a 3-trifluoromethylphenyloxycarbonyl group, a 3-cyanophenyloxycarbonyl group, a 3-nitrophenyloxycarbonyl group, a 4-fluorophenyloxycarbonyl group, a 4-cyanophenyloxycarbonyl group, and a 4-methoxyphenyloxycarbonyl group.

The heterocyclic group which may have a substituent is preferably an aromatic or aliphatic heterocyclic ring containing a nitrogen atom, an oxygen atom, a sulfur atom or a phosphorus atom.

Specific examples thereof include a thienyl group, a benzo[b]thienyl group, a naphtho[2,3-b]thienyl group, a thianthrenyl group, a furyl group, a pyranyl group, an isobenzofuranyl group, a chromenyl group, a xanthenyl group, a phenoxathiinyl group, a 2H-pyrrolyl group, a pyrrolyl group, an imidazolyl group, a pyrazolyl group, a pyridyl group, a pyrazinyl group, a pyrimidinyl group, a pyridazinyl group, an indolizinyl group, an isoindolyl group, a 3H-indolyl group, an indolyl group, a 1H-indazolyl group, a purinyl group, a 4H-quinolizinyl group, an isoquinolyl group, a quinolyl group, a phthalazinyl group, a naphthyridinyl group, a quinoxanilyl group, a quinazolinyl group, a cinnolinyl group, a pteridinyl group, a 4aH-carbazolyl group, a carbazolyl group, a β-carbolinyl group, a phenanthridinyl group, an acridinyl group, a perimidinyl group, a phenanthrolinyl group, a phenazinyl group, a phenarsazinyl group, an isothiazolyl group, a phenothiazinyl group, an isoxazolyl group, a furazanyl group, a phenoxazinyl group, an isochromanyl group, a chromanyl group, a pyrrolidinyl group, a pyrrolinyl group, an imidazolidinyl group, an imidazolinyl group, a pyrazolidinyl group, a pyrazolinyl group, a piperidyl group, a piperazinyl group, an indolinyl group, an isoindolinyl group, a quinuclidinyl group, a morpholinyl group, and a thioxantholyl group.

Specific examples of the alkylthiocarbonyl group which may have a substituent include a methylthiocarbonyl group, a propylthiocarbonyl group, a butylthiocarbonyl group, a hexylthiocarbonyl group, an octylthiocarbonyl group, a decylthiocarbonyl group, an octadecylthiocarbonyl group, and a trifluoromethylthiocarbonyl group.

Specific examples of the arylthiocarbonyl group which may have a substituent include a 1-naphthylthiocarbonyl group, a 2-naphthylthiocarbonyl group, a 4-methylsulfanylphenylthiocarbonyl group, a 4-phenylsulfanylphenylthiocarbonyl group, a 4-dimethylaminophenylthiocarbonyl group, a 4-diethylaminophenylthiocarbonyl group, a 2-chlorophenylthiocarbonyl group, a 2-methylphenylthiocarbonyl group, a 2-methoxyphenylthiocarbonyl group, a 2-butoxyphenylthiocarbonyl group, a 3-chlorophenylthiocarbonyl group, a 3-trifluoromethylphenylthiocarbonyl group, a 3-cyanophenylthiocarbonyl group, a 3-nitrophenylthiocarbonyl group, a 4-fluorophenylthiocarbonyl group, a 4-cyanophenylthiocarbonyl group, and a 4-methoxyphenylthiocarbonyl group.

The monovalent substituent represented by B indicates an aryl group, a heterocyclic group, an arylcarbonyl group, or a heterocyclic carbonyl group. These groups may have one or more substituents. Examples of the substituent include the substituents described above. Also, the above-described substituent may be further substituted with another substituent.

Above all, structures shown below are preferred.

In the structures, Y, X and n have the same meanings as Y, X and n in Formula (2) described later, and preferred examples thereof are also the same.

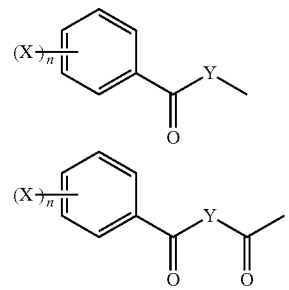

Examples of the divalent organic group represented by A include an alkylene group having a carbon number of 1 to 12, a cyclohexylene group, and an alkynylene group. These groups may have one or more substituents. Examples of the substituent include the substituents described above. Also, the above-described substituent may be further substituted with another substituent.

Above all, from the standpoint of enhancing the sensitivity and suppressing coloration due to heating or aging, A is preferably an unsubstituted alkylene group, an alkylene group substituted with an alkyl group (e.g., methyl group, ethyl group, tert-butyl group, dodecyl group), an alkylene group substituted with an alkenyl group (e.g., vinyl group, allyl group), or an alkylene group substituted with an aryl group (e.g., phenyl group, p-tolyl group, xylyl group, cumenyl group, naphthyl group, anthryl group, phenanthryl group, styryl group).

The aryl group represented by Ar is preferably an aryl group having a carbon number of 6 to 30 and may have a substituent. Examples of the substituent are the same as those of the substituent introduced into the substituted aryl group illustrated above as a specific example of the aryl group which may have a substituent.

Above all, from the standpoint of enhancing the sensitivity and suppressing coloration due to heating or aging, a substituted or unsubstituted phenyl group is preferred.

In view of sensitivity, the structure "SAr" formed by Ar and S adjacent thereto in formula (1) is preferably a structure shown below. In the structures, Me represents a methyl group, and Et represents an ethyl group.

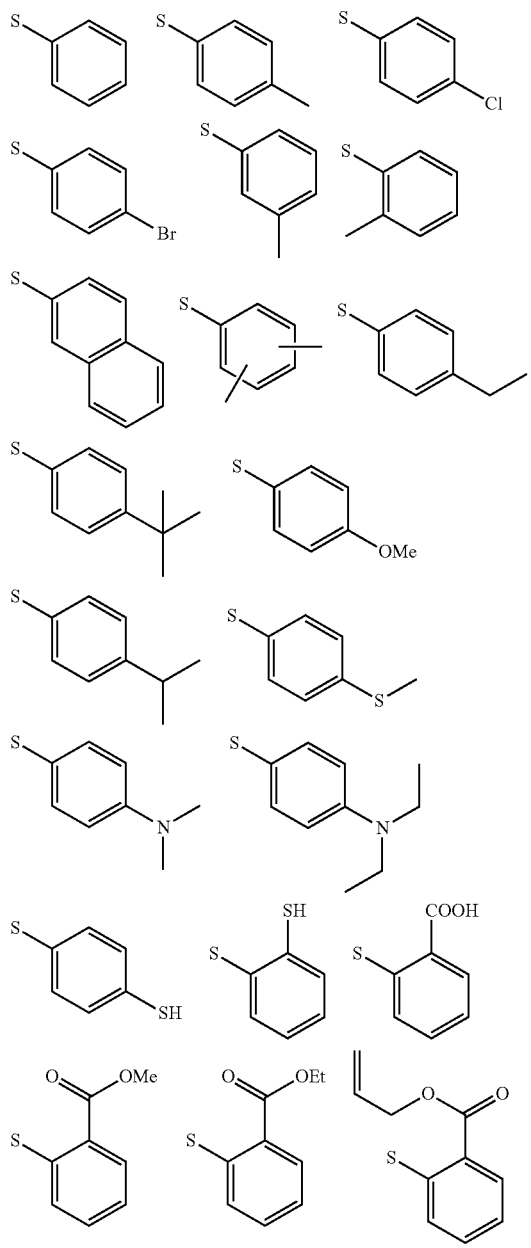

The oxime compound is preferably a compound represented by the following formula (2):

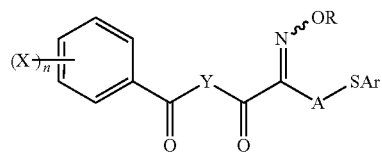

(wherein each of R and X independently represents a monovalent substituent, each of A and Y independently represent a divalent organic group, Ar represents an aryl group, and n is an integer of 0 to 5).

In formula (2), R, A and Ar have the same meanings as R, A and Ar in formula (1), and preferred examples thereof are also the same.

Examples of the monovalent substituent represented by X include an alkyl group, an aryl group, an alkoxy group, an aryloxy group, an acyloxy group, an alkoxycarbonyl group, an amino group, a heterocyclic group, and a halogen atom. These groups may have one or more substituents. Examples of the substituent include the substituents described above. Also, the above-described substituent may be further substituted with another substituent.

Above all, in view of solvent solubility and enhancement of absorption efficiency in the long wavelength region, X is preferably an alkyl group.

In formula (2), n represents an integer of 0 to 5 and is preferably an integer of 0 to 2.

Examples of the divalent organic group represented by Y include structures shown below. In the groups shown below, "*" indicates a bonding position to the carbon atom adjacent to Y in formula (2).

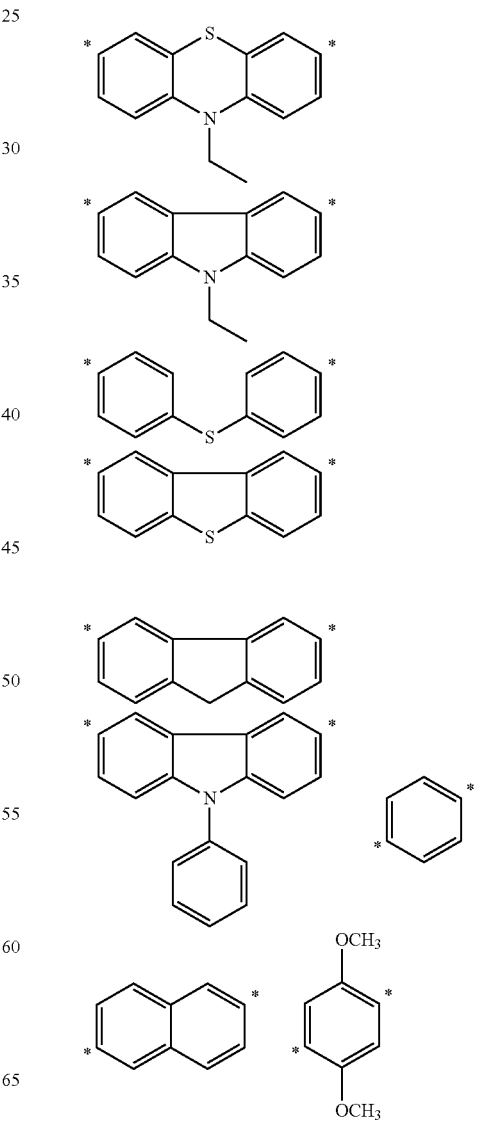

Among these, in view of high sensitivity, structures shown below are preferred.

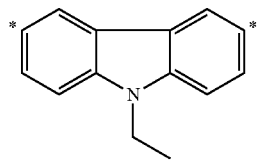

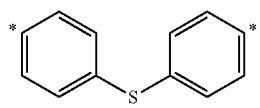

The oxime compound is more preferably a compound represented by the following formula (3):

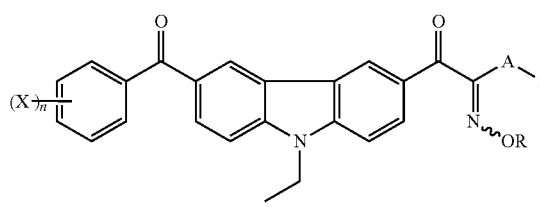

(3)

In formula (3), R, X, A, Ar and n have the same meanings as R, X, A, Ar and n in formula (2), and preferred examples thereof are also the same.

Specific examples (C-4) to (C-13) of the oxime compound suitably used are illustrated below, but the present invention is not limited thereto.

(C-4)

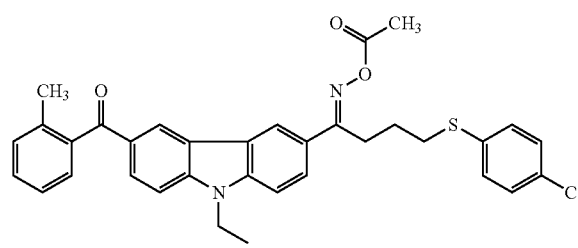

(C-5)

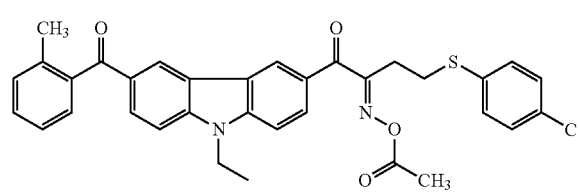

(C-6)

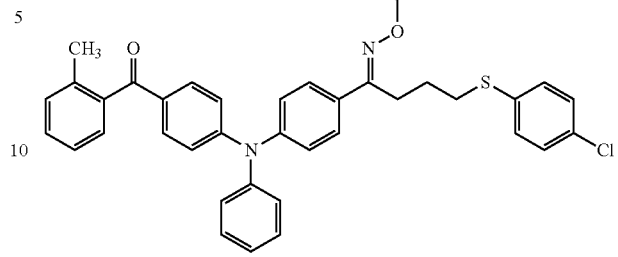

(C-7)

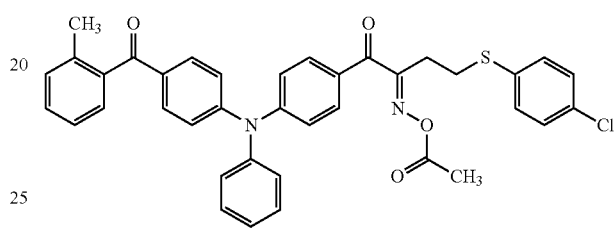

(C-8)

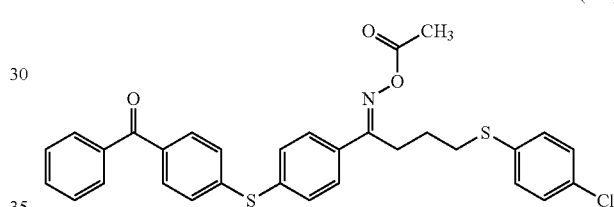

(C-9)

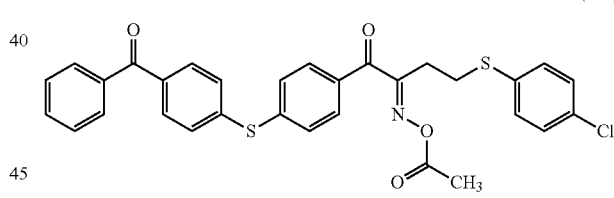

(C-10)

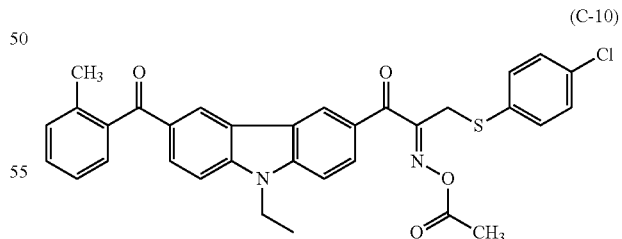

(C-11)

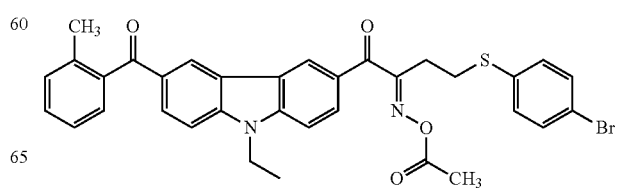

-continued

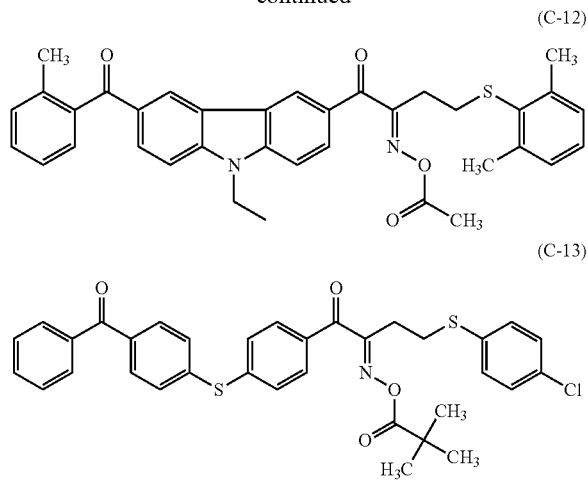

The oxime compound is a compound having a maximum absorption wavelength in the wavelength region of 350 to 500 nm, preferably a compound having an absorption wavelength in the wavelength region of 360 to 480 nm, more preferably a compound having high absorbance at wavelengths of 365 nm and 455 nm.

In view of sensitivity, the molar extinction coefficient at a wavelength of 365 nm or 405 nm of the oxime compound is preferably from 3,000 to 300,000, more preferably from 5,000 to 300,000, still more preferably from 10,000 to 200,000.

The molar extinction coefficient of the compound may be measured using a known method but specifically, for example, the molar extinction coefficient is preferably measured at a concentration of 0.01 g/L by using an ethyl acetate solvent in an ultraviolet-visible spectrophotometer (Carry-5 spectrophotometer, manufactured by Varian Inc.).

The photopolymerization initiator is more preferably a compound selected from the group consisting of an oxime compound, an acetophenone-based compound and an acylphosphine compound. More specifically, for example, aminoacetophenone-based initiators described in JP-A-10-291969, acylphosphine oxide-based initiators described in Japanese Patent 4,225,898, the above-described oxime-based initiators, and furthermore, compounds described as the oxime-based initiator in JP-A-2001-233842 may be also used.

As the acetophenone-based initiator, commercial products IRGACURE-907, IRGACURE-369 and IRGACURE-379 (trade names, all produced by BASF Japan) may be used. As the acylphosphine-based initiator, commercial products IRGACURE-819 and DAROCURE-TPO (trade names, both produced by BASF Japan) may be used.

One kind of a polymerization initiator may be used alone, or two or more kinds of polymerization initiators may be used in combination.

The content of the polymerization initiator is preferably from 0.01 to 30 mass %, more preferably from 0.1 to 20 mass %, still more preferably from 0.1 to 15 mass %, based on the entire solid content by mass of the polymerizable composition of the present invention.

[2] (B) Polymerizable Compound

The polymerizable composition of the present invention contains a polymerizable compound. The polymerizable compound used here may be any compound as long as it is a compound having, in the molecule, a functional group capable of undergoing a reaction by the effect of at least one of an acid, a radical and heat (in the description of the present invention, such a functional group is sometimes referred to as a "polymerizable group"), and a polyfunctional polymerizable compound having a plurality of polymerizable groups in the molecule is preferred.

Example of the polymerizable compound having a polymerizable functional group capable of reacting to at least one of an acid, a radical and heat include an ethylenically unsaturated group-containing compound having an ethylenically unsaturated group such as unsaturated ester functional group, unsaturated amide group, vinyl ether group and allyl group; a methylol compound; a bismaleimide compound; a benzocyclobutene compound, a bisallylnadiimide compound; and a benzoxazine compound.

The polymerizable compound that can be preferably used in the present invention includes a general radical polymerizable compound, and compounds widely known as the compound having an ethylenically unsaturated double bond in this industrial field can be used without any particular limitation.

These compounds have a chemical form of, for example, a monomer, a prepolymer (that is, dimer, trimer or oligomer), or a mixture or copolymer thereof.

Examples of the monomer and a copolymer thereof include an unsaturated carboxylic acid (such as acrylic acid, methacrylic acid, itaconic acid, crotonic acid, isocrotonic acid and maleic acid), its esters and amides, and a copolymer thereof. Preferably, an unsaturated carboxylic acid ester, an ester of an unsaturated carboxylic acid and an aliphatic polyhydric alcohol compound, and amides of an unsaturated carboxylic acid and an aliphatic polyvalent amino compound, are used.

Particularly, an ester of an unsaturated carboxylic acid and an aliphatic polyhydric alcohol compound can develop high hydrophobicity in the exposed area and is preferred because a pattern having a desired profile can be easily formed by alkali development and also, a pattern having high durability is obtained (in particular, when higher durability is required of the solder resist, for example, when the wiring density of the metal wiring covered with a solder resist is high, the above-described effects are prominent).

In addition, for example, an addition reaction product of unsaturated carboxylic acid esters or amides having a nucleophilic substituent such as hydroxyl group, amino group and mercapto group to monofunctional or polyfunctional isocyanates or epoxies, and a dehydration condensation reaction product with a monofunctional or polyfunctional carboxylic acid, are also suitably used.

An addition reaction product of unsaturated carboxylic acid esters or amides having an electrophilic substituent such as isocyanate group and epoxy group to monofunctional or polyfunctional alcohols, amines or thiols, and a substitution reaction product of unsaturated carboxylic acid esters or amides having a leaving substituent such as halogen group and tosyloxy group with monofunctional or polyfunctional alcohols, amines or thiols, are also preferred. As another example, compounds where the above-described unsaturated carboxyl acid is replaced by an unsaturated phosphonic acid, a styrene or a vinyl ether, may be also used.

The unsaturated carboxylic acid ester is preferably a methacrylic acid ester, and examples thereof include tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol hexamethacrylate, sorbitol trimethacrylate, sorbitol tetramethacrylate, bis[p-(3-methacryloxy-2-hydroxypropoxy) phenyl]dimethylmethane, bis-[p-(methacryloxyethoxy)phenyl]dimethylmethane, and their EO-modified or PO-modified products.

The unsaturated carboxylic acid ester is also preferably an itaconic acid ester, and examples thereof include ethylene glycol diitaconate, propylene glycol diitaconate, 1,3-butanediol diitaconate, 1,4-butanediol diitaconate, tetramethylene glycol diitaconate, pentaerythritol diitaconate, and sorbitol tetraitaconate. Examples of the crotonic acid ester include ethylene glycol dicrotonate, tetramethylene glycol dicrotonate, pentaerythritol dicrotonate, and sorbitol tetradicrotonate. Examples of the isocrotonic acid ester include ethylene glycol diisocrotonate, pentaerythritol diisocrotonate, and sorbitol tetraisocrotonate. Examples of the maleic acid ester include ethylene glycol dimaleate, triethylene glycol dimaleate, pentaerythritol dimaleate, and sorbitol tetramaleate.

Specific examples of the ester monomer of an aliphatic polyhydric alcohol compound with an unsaturated carboxylic acid include, as the (meth)acrylic ester, ethylene glycol diacrylate, triethylene glycol diacrylate, 1,3-butanediol diacrylate, tetramethylene glycol diacrylate, propylene glycol diacrylate, neopentyl glycol diacrylate, trimethylolpropane triacrylate, trimethylolpropane tri(acryloyloxypropyl)ether, trimethylolethane triacrylate, hexanediol diacrylate, 1,4-cyclohexanediol diacrylate, tetraethylene glycol diacrylate, tricyclodecanedimethanol diacrylate, tricyclodecanedimethanol dimethacrylate, pentaerythritol diacrylate, pentaerythritol triacrylate, pentaerythritol tetraacrylate, dipentaerythritol diacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, polyester acrylate oligomer, and EO-modified or PO-modified products of these compounds.

Other preferred examples of the ester include aliphatic alcohol esters described in JP-B-51-47334 and JP-A-57-196231, those having an aromatic framework described in JP-A-59-5240, JP-A-59-5241 and JP-A-2-226149, and those having an amino group described in JP-A-1-165613. These ester monomers may be used also as a mixture.

Specific examples of the amide monomer of an aliphatic polyvalent amine compound with an unsaturated carboxylic acid include methylenebis-acrylamide, methylenebis-methacrylamide, 1,6-hexamethylenebis-acrylamide, 1,6-hexamethylenebis-methacrylamide, diethylenetriaminetrisacrylamide, xylylenebisacrylamide, and xylylenebismethacrylamide. Other preferred examples of the amide-based monomer include those having a cyclohexylene structure described in JP-B-54-21726.

An addition-polymerizable urethane-based compound produced by an addition reaction of an isocyanate to a hydroxyl group is also preferred, and specific examples thereof include a vinyl urethane compound having two or more polymerizable vinyl groups per molecule obtained by adding a hydroxyl group-containing vinyl monomer represented by the following formula (E) to a polyisocyanate compound having two or more isocyanate groups per molecule described in JP-B-48-41708.

CH$_2$=C(R$^4$)COOCH$_2$CH(R$^5$)OH    (E)

[wherein each of R$^4$ and R$^5$ independently represents H or CH$_3$].

Furthermore, urethane acrylates described in JP-A-51-37193, JP-B-2-32293 and JP-B-2-16765 and urethane compounds having an ethylene oxide-based framework described in JP-B-58-49860, JP-B-56-17654, JP-B-62-39417 and JP-B-62-39418 are also preferred. In addition, when addition-polymerizable compounds having an amino structure or sulfide structure in the molecule described in JP-A-63-277653, JP-A-63-260909 and JP-A-1-105238 are used, a photopolymerizable composition very excellent in the photosensitivity can be obtained.

Other examples include a polyfunctional acrylate or methacrylate such as polyester acrylates described in JP-A-48-64183, JP-B-49-43191 and JP-B-52-30490, and epoxy acrylates obtained by reacting an epoxy resin with a (meth)acrylic acid. Other examples also include specific unsaturated compounds described in JP-B-46-43946, JP-B-1-40337 and JP-B-1-40336, and vinylphosphonic acid-based compounds described in JP-A-2-25493. In some cases, a perfluoroalkyl group-containing structure described in JP-A-61-22048 is suitably used. Furthermore, those introduced as photocurable monomers and oligomers in *Journal of The Adhesion Society of Japan*, Vol. 20, No. 7, pp. 300-308 (1984) may be also used.

In the present invention, when a radical polymerizable compound is added, in view of curing sensitivity, a polyfunctional polymerizable compound containing two or more ethylenically unsaturated bonds is preferably used, and it is more preferred to contain three or more ethylenically unsaturated bond. Above all, the compound preferably contains two or more, more preferably three or more, most preferably four or more, (meth)acrylic acid ester structures.

Furthermore, in view of curing sensitivity and developability of the unexposed area, a compound containing an EO-modified product is preferred, and in view of curing sensitivity and strength of the exposed area, a compound containing a urethane bond is preferably used. In addition, in view of developability at the pattern formation, a compound having an acid group is preferably used.

From these viewpoints, preferred examples of the polymerizable compound for use in the present invention include bisphenol A diacrylate, EO-modified bisphenol A diacrylate, trimethylolpropane triacrylate, trimethylolpropane tri(acryloyloxypropyl)ether, trimethylolethane triacrylate, tetraethylene glycol diacrylate, pentaerythritol diacrylate, pentaerythritol triacrylate, pentaerythritol tetraacrylate, dipentaerythritol tetraacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl)isocyanurate, EO-modified pentaerythritol tetraacrylate, and EO-modified dipentaerythritol hexaacrylate. Also, as the commercially available product, urethane oligomer UAS-10, UAB-140 (both produced by Sanyo Kokusaku Pulp Co., Ltd.), DPHA-40H (produced by Nippon Kayaku Co., Ltd.), UA-306H, UA-306T, UA-306I, AH-600, T-600 and AI-600 (all produced by Kyoeisha Chemical Co., Ltd.) are preferred.

Among these, EO-modified bisphenol A diacrylate, pentaerythritol triacrylate, pentaerythritol tetraacrylate, dipentaerythritol pentaacrylate, dipentaerythritol hexaacrylate, tri (acryloyloxyethyl) isocyanurate, EO-modified pentaerythritol tetraacrylate, and EO-modified dipentaerythritol hexaacrylate are more preferred, and as the commercially available product, DPHA-40H (produced by Nippon Kayaku Co., Ltd.), UA-306H, UA-306T, UA-306I, AH-600, T-600 and AI-600 (produced by Kyoeisha Chemical Co., Ltd.) are more preferred.

Ethylenically unsaturated compounds having an acid group are also preferred, and examples of the commercially available product thereof include TO-756 that is a carboxyl group-containing trifunctional acrylate produced by Toagosei CO., Ltd., and TO-1382 that is a carboxyl group-containing pentafunctional acrylate.

In addition, examples of the highly heat-resistant polymerizable compound include benzocyclobutene (BCB), bisallylnadiimide (BANI), benzoxazine, melamine and their analogues.

The content of the polymerizable compound is preferably from 3 to 80 mass %, more preferably from 5 to 50 mass %, based on the entire solid content by mass of the polymerizable composition of the present invention.

As the polymerizable compound, two or more kinds of compounds can be used.

[3] (C) At Least Either a Tungsten Compound or a Metal Boride the polymerizable composition of the present invention contains (C) at least either a tungsten compound or a metal boride (hereinafter, sometimes collectively referred to as a "compound (C)").

The tungsten compound and metal boride are an infrared-blocking material exhibiting high absorption for infrared ray (light at a wavelength of about 800 to 1,200 nm) (that is, the light-blocking effect (shielding property) for infrared ray is high) and low absorption for visible light. Therefore, according to the polymerizable composition of the present invention, by virtue of using the compound (C), a pattern having a high light-blocking effect in the infrared region and high light transparency in the visible region can be formed.

Also, the tungsten compound and metal boride exhibits small absorption for light at a shorter wavelength than the visible region, which is employed for image formation and used at the exposure to high-pressure mercury lamp, KrF, ArF or the like. Therefore, by combining the compound (C) with a polymerization initiator, a polymerizable compound and an alkali-soluble binder, an excellent pattern is obtained.

The tungsten compound includes, for example, a tungsten oxide-based compound, a tungsten boride-based compound and a tungsten sulfide-based compound and is preferably a tungsten oxide-based compound represented by the following formula (compositional formula) (I):

$$M_xW_yO_z \quad (I)$$

wherein M represents a metal, W represents tungsten, O represents oxygen, 0.001≤x/y≤1.1, and 2.2≤z/y≤3.0.

The metal of M includes an alkali metal, an alkaline earth metal, Mg, Zr, Cr, Mn, Fe, Ru, Co, Rh, Ir, Ni, Pd, Pt, Cu, Ag, Au, Zn, Cd, Al, Ga, In, Tl, Sn, Pb, Ti, Nb, V, Mo, Ta, Re, Be, Hf, Os and Bi and is preferably an alkali metal. The metal of M may be one kind of a metal or two or more kinds of metals.

M is preferably an alkali metal, more preferably Rb or Cs, still more preferably Cs.

When x/y is 0.001 or more, the infrared ray can be sufficiently blocked, and when it is 1.1 or less, production of an impurity phase in the tungsten compound can be more unfailingly avoided.

When z/y is 2.2 or more, chemical stability as the material can be more enhanced, and when it is 3.0 or less, the infrared ray can be sufficiently blocked.

Specific examples of the tungsten oxide-based compound represented by formula (I) include $Cs_{0.33}WO_3$, $Rb_{0.33}WO_3$, $K_{0.33}WO_3$ and $Ba_{0.33}WO_3$. The compound is preferably $Cs_{0.33}WO_3$ or $Rb_{0.33}WO_3$, more preferably $Cs_{0.33}WO_3$.

The tungsten compound is preferably a fine particle. The average particle diameter of the tungsten fine particle is preferably 800 nm or less, more preferably 400 nm or less, still more preferably 200 nm or less. When the average particle diameter is in this range, the tungsten fine particle is scarcely allowed to block the visible light because of light scattering, so that light transparency in the visible region can be more successfully ensured. From the standpoint of avoiding light scattering, the average particle diameter is preferably smaller, but for the reason of easy handling or the like at the production, the average particle diameter of the tungsten fine particle is usually 1 nm or more.

As the tungsten compound, two or more kinds of compounds may be used.

The tungsten compound is available as a commercial product but when the tungsten compound is, for example, a tungsten oxide-based compound, the tungsten oxide-based compound can be obtained by a method of heat-treating a tungsten compound in an inert gas atmosphere or a reducing gas atmosphere (see, Japanese Patent 4,096,205).

The tungsten oxide-based compound is also available, for example, as a tungsten fine particle dispersion such as YMF-02 produced by Sumitomo Metal Industries, Ltd.

The metal boride may be one member or two or more members selected from lanthanum boride ($LaB_6$), praseodymium boride ($PrB_6$), neodymium boride ($NdB_6$), cerium boride ($CeB_6$), yttrium boride ($YB_6$), titanium boride ($TiB_2$), zirconium boride ($ZrB_2$), hafnium boride ($HfB_2$), vanadium boride ($VB_2$), tantalum boride ($TaB_2$), chromium boride ($CrB, CrB_2$), molybdenum boride ($MoB_2, MO_2B_5, MoB$) and tungsten boride ($W_2B_5$), and is preferably lanthanum boride ($LaB_6$).

The metal boride is preferably a fine particle. The average particle diameter of the metal boride fine particle is preferably 800 nm or less, more preferably 300 nm or less, still more preferably 100 nm or less. When the average particle diameter is in this range, the metal boride fine particle is scarcely allowed to block the visible light because of light scattering, so that light transparency in the visible region can be more successfully ensured. From the standpoint of avoiding light scattering, the average particle diameter is preferably smaller, but for the reason of easy handling or the like at the production, the average particle diameter of the metal boride fine particle is usually 1 nm or more.

Also, two or more kinds of metal borides may be used.

The metal boride is available as a commercial product and is available also as a metal boride fine particle dispersion such as KHF-7 produced by Sumitomo Metal Industries, Ltd.

The content of the compound (C) is preferably from 0.1 to 20 mass %, more preferably from 1 to 10 mass %, based on the entire solid content by mass of the polymerizable composition of the present invention.

In the case where the polymerizable composition of the present invention contains a tungsten compound, the content of the tungsten compound is preferably from 3 to 20 mass %, more preferably from 5 to 10 mass %, based on the entire solid content by mass of the polymerizable composition of the present invention.

In the case where the polymerizable composition of the present invention contains a metal boride, the content of the metal boride is preferably from 0.1 to 10 mass %, more preferably from 1 to 5 mass %, based on the entire solid content by mass of the polymerizable composition of the present invention.

[4] (D) Compound Having a Maximum Absorption Wavelength Between 300 nm and 450 nm and Assuming that the Maximum Absorbance Between 300 nm and 450 nm is 1, Having an Absorbance of 0.3 or Less at a Wavelength of 550 nm The polymerizable composition of the present invention contains (D) a compound having a maximum absorption between a wavelength of 300 nm and a wavelength of 450 nm and assuming that the maximum absorbance between 300 nm and 450 nm is 1, having an absorbance of 0.3 or less at a wavelength of 550 nm (hereinafter, sometimes simply referred to as a "light absorber (D)").

The light absorber (D) is a compound having a maximum absorption wavelength between 300 nm and 450 nm but exhibiting excellent light transparency in the visible region at a wavelength of 500 to 600 nm. More specifically, assuming that the maximum absorbance between a wavelength of 300 nm and a wavelength of 450 nm is 1, the absorbance at a wavelength of 550 nm is specified as above and therefore, the light absorber (D) can be said to be a compound having high absorbance at a wavelength of 300 to 450 nm and low absorbance at a wavelength of 550 nm (a compound where the difference between the absorbance at a wavelength of 300 to 450 nm and the absorbance at a wavelength of 550 nm is large). Such a light absorber (D) is contained in a resist composition for solder resist, a photosensitive layer is formed by coating the resist composition on a semiconductor substrate for solid-state imaging device, on which surface an alignment mark is provided, and then exposure and development are performed to form a solder resist layer, whereby a solder resist layer capable of both eliminating "the problem attributable to reflected light on the substrate surface" described later and ensuring detectability of the alignment mark by a visible sensor can be produced.

In the light absorber (D), assuming that the maximum absorbance between a wavelength of 300 nm and a wavelength of 450 nm is 1, the absorbance at a wavelength of 550 nm (hereinafter, sometimes referred to as "$A_{550}/A_{max}$" is preferably 0.2 or less, more preferably 0.1 or less. By satisfying this condition, detectability of the alignment mark by a visible sensor can be more unfailingly ensured.

From the above-described viewpoint, the "$A_{550}/A_{max}$" is preferably 0.

If the "$A_{550}/A_{max}$" exceeds 0.3, this leads to inadequate light transparency in the visible region at a wavelength of 500 to 600 nm and insufficient detectability of the alignment mark by a visible sensor.

In the case where the surface of the substrate on which the photosensitive layer is provided is composed of a material with high light reflectivity, such as metal, the reflected light on the substrate surface at the exposure of the photosensitive layer cannot be neglected, and rectangularity of the cross-sectional shape of the obtained pattern is liable to be impaired, for example, the cross-sectional shape is likely to become a skirt shape. If the exposure dose is kept low so as to reduce the reflected light, a pattern having a rectangular cross-sectional shape cannot be formed after all due to insufficient exposure dose.

The polymerizable composition of the present invention contains the light absorber (D) and therefore, even when irradiation is performed with an exposure amount large enough to obtain a pattern having a rectangular cross-sectional shape (hereinafter, sometimes referred to as an "adequate exposure dose"), the light absorber (D) absorbs the reflected light, so that a pattern having a rectangular cross-sectional shape can be formed.

As the light absorber (D), any compound may be used as long as it satisfies the above-described spectral characteristics. However, the light absorber (D) indicates a compound incapable of initiating the polymerization of a polymerizable compound under light or heat (that is, a compound not coming under the polymerization initiator (A)). The expression "incapable of initiating the polymerization of a polymerizable compound" as used herein means that the light absorber (D), even when receives light or heat energy, does not generate an active species for initiating the polymerization of a polymerizable compound.

In other words, a polymerization initiator having a maximum absorption wavelength between 300 nm and 450 nm and assuming that the maximum absorbance between 300 nm and 450 nm is 1, having an absorbance of 0.3 or less at a wavelength of 550 nm, is not included in the light absorber (D).

More specifically, the light absorber (D) is preferably a compound having no photosensitivity to ultraviolet or visible ray (specifically, light at a wavelength of 300 to 450 nm) and having no thermosensitivity to heat (specifically, for example, heat at 150 to 250° C.). The terms "photosensitivity" and "thermosensitivity" as used herein mean to develop the objective function while involving change in the chemical structure by the effect of ultraviolet or visible ray or heat.

Furthermore, the light absorber (D) is preferably not only incapable of initiating the polymerization of a polymerizable compound but also lacking the property of the sensitizer described later. The term "property of the sensitizer" as used herein indicates a property of transferring energy obtained by light absorption of the sensitizer itself to another material (polymerization initiator) and thereby initiating the polymerization.

The light absorber (D) is preferably a compound having a maximum absorption wavelength between 300 nm and 430 nm, more preferably a compound having a maximum absorption wavelength between 330 nm and 420 nm.

The light absorber (D) still more preferably has a maximum absorption wavelength at least in one range out of (I) the range of 340 to 380 nm, (II) the range of 380 to 420 nm, and (III) the range of 420 to 450 nm.

At the time of forming a pattern by applying exposure and development to the photosensitive layer formed using the polymerizable composition of the present invention, when the light source for exposure contains i-line, the light absorber (D) preferably has a maximum absorption wavelength in the wavelength range (I) above.

In the case where the light source for exposure contains h-line, the light absorber (D) preferably has a maximum absorption wavelength in the wavelength range (II) above.

In the case where the light source for exposure contains g-line, the light absorber (D) preferably has a maximum absorption wavelength in the wavelength range (III) above.

The light absorber (D) may be, for example, an inorganic compound such as cerium oxide, zinc oxide, titanium oxide, zirconium oxide and iron oxide but is preferably an organic compound, because adjustment of spectral absorption is easy. Also, the light absorber (D) may be used in a state of being dissolved in a solvent or may be used in a state of being dispersed still as a solid (for example, as a fine particulate pigment) in a solvent.

The light absorber (D) is preferably an ultraviolet absorber. The ultraviolet absorber as used herein means a compound having a maximum absorption wavelength between 300 nm and 400 nm. Accordingly, when the light absorber (D) is an ultraviolet absorber, the ultraviolet absorber preferably has a maximum absorption wavelength at least in either one range of the wavelength range (I) and the wavelength range (II) above.

In the case where the light absorber (D) is an ultraviolet absorber, the light absorber (D) is preferably a compound represented by any one of the following formulae (1) to (8).

Formula (1):

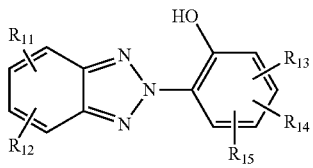

In the formula, each of $R_{11}$, $R_{12}$, $R_{13}$, $R_{14}$ and $R_{15}$ independently represents a hydrogen atom, a halogen atom, an alkyl group, an alkoxy group, an aryl group, an aryloxy group, an alkenyl group, a nitro group, an amino group, a carboxy group or a salt thereof, a sulfo group or a salt thereof, an alkylthio group, an arylthio group, an acyl group, an oxycarbonyl group, a cyano group, a heterocyclic group, a sulfonyl group, a sulfinyl group, an acyloxy group, a carbamoyl group, a sulfamoyl group or a hydroxy group. Any one of $R_{11}$ to $R_{15}$ may combine with any one of $R_{11}$ to $R_{15}$ in another compound represented by formula (1) to form a dimer.

Formula (2):

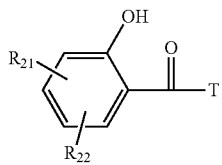

In the formula, each of $R_{21}$ and $R_{22}$ independently represents a hydrogen atom, a halogen atom, an alkyl group, an alkenyl group, an aryl group, an alkoxy group, an aryloxy group, an alkylthio group, an arylthio group, an amino group, a hydroxy group, a cyano group, a nitro group, a carbamoyl group, a sulfamoyl group, a carboxyl group or a salt thereof, a sulfo group or a salt thereof, a sulfonyl group, an acyloxy group, an acyl group or an oxycarbonyl group. T represents an aryl group, a heterocyclic group or an aryloxy group. T is preferably an aryl group. Either one of $R_{21}$ and $R_{22}$ may combine with either one of $R_{21}$ and $R_{22}$ in another compound represented by formula (2) to form a dimer.

Formula (3):

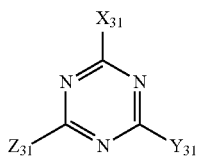

In the formula, each of $X_{31}$, $Y_{31}$ and $Z_{31}$ independently represents a substituted or unsubstituted alkyl group, an aryl group, an alkoxy group, an aryloxy group, an alkylthio group, an arylthio group, an amino group or a heterocyclic group, provided that at least one of $X_{31}$, $Y_{31}$ and $Z_{31}$ represents a group represented by the following formula (a).

Formula (a):

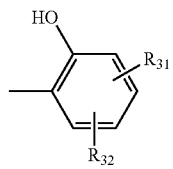

In the formula, each of $R_{31}$ and $R_{32}$ independently represents a hydrogen atom, a halogen atom, a substituted or unsubstituted alkyl group, an alkenyl group, an aryl group, an alkoxy group, an aryloxy group, an acyloxy group, an alkylthio group, an arylthio group, an amino group, an acyl group, a hydroxy group, an oxycarbonyl group, a carbamoyl group or a sulfamoyl group. Also, adjacent $R_{31}$ and $R_{32}$ may combine with each other to form a ring.

Formula (4):

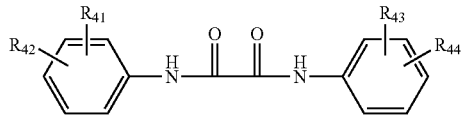

In the formula, each of $R_{41}$ to $R_{44}$ independently represents a hydrogen atom, a halogen atom, an alkyl group, an alkoxy group, an aryl group, an aryloxy group, an alkenyl group, a nitro group, an amino group, a carboxy group or a salt thereof, a sulfo group or a salt thereof, an alkylthio group, an arylthio group, an acyl group, an oxycarbonyl group, a cyano group, a heterocyclic group, a sulfonyl group, a sulfinyl group, an acyloxy group, a carbamoyl group, a sulfamoyl group or a hydroxy group.

Formula (5):

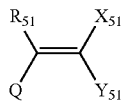

In the formula, Q represents an aryl group or a heterocyclic group, $R_{51}$ represents a hydrogen atom or an alkyl group, each of $X_{51}$ and $Y_{51}$ independently represents a cyano group, —$COOR_{52}$, —$CONR_{52}R_{53}$, —$COR_{52}$, —$SO_2R_{52}$ or —$SO_2R_{52}R_{53}$, and each of $R_{52}$ and $R_{53}$ independently represents a hydrogen atom, an alkyl group or an aryl group. Either one of $R_{52}$ and $R_{53}$ is preferably a hydrogen atom. Also, $X_{51}$ and $Y_{51}$ may combine with each other to form a 5- or 6-membered ring. When $X_{51}$ and $Y_{51}$ are a carboxyl group, they may be in a salt form.

Formula (6):

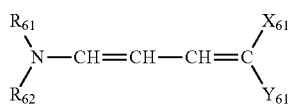

In the formula, each of $R_{61}$ and $R_{62}$ independently represents a hydrogen atom, an alkyl group, an aryl group, or a nonmetallic atom group necessary for forming a 5- or 6-membered ring by combining with each other. Also, either one of $R_{61}$ and $R_{62}$ may combine with the methine group next to the nitrogen atom to form a 5- or 6-membered ring. $X_{61}$ and $Y_{61}$, which may be the same or different, have the same meanings as $X_{51}$ and $Y_{51}$ in formula (5). $X_{61}$ and $Y_{61}$ may combine with each other to form a 5- or 6-membered ring. Furthermore, any one of $R_{61}$, $R_{62}$, $X_{61}$ and $Y_{61}$ may combine with any one of $R_{61}$, $R_{62}$, $X_{61}$ and $Y_{61}$ in another compound represented by formula (6) to form a dimer.

Formula (7):

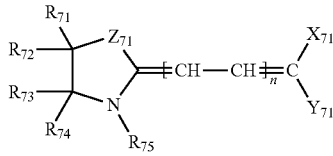

In the formula, each of $R_{71}$ to $R_{74}$ independently represents a hydrogen atom, an alkyl group or an aryl group, $R_{71}$ and $R_{74}$ may form together a double bond, and when $R_{71}$ and $R_{74}$ form together a double bond, $R_{72}$ and $R_{73}$ may combine to form a benzene ring or a naphthalene ring. $R_{75}$ represents an alkyl group or an aryl group, $Z_{71}$ represents an oxygen atom, a sulfur atom, a methylene group, an ethylene group, $>N-R_{76}$ or $>C(R_{77})(R_{78})$, $R_{76}$ represents an alkyl group or an aryl group, each of $R_{77}$ and $R_{78}$ independently represents a hydrogen atom or an alkyl group, and $X_{71}$ and $Y_{71}$, which may be the same or different, have the same meanings as $X_{51}$ and $Y_{51}$ in formula (5). $X_{71}$ and $Y_{71}$ may combine with each other to form a 5- or 6-membered ring. n represents 0 or 1.

Formula (8):

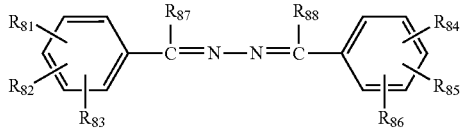

In the formula, each of $R_{81}$ to $R_{86}$ independently represents a hydrogen atom, a halogen atom, an alkyl group, an alkoxy group, an aryl group, an aryloxy group, an alkenyl group, a nitro group, an amino group, a carboxy group or a salt thereof, a sulfo group or a salt thereof, an alkylthio group, an arylthio group, an acyl group, an oxycarbonyl group, a cyano group, a heterocyclic group, a sulfonyl group, a sulfinyl group, an acyloxy group, a carbamoyl group, a sulfamoyl group or a hydroxy group, each of $R_{87}$ and $R_{88}$ independently represents a hydrogen atom, an alkyl group or an aryl group, and $R_{87}$ and $R_{88}$ may combine with each other to form a 5- or 6-membered ring.

In formulae (1) to (8) and formula (a), the alkyl group represented by $R_{11}$ to $R_{15}$, $R_{21}$, $R_{22}$, $X_{31}$, $Y_{31}$, $Z_{31}$, $R_{31}$, $R_{32}$, $R_{41}$ to $R_{44}$, $R_{51}$, $R_{52}$, $R_{53}$, $R_{61}$, $R_{62}$, $R_{71}$ to $R_{78}$ and $R_{81}$ to $R_{88}$ is preferably an alkyl group having a carbon number of 1 to 20 and may have a substituent [for example, a hydroxy group, a cyano group, a nitro group, a halogen atom (e.g., chlorine, bromine, fluorine), an alkoxy group (e.g., methoxy group, ethoxy group, butoxy group, octyloxy group, phenoxyethoxy group), an aryloxy group (e.g., phenoxy group), an ester group (e.g., methoxycarbonyl group, ethoxycarbonyl group, octyloxycarbonyl group, dodecyloxycarbonyl group), a carbonyloxy group (e.g., ethylcarbonyloxy group, heptylcarbonyloxy group, phenylcarbonyloxy group), an amino group (e.g., dimethylamino group, ethylamino group, diethylamino group), an aryl group (e.g., phenyl group, tolyl group, 4-methoxyphenyl group), a carbonamido group (e.g., methylcarbonylamido group, phenylcarbonylamido group), a carbamoyl group (e.g., ethylcarbamoyl group, phenylcarbamoyl group), a sulfonamido group (e.g., methanesulfonamido group, benzenesulfonamido group), a sulfamoyl group (e.g., butylsulfamoyl group, phenylsulfamoyl group, methyloctylaminosulfonyl group), a carboxyl group or a sulfonic acid group]. Specifically, the alkyl group includes a group such as methyl group, ethyl group, propyl group, iso-propyl group, n-butyl group, sec-butyl group, tert-butyl group, pentyl group, tert-pentyl group, hexyl group, octyl group, 2-ethylhexyl group, tert-octyl group, decyl group, dodecyl group, hexadecyl group, octadecyl group, benzyl group, phenethyl group, cyclopropyl group, cyclopentyl group, cyclohexyl group and bicyclo[2,2,2]octyl group, and a group having the above-described substituent.

The aryl group represented by $R_{11}$ to $R_{15}$, $R_{21}$, $R_{22}$, T, $X_{31}$, $Y_{31}$, $Z_{31}$, $R_{31}$, $R_{32}$, $R_{41}$ to $R_{44}$, Q, $R_{52}$, $R_{53}$, $R_{61}$, $R_{62}$, $R_{71}$ to $R_{76}$ and $R_{81}$ to $R_{88}$ is preferably an aryl group having a carbon number of 6 to 10 and may have a substituent [for example, an alkyl group (e.g., methyl group, ethyl group, propyl group, iso-propyl group, butyl group, sec-butyl group, tert-butyl group, pentyl group, tert-pentyl group, octyl group, decyl group, dodecyl group, tetradecyl group, hexadecyl group), or a group described above as the substituent which the alkyl group may have]. The aryl group specifically includes a phenyl group and a naphthyl group.

The alkenyl group represented by $R_{11}$ to $R_{15}$, $R_{21}$, $R_{22}$, $R_{31}$, $R_{32}$, $R_{41}$ to $R_{44}$, and $R_{81}$ to $R_{86}$ is preferably an alkenyl group having a carbon number of 3 to 20 and includes an allyl group, a 2-butenyl group, a 3-butenyl group, and an oleyl group. These groups may be substituted with a group described above as the substituent which the alkyl group may have.

The alkoxy group represented by $R_{11}$ to $R_{15}$, $R_{21}$, $R_{22}$, $X_{31}$, $Y_{31}$, $Z_{31}$, $R_{31}$, $R_{32}$, $R_{41}$ to $R_{44}$ and $R_{81}$ to $R_{86}$ is preferably an alkoxy group having a carbon number of 1 to 20, and examples thereof include a methoxy group, an ethoxy group, a butoxy group, an isobutoxy group, an n-octoxy group, an isooctoxy group, a dodecyloxy group, a benzyloxy group, and an octadecyloxy group. These groups may be substituted with the substituent described above as the substituent which the alkyl group may have.

The aryloxy group represented by $R_{11}$ to $R_{15}$, $R_{21}$, $R_{22}$, T, $X_{31}$, $Y_{31}$, $Z_{31}$, $R_{31}$, $R_{32}$, $R_{41}$ to $R_{44}$ and $R_{81}$ to $R_{86}$ is preferably an aryloxy group having a carbon number of 6 to 10, and examples thereof include a phenoxy group and a naphthoxy group. These groups may be substituted with a group described above as the substituent which the aryl group may have.

The alkylthio group represented by $R_{11}$ to $R_{15}$, $R_{21}$, $R_{22}$, $X_{31}$, $Y_{31}$, $Z_{31}$, $R_{31}$, $R_{32}$, $R_{41}$ to $R_{44}$ and $R_{81}$ to $R_{86}$ is preferably an alkylthio group having a carbon number of 1 to 20, and examples thereof include a methylthio group, a hexylthio group, an octylthio group, and a hexadecylthio group.

The arylthio group represented by $R_{11}$ to $R_{15}$, $R_{21}$, $R_{22}$, $X_{31}$, $Y_{31}$, $Z_{31}$, $R_{31}$, $R_{32}$, $R_{41}$ to $R_{44}$ and $R_{81}$ to $R_{86}$ is preferably an arylthio group having a carbon number of 6 to 10, and examples thereof include a phenylthio group and a naphthylthio group. These alkylthio groups and arylthio groups may be substituted with a group described above as the substituent which the alkyl group or aryl group may have.

The amino group represented by $R_{11}$ to $R_{15}$, $R_{21}$, $R_{22}$, $X_{31}$, $Y_{31}$, $Z_{31}$, $R_{31}$, $R_{32}$, $R_{41}$ to $R_{44}$ and $R_{81}$ to $R_{86}$ is preferably a substituted or unsubstituted amino group having a carbon number of 0 to 40 group, and examples thereof include an unsubstituted amino group, a methylamino group, a dimethylamino group, a diethylamino group, an octylamino group, a dihexylamino group, a distearylamino group, a diisobutylamino group, an anilino group, a diphenylamino group, a methylphenylamino group, a formamide group, an acetylamino group, a hexanoylamino group, a decanoylamino group, a stearoylamino group, a benzoylamino group, a methanesulfonamide group, an ethanesulfonamide group, a nonanesulfonamide group, a butanesulfonamide group, a dodecanesulfonamide group, an octadecanesulfonamide group, a benzenesulfonamide group, a methoxycarbonylamino group, a phenoxycarbonylamino group, a carbamoylamino group, a cyclohexylcarbamoylamino group, and a diethylcarbamoylamino. These groups may be substituted with a group described above as the substituent which the aryl group may have.

The carbamoyl group represented by $R_{11}$ to $R_{15}$, $R_{21}$, $R_{22}$, $R_{31}$, $R_{32}$, $R_{41}$ to $R_{44}$ and $R_{81}$ to $R_{86}$ is preferably a carbamoyl group having a carbon number of 1 to 20, and examples thereof include an unsubstituted carbamoyl group, a methylcarbamoyl group, a propylcarbamoyl group, a diethylcarbamoyl group, an octylcarbamoyl group, a dodecylcarbamoyl group, a hexadecylcarbamoyl group, an octadecylcarbamoyl group, and a phenylcarbamoyl group. These groups may be substituted with a group described above as the substituent which the aryl group may have.

The sulfamoyl group represented by $R_{11}$ to $R_{15}$, $R_{21}$, $R_{22}$, $R_{31}$, $R_{32}$, $R_{41}$ to $R_{44}$ and $R_{81}$ to $R_{86}$ is preferably a sulfamoyl group having a carbon number of 0 to 20, and examples thereof include an unsubstituted sulfamoyl group, an ethylsulfamoyl group, a butylsulfamoyl group, a heptylsulfamoyl group, a tetradecylsulfamoyl group, a dibutylsulfamoyl group, an octadecylsulfamoyl group, and a phenylsulfamoyl group. These groups may be substituted with a group described above as the substituent which the aryl group may have.

The acyloxy group represented by $R_{11}$ to $R_{15}$, $R_{21}$, $R_{22}$, $R_{31}$, $R_{32}$, $R_{41}$ to $R_{44}$ and $R_{81}$ to $R_{86}$ is preferably an acyloxy group having a carbon number of 2 to 20, and examples thereof include an acetyloxy group, a hexanoyloxy group, a decanoyloxy group, a stearoyloxy group, and a benzoyloxy group. These groups may be substituted with a group described above as the substituent which the aryl group may have.

The oxycarbonyl group represented by $R_{11}$ to $R_{15}$, $R_{21}$, $R_{22}$, $R_{31}$, $R_{32}$, $R_{41}$ to $R_{44}$ and $R_{81}$ to $R_{86}$ includes, for example, an alkoxycarbonyl group and an aryloxycarbonyl group and is preferably an oxycarbonyl group having a carbon number of 2 to 20. Examples thereof include a methoxycarbonyl group, an ethoxycarbonyl group, a butoxycarbonyl group, an isobutoxycarbonyl group, a heptyloxycarbonyl group, a tetradecyloxycarbonyl group, an octadecyloxycarbonyl group, and a phenoxycarbonyl group. These groups may be substituted with a group described above as the substituent which the aryl group may have.

The sulfonyl group represented by $R_{11}$ to $R_{15}$, $R_{21}$, $R_{22}$, $R_{41}$ to $R_{44}$ and $R_{81}$ to $R_{86}$ is preferably a sulfonyl group having a carbon number of 1 to 20, and examples thereof include a methanesulfonyl group, a pentanesulfonyl group, a decanesulfonyl group, an octadecanesulfonyl group, and a benzenesulfonyl group. These groups may be substituted with a group described above as the substituent which the aryl group may have.

The sulfinyl group represented by $R_{11}$ to $R_{15}$, $R_{41}$ to $R_{44}$ and $R_{81}$ to $R_{86}$ is preferably a sulfinyl group having a carbon number of 1 to 20, and examples thereof include a methanesulfinyl group, a pentanesulfinyl group, a decanesulfinyl group, a hexadecanesulfinyl group, and a benzenesulfinyl group. These groups may be substituted with a group described above as the substituent which the aryl group may have.

The acyl group represented by $R_{11}$ to $R_{15}$, $R_{21}$, $R_{22}$, $R_{31}$, $R_{32}$, $R_{41}$ to $R_{44}$ and $R_{81}$ to $R_{86}$ is preferably an acyl group having a carbon number of 1 to 20, and examples thereof include an acetyl group, a butanoyl group, a pivaloyl group, an octanoyl group, a hexadecanoyl group, and a benzoyl group. These groups may be substituted with a group described above as the substituent which the aryl group may have.

The halogen atom represented by $R_{11}$ to $R_{15}$, $R_{21}$, $R_{22}$, $R_{31}$, $R_{32}$, $R_{41}$ to $R_{44}$ and $R_{81}$ to $R_{86}$ includes, for example, fluorine, chlorine and bromine.

The heterocyclic group represented by $R_{11}$ to $R_{15}$, T, $X_{31}$, $Y_{31}$, $Z_{31}$, $R_{41}$ to $R_{44}$, Q and $R_{81}$ to $R_{86}$ is preferably a 5- or 6-membered heterocyclic group, and examples thereof include a furan group, a thiophene group, an indole group, a pyrrole group, a pyrazole group, an imidazole group, and a pyridine group. These groups may be substituted with a group described above as the substituent which the aryl group may have.

The 5- or 6-membered ring formed by combining $X_{51}$ and $Y_{51}$, $X_{61}$ and $Y_{61}$, or $X_{71}$ and $Y_{71}$ is preferably a ring known as an acidic nucleus, and examples thereof include rings corresponding to 2-pyrazolin-5-one, pyrazolidine-2,4-dione, rhodanine, hydantoin, 2-thiohydantoin, 4-thiohydantoin, 2,4-oxazolidinedione, isooxazolone, barbituric acid, thiobarbituric acid, indandione, hydroxypyridone, furanone, 1,3-cyclohexanedione, and Meldrum's acid. These rings may be substituted with a group described above as the substituent which the aryl group may have.

The 5- or 6-membered ring formed by combining $R_{61}$ and $R_{62}$ include, for example, pyrrolidine, piperidine, and morpholine.

The ultraviolet absorber represented by any one of formulae (1) to (8) may contain a dissociable group for the purpose of increasing the alkali developability. The dissociable group includes a carboxyl group, a sulfamoyl group, a sulfonamide group, and a phenolic hydroxyl group. The dissociable group is preferably a carboxyl group.

Among the ultraviolet absorbers represented by formulae (1) to (8), in view of high stability of the ultraviolet absorber itself, those represented by formulae (1) to (4) are preferred. From the standpoint that the molar extinction coefficient is high and the amount added can be made small, the compound represented by formula (3), (5), (6) or (7) is preferred, and the compound represented by formula (3) or (6) is more preferred.

Specific examples of the ultraviolet absorber represented by any one of formulae (1) to (8) (in all of specific examples, the value of $A_{550}/A_{max}$ is 0) are illustrated below, but the present invention is not limited thereto.

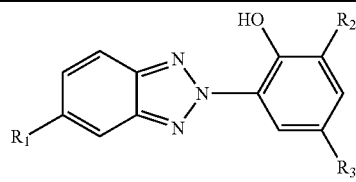

|  | $R_1$ | $R_2$ | $R_3$ |
|---|---|---|---|
| 1-1 | H | H | t-$C_8H_{17}$ |
| 1-2 | H | t-$C_4H_9$ | $CH_2CH_2CO_2H$ |
| 1-3 | H | $C(CH_3)_2Ph$ | t-$C_8H_{17}$ |
| 1-4 | H | $C(CH_3)_2Ph$ | $C(CH_3)_2Ph$ |
| 1-5 | H | H | $CH_2CH_2CO_2K$ |
| 1-6 | H | t-$C_5H_{11}$ | t-$C_5H_{11}$ |
| 1-7 | H | $C_9H_{19}$ | H |
| 1-8 | H | $NHCOCH(CH_3)_2$ | $CH_3$ |
| 1-9 | Cl | t-$C_4H_9$ | t-$C_4H_9$ |
| 1-10 | Cl | t-$C_4H_9$ | $CH_3$ |
| 1-11 | Cl | t-$C_4H_9$ | $CH_2CH_2CO_2C_8H_{17}$ |

-continued
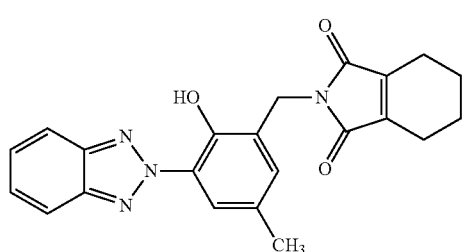
| | $R_1$ | $R_2$ | $R_3$ |
|---|---|---|---|
| 1-12 | H | $C_{12}H_{25}$ | $CH_3$ |
| 1-13 | $SC_{12}H_{25}$ | $t\text{-}C_4H_9$ | $t\text{-}C_4H_9$ |
1-14
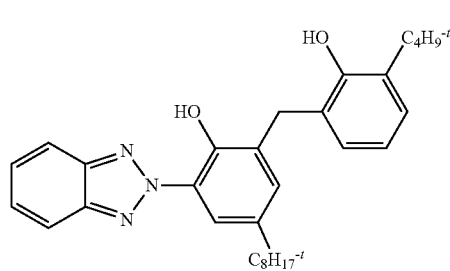
1-15
1-16
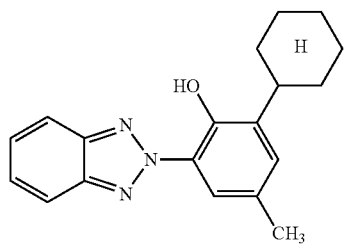
1-17
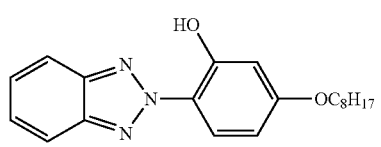
-continued
1-18
1-19
1-20
1-21
| | $R_1$ | $R_2$ |
|---|---|---|
| 2-1 | $OCH_3$ | H |
| 2-2 | $OC_8H_{17}$ | H |
| 2-3 | $OCH_2Ph$ | H |
| 2-4 | $OCH_2CO_2C_2H_5$ | H |
| 2-5 | OH | COPh |
| 2-6 | $O(CH_2)_3CO_2Li$ | H |
| 2-7 | OH | $SO_3Na$ |
| 2-8 | $OCH_3$ | $SO_3H$ |
2-9
2-10
2-11
2-12

-continued
2-13
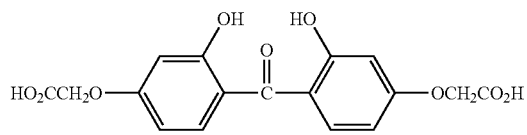
2-14
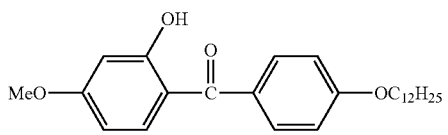
2-15
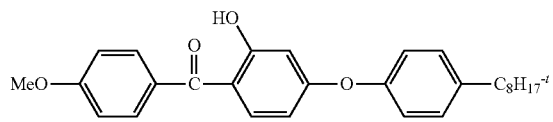
2-16
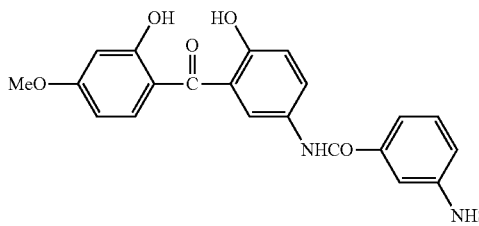
2-17
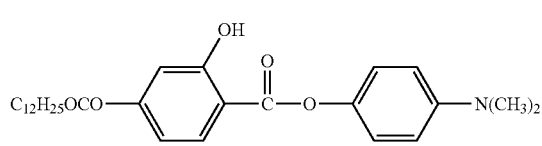
2-18
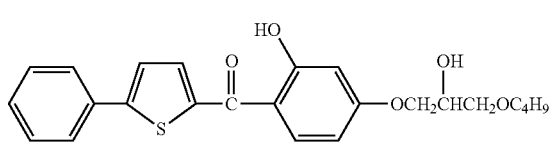
3-1
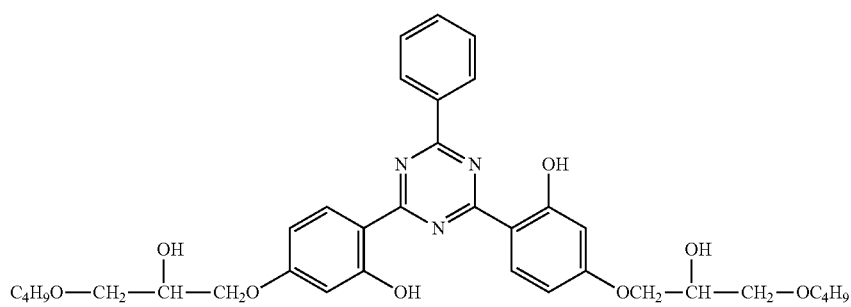
3-2
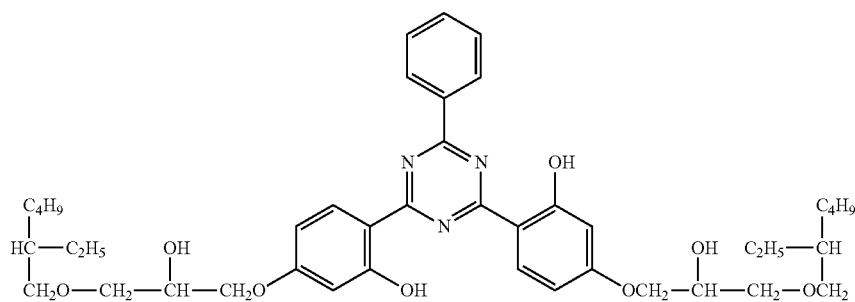
3-3
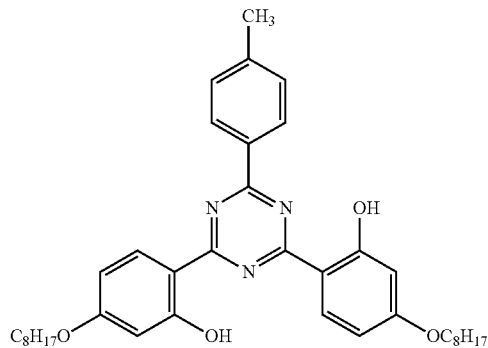

3-4
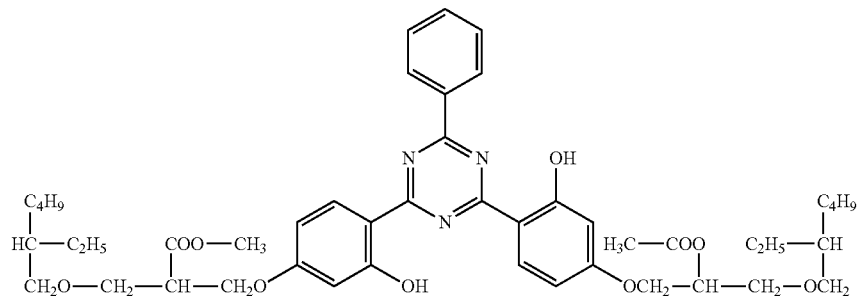
3-5
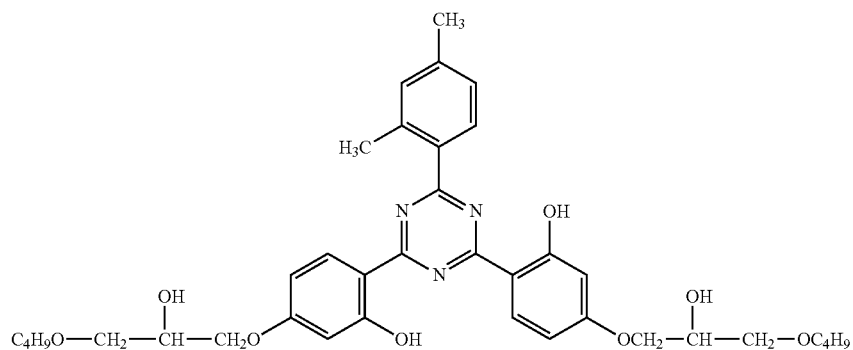
3-6
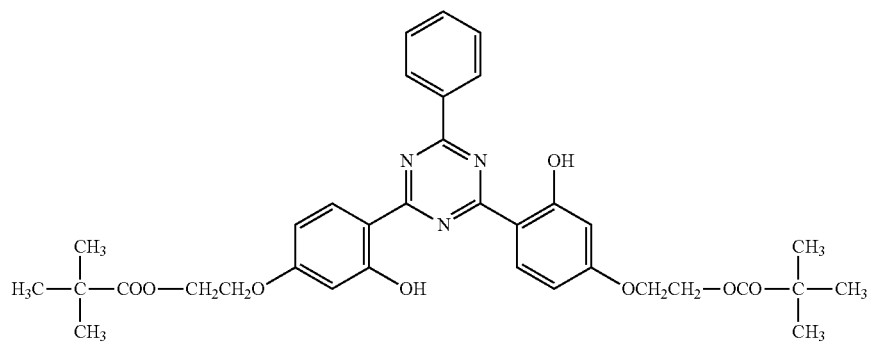
3-7
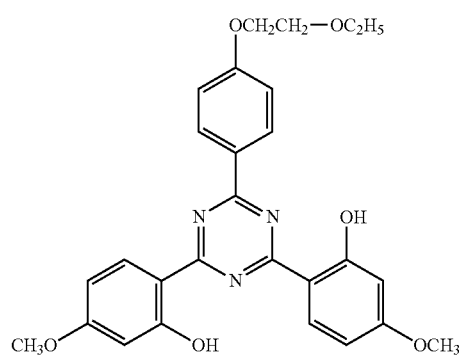

3-8
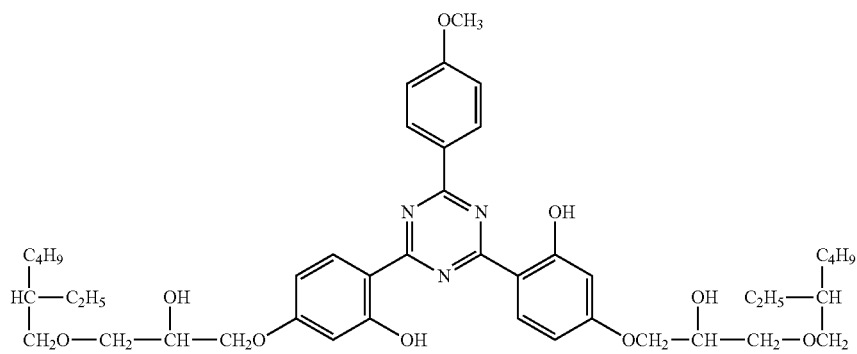
3-9
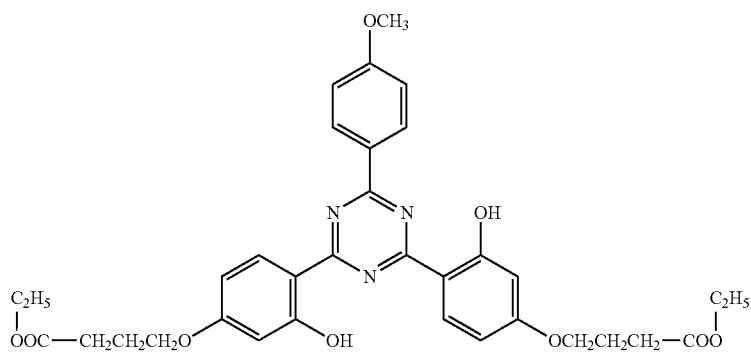
3-10
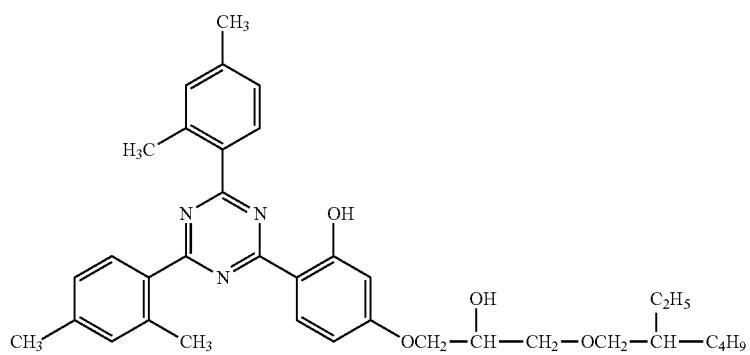
3-11
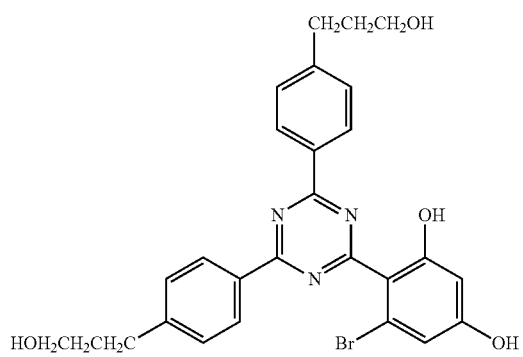
3-12
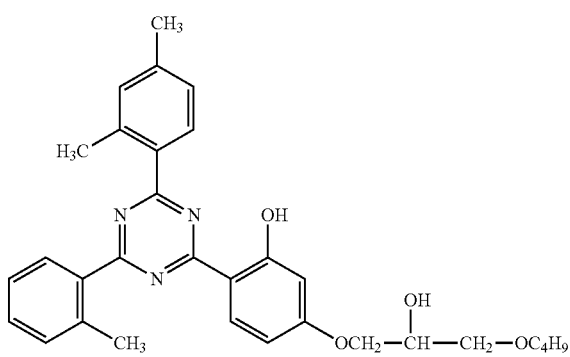

3-13
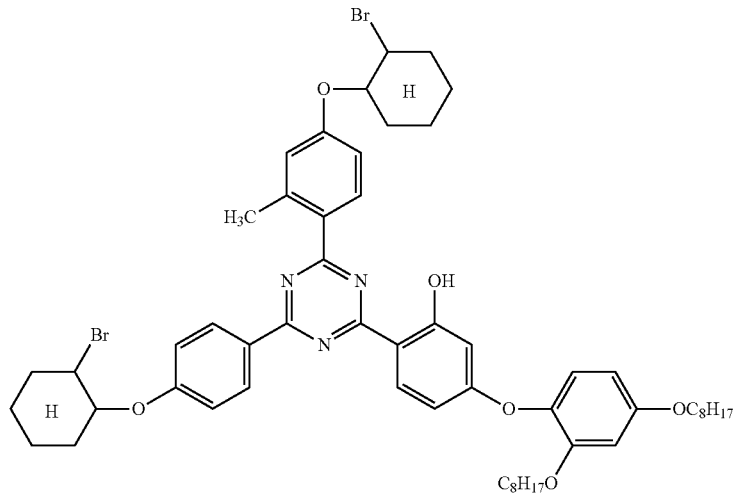
3-14
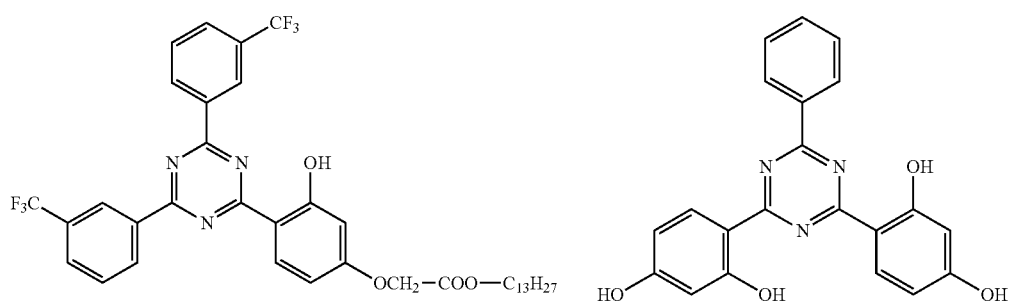
3-15
3-16
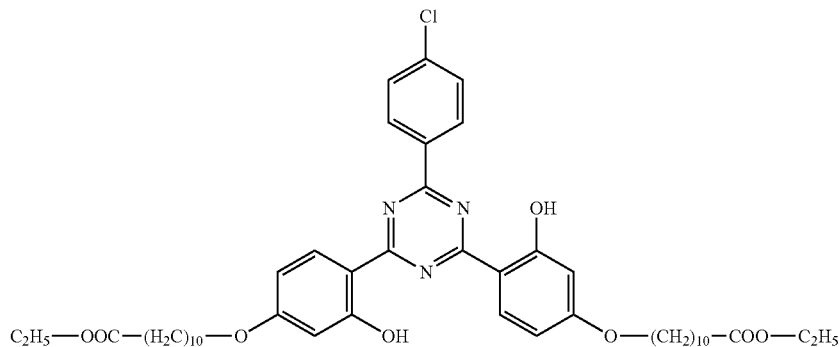
3-17
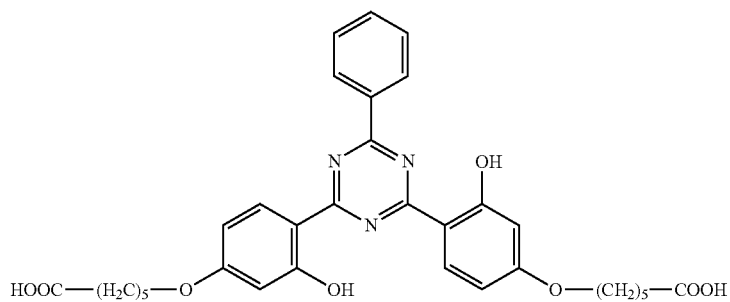

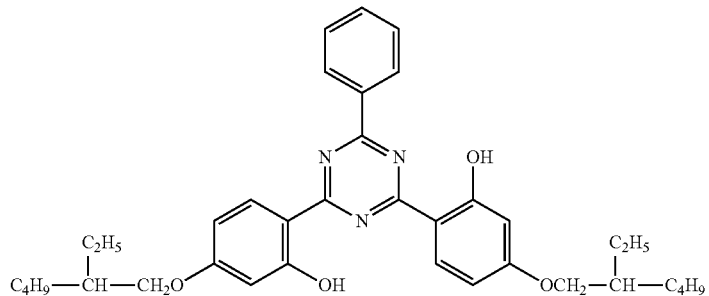
3-18
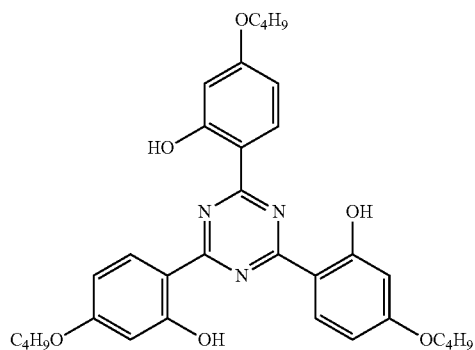
3-19
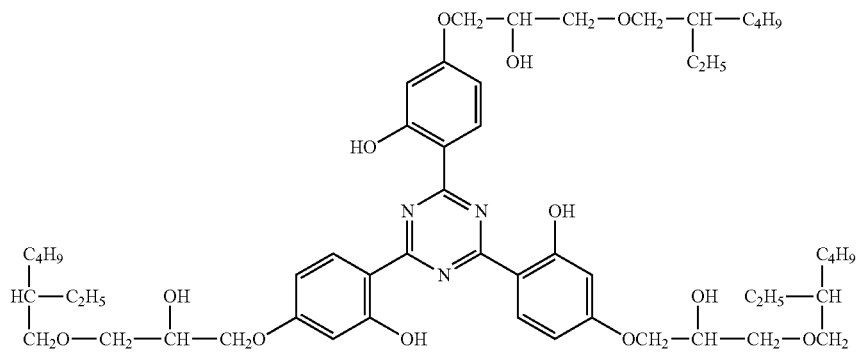
3-20
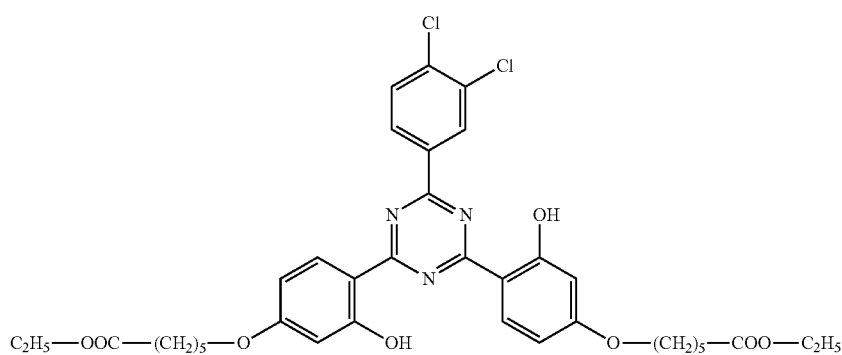
3-21

-continued
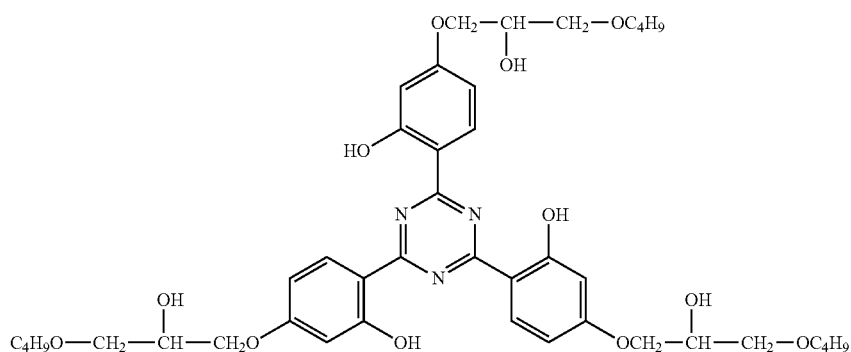
3-22
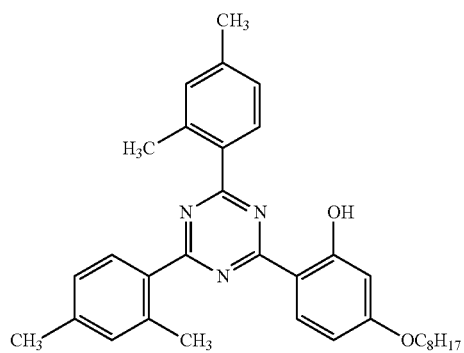
3-23
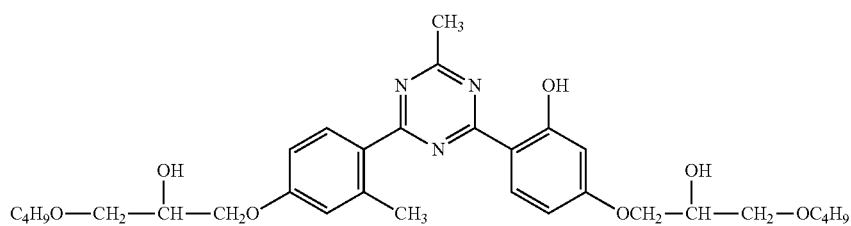
3-24
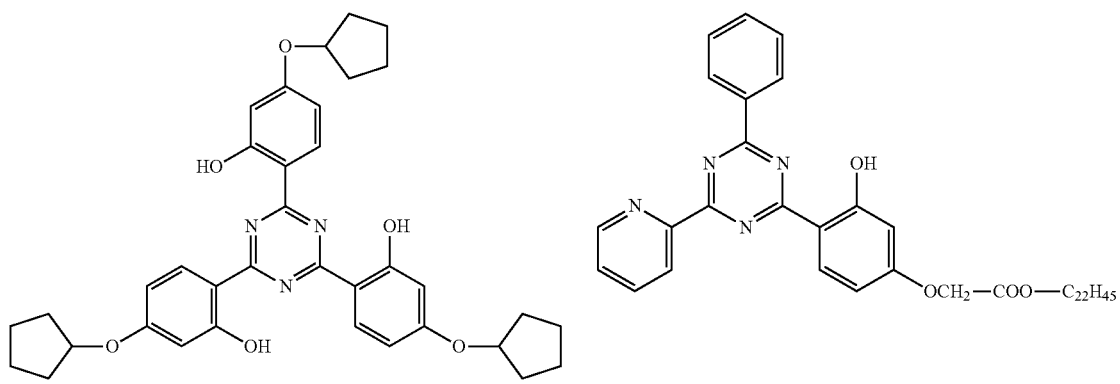
3-25    3-26

3-27
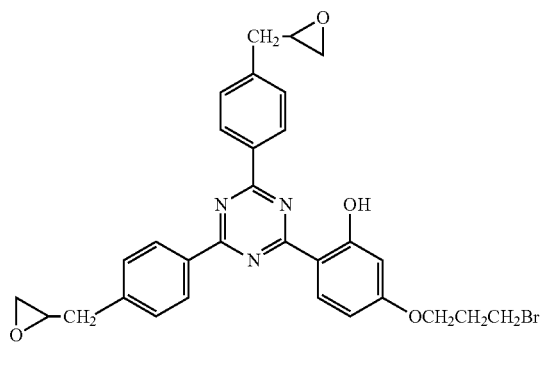
3-28
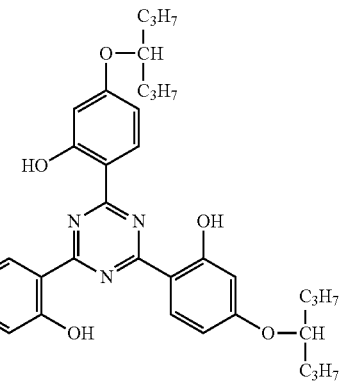
3-29
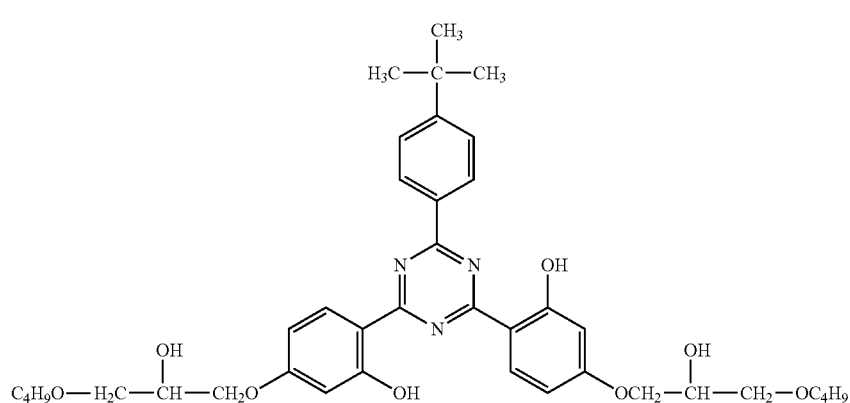
3-30
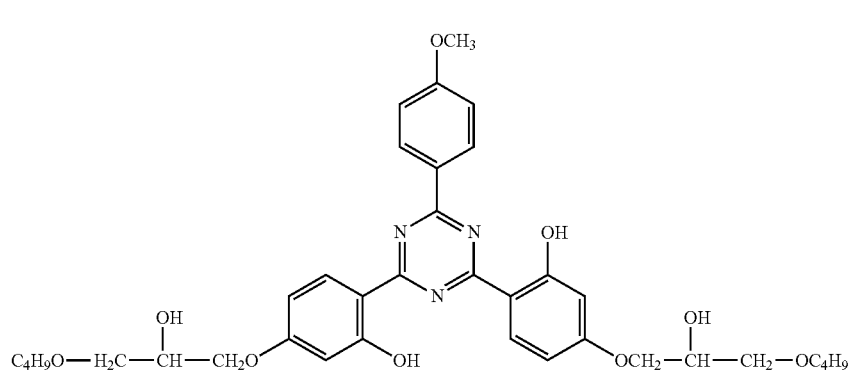
3-31
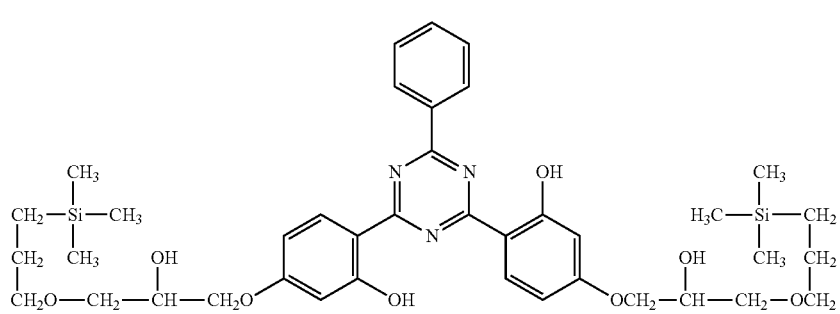

-continued
3-32
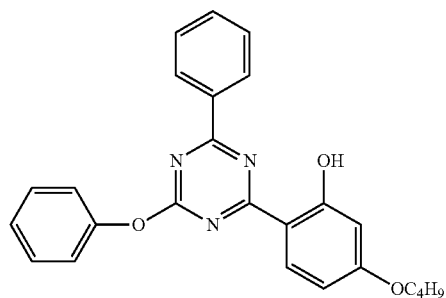
3-33
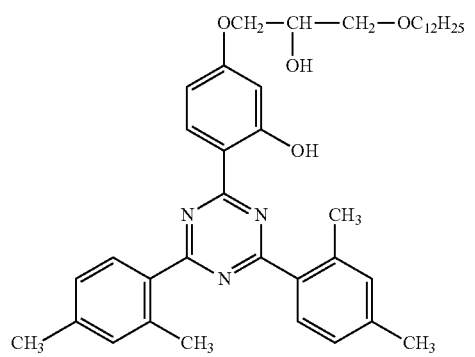
3-34
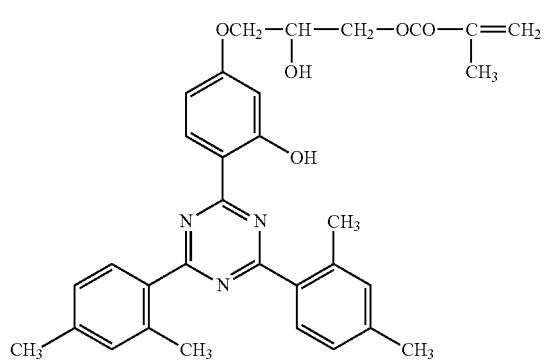
3-35
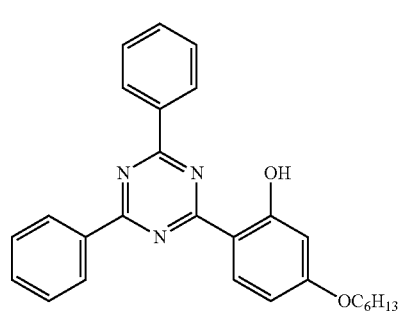
3-36
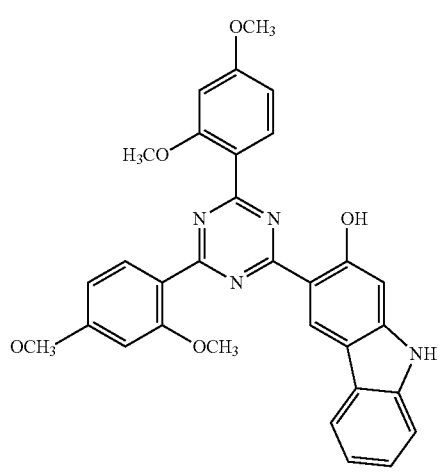
3-37
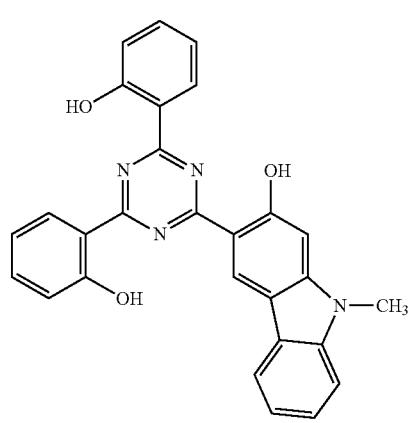
3-38
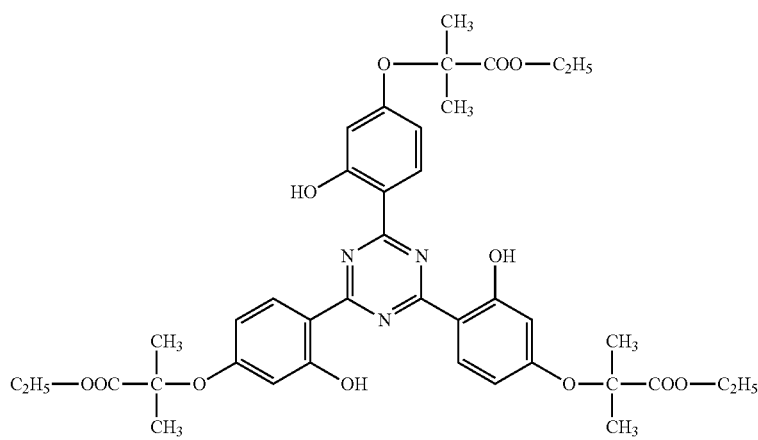

-continued
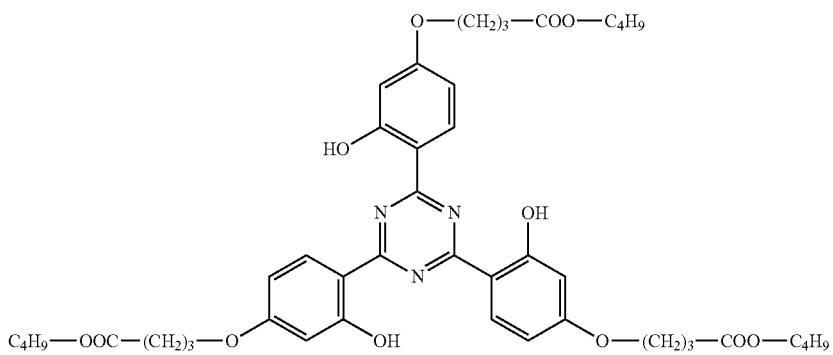
3-39
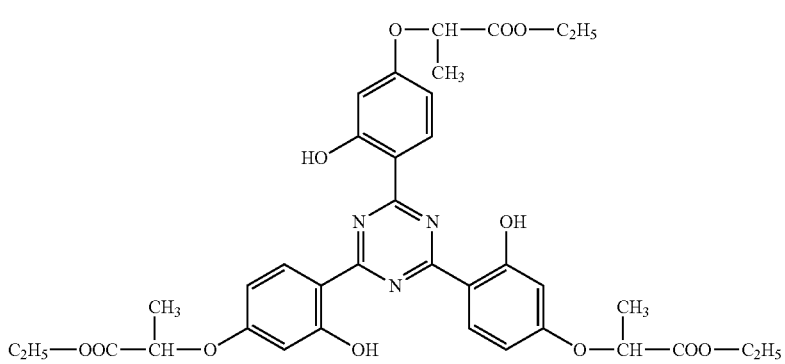
3-40
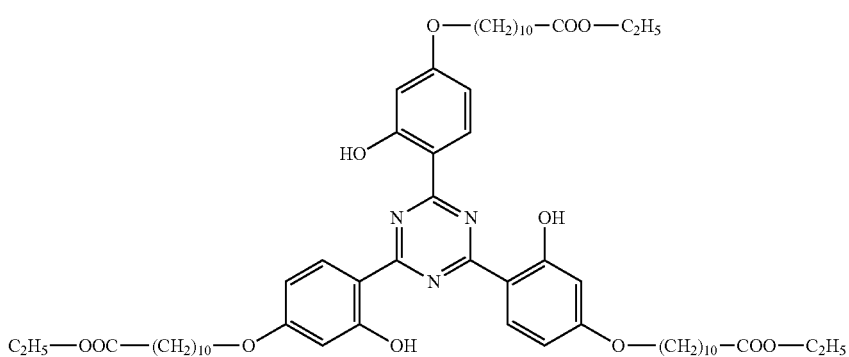
3-41
3-42~3-50
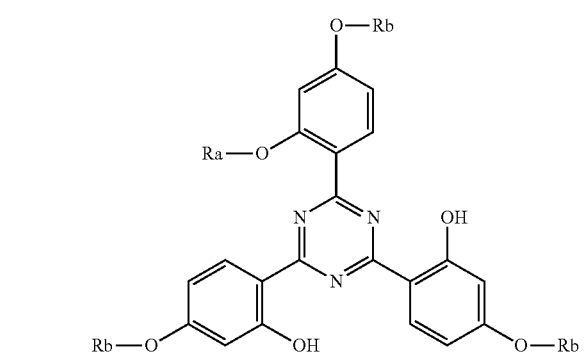
(3-42) Ra: —C$_2$H$_5$, Rb: —CH$_2$—CHOH—CH$_2$—OC$_4$H$_9$
(3-43) Ra: —CH$_2$—CHOH—CH$_2$—OC$_4$H$_9$, Rb: —CH$_2$—CHOH—CH$_2$—OC$_4$H$_9$
(3-44) Ra: —C$_2$H$_5$, Rb: —CH(CH$_3$)—COO—C$_2$H$_5$
(3-45) Ra: —CH(CH$_3$)—COO—C$_2$H$_5$, Rb: —CH(CH$_3$)—COO—C$_2$H$_5$
(3-46) Ra: —CH$_2$—CH(C$_2$H$_5$)—C$_4$H$_9$, Rb: —CH$_2$—CH(C$_2$H$_5$)—C$_4$H$_9$
(3-47) Ra: —C$_4$H$_9$, Rb: —C$_4$H$_9$
(3-48) Ra: —CH$_2$—COO—C$_2$H$_5$, Rb: —CH$_2$—COO—C$_2$H$_5$
(3-49) Ra: —C$_2$H$_5$, Rb: —C$_8$H$_{17}$
(3-50) Ra: —C$_2$H$_5$, Rb: —CH$_2$—COO—C$_2$H$_5$

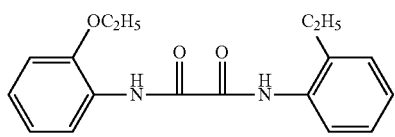
4-1
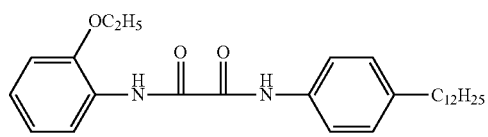
4-2
|  | R1 | R2 |
|---|---|---|
| 5-1 | MeO | CO₂H |
| 5-2 | MeO | CO₂Na |
| 5-3 | MeO | CO₂C₁₀H₂₁ |
| 5-4 | Me | CO₂C₁₂H₂₅ |
|  | R1 | R2 |
|---|---|---|
| 5-5 | (NCC₂H₄)₂N | CN |
| 5-6 | (n-C₆H₁₃)₂N | CN |
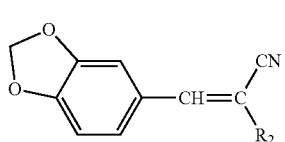
5-7 R₂ = CO₂C₂H₂
5-8 R₂ = CO₂CH₂CH(C₂H₅)C₄H₉
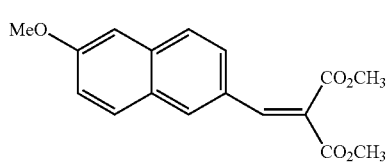
5-9
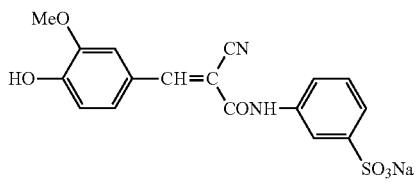
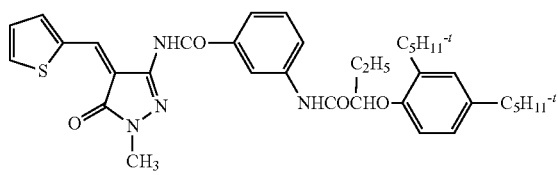
5-10
5-11
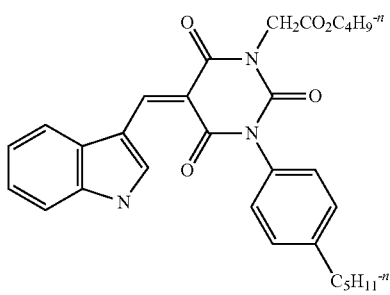
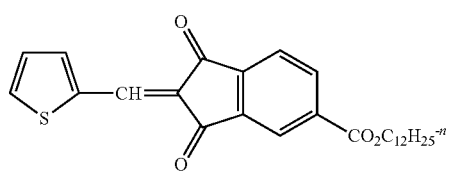
5-12
5-13
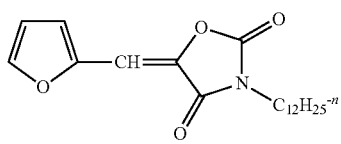
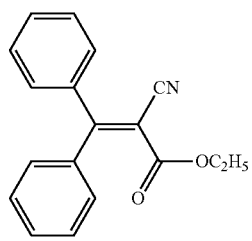
5-14
5-15

-continued
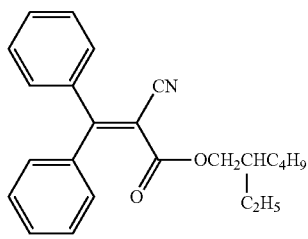 5-16
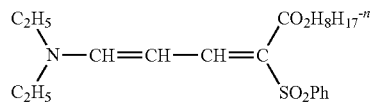 6-1
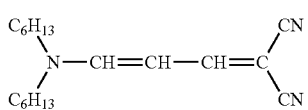 6-2
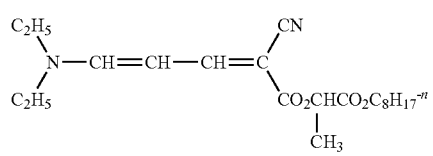 6-3
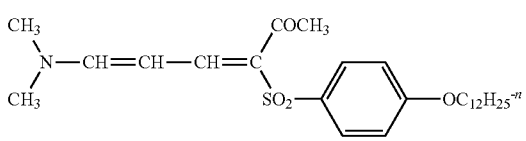 6-4
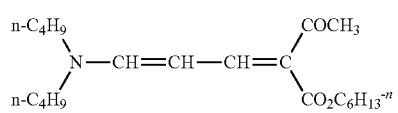 6-5
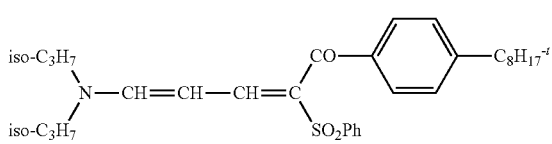 6-6
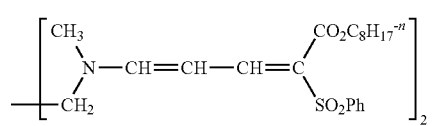 6-7
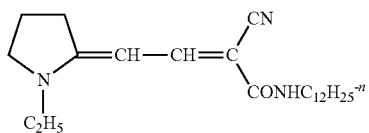 6-8
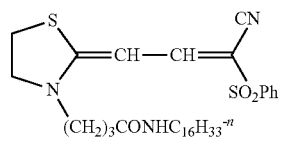 7-1
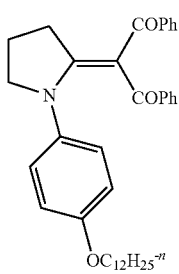 7-2
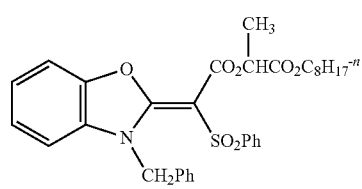 7-3
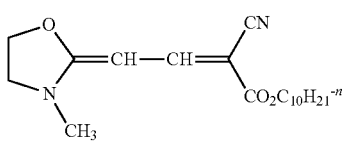 7-4
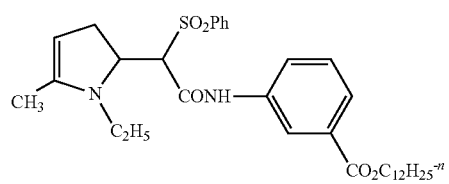 7-5
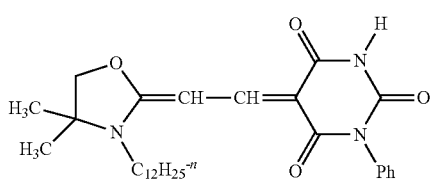 7-6
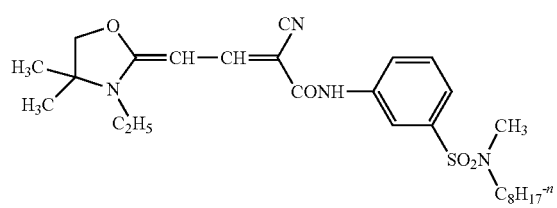 7-7

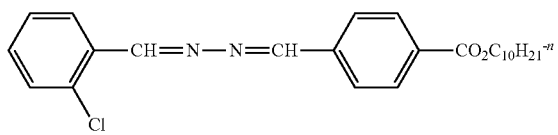

8-1

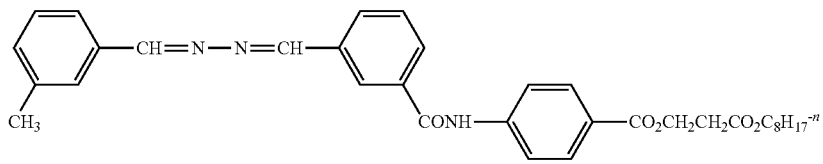

8-2

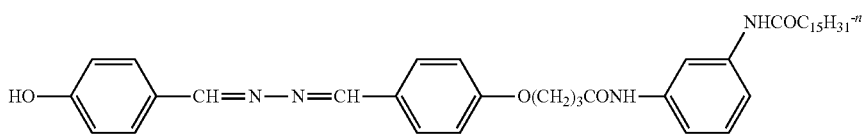

8-3

The compound represented by any one of formulae (1) to (8) can be synthesized by or in accordance with the method described, for example, in JP-B-48-30492, JP-B-55-36984, JP-B-55-125875, JP-B-36-10466, JP-B-48-5496, JP-A-46-3335, JP-A-58-214152, JP-A-58-221844, JP-A-47-10537, JP-A-59-19945, JP-A-63-53544, JP-A-51-56620, JP-A-53-128333, JP-A-58-181040, JP-A-6-211813, JP-A-7-258228, JP-A-8-239368, JP-A-8-53427, JP-A-10-115898, JP-A-10-147577, JP-A-10-182621, JP-T-8-501291, U.S. Pat. Nos. 3,754,919, 4,220,711, 2,719,086, 3,698,707, 3,707,375, 5,298,380, 5,500,332, 5,585,228 and 5,814,438, British Patent 1,198,337, and European Patent Publications 323,408A, 520,938A, 521,823A, 531,258A, 530,135A and 520938A. Also, some of those compounds are easily available as a commercial product. Examples of the commercially available ultraviolet absorber include Tinuvin 109, Tinuvin 460, Tinuvin 154 and Tinuvin 326 (all produced by BASF Japan). In addition, a salicylate-based ultraviolet absorber such as phenyl salicylate, p-octylphenyl salicylate and p-tert-butylphenyl salicylate may be also preferably used.

The structures, physical properties and operation mechanisms of representative ultraviolet absorbers are described in Andreas Valet, *Light Stabilizers for Paint*, Vincentz.

The polymer ultraviolet absorber is preferably a polymer having a chemical structure represented by any one of formulae (1) to (8) as a constitutional unit or as a part of a constitutional unit. The ultraviolet absorber having a chemical structure represented by formula (1) as a constitutional unit is disclosed, for example, in European Patent 747,755, JP-A-8-179464, JP-A-6-82962, JP-A-4-193869, JP-A-3-139590, JP-A-63-55542, JP-A-62-24247, JP-A-47-560, and JP-A-58-185677; the ultraviolet absorber having a chemical structure represented by formula (2) as a constitutional unit is disclosed in JP-A-63-35660 and JP-A-2-180909; the ultraviolet absorber having a chemical structure represented by formula (3) as a constitutional unit is disclosed in European Patent 706,083; the ultraviolet absorber having a chemical structure represented by formula (5) is disclosed in JP-T-4-500228 and JP-B-63-53541; the ultraviolet absorber having a chemical structure represented by formula (6) as a constitutional unit is disclosed in European Patent 27,242, JP-B-1-53455 and JP-A-61-189530; and the ultraviolet absorber having a chemical structure represented by formula (7) as a constitutional unit is disclosed in JP-A-63-53543. Furthermore, ultraviolet absorbers described, for example, in JP-A-47-192, JP-A-61-169831, JP-A-63-53543, JP-A-63-53544, JP-A-63-56651 and European Patent 343,246 are known.

The ultraviolet absorber for use in the present invention can be added after dissolving or dispersing it in a medium. In the case of having solubility in a medium, the compound of the present invention can be directly added. On the other hand, in the case of having no solubility, the compound may be dispersed in a fine particle manner and added.

A dispersion method using a polymerization product described in JP-B-51-39853 and JP-A-51-59943 may be also used.

In addition to the ultraviolet absorber, a dye (dyestuff or pigment) may be also used as long as it satisfies the above-described spectral characteristics. Examples of the dye framework that can be applied include an aryl or heteryl azo dye having a coupling component (hereinafter, referred to as a coupler) such as phenols, naphthols, anilines, heterocyclic rings (e.g., pyrazolone, pyridone) and open-chain active methylene compounds; an azomethine dye having a coupler such as open-chain active methylene compounds; a methine dye such as benzylidene dye and monomethineoxonol dye; a quinone-based dye such as naphthoquinone dye and anthraquinone dye. Other dyes include a yellow dye such as quinophthalone dye, nitro/nitroso dye, acridine dye and acridinone dye.

Phthalocyanines or porphyrins having large absorption called the Soret band in the ultraviolet region may be also preferably used.

Among these dyes, a quinophthalone dye and a phthalocyanine dye are more effective, and phthalocyanines are still more useful as a dye and also as a pigment. Preferred examples of the phthalocyanine pigment include C.I. Pigment Blue 15:4, C.I. Pigment Blue 15:6, C.I. Pigment Green 58, C.I. Pigment Green 36, and C.I. Pigment Green 7.

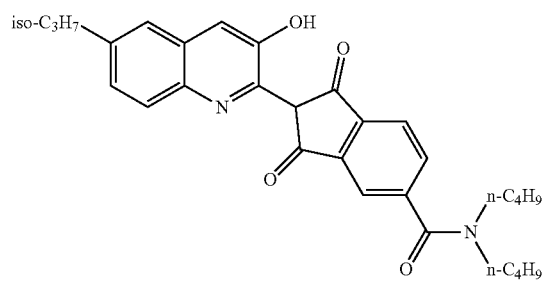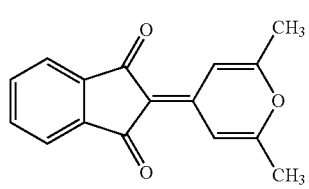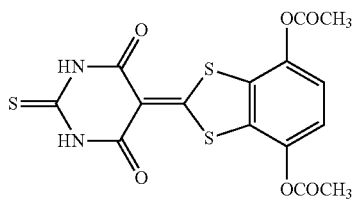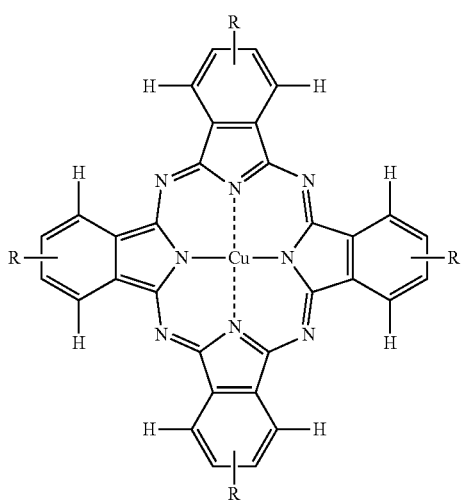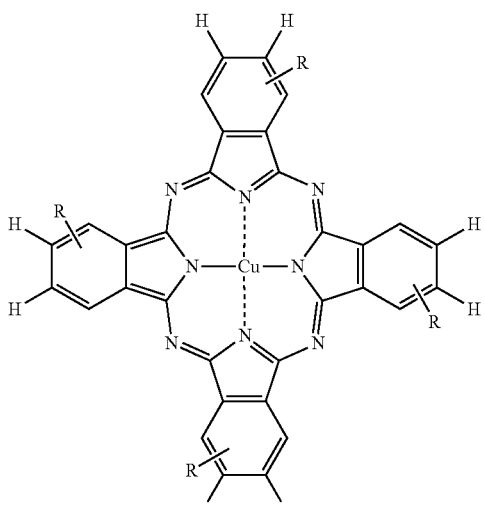

The content of the light absorber (D) is preferably from 0.005 to 5 mass %, more preferably from 0.01 to 3 mass %, still more preferably from 0.01 to 1 mass %, based on the entire solid content by mass of the polymerizable composition of the present invention.

[5] Alkali-Soluble Binder

The polymerizable composition of the present invention contains an alkali-soluble binder (alkali-soluble resin). Thanks to this binder, when exposure is performed to form a pattern in the film obtained from the polymerizable composition, the unexposed area can be removed with an alkali developer, and an excellent pattern can be formed by alkali development.

The alkali-soluble binder is not particularly limited as long as it is alkali-soluble, and an appropriate alkali-soluble binder may be selected according to the purpose, but examples thereof include a (meth)acrylic resin, a urethane-based resin, polyvinyl alcohol, polyvinylbutyral, polyvinylformal, polyamide and polyester. The alkali-soluble binder is preferably a (meth)acrylic resin or a urethane-based resin.

From the standpoint that the thermal cycle test resistance (TCT resistance) can be further enhanced, the alkali-soluble binder is more preferably a urethane-based resin.

The alkali-soluble binder preferably has an acid group.

Examples of the acid group include a carboxylic acid group, a sulfonic acid group, a phosphonic acid group, a phosphoric acid group and a sulfonamide group, and in view of availability of the raw material, a carboxylic acid group is preferred.

The alkali-soluble binder having an acid group is not particularly limited but is preferably a polymer obtained by using, as a monomer component, an acid group-containing polymerizable compound and from the standpoint of adjusting the acid value, a copolymer obtained by copolymerizing an acid group-containing polymerizable compound and an acid group-free polymerizable compound is more preferred.

The acid group-containing polymerizable compound is not particularly limited and may be appropriately selected according to the purpose, and examples thereof include acrylic acid, methacrylic acid, itaconic acid, crotonic acid, isocrotonic acid, maleic acid, and p-carboxylstyrene, with acrylic acid, methacrylic acid and p-carboxylstyrene being preferred. One of these compounds may be used alone, or two or more thereof may be used in combination.

The acid group-free polymerizable compound is not particularly limited, but preferred examples thereof include a (meth)acrylic acid ester (such as alkyl ester, aryl ester and aralkyl ester).

The alkyl group in the alkyl ester moiety of the (meth)acrylic acid ester may be linear or branched and is preferably an alkyl group having a carbon number of 1 to 10, more preferably an alkyl group having a carbon number of 1 to 6.

The aryl group in the aryl ester moiety of the (meth)acrylic acid ester is preferably an aryl group having a carbon number of 6 to 14, more preferably an aryl group having a carbon number of 6 to 10.

The aralkyl group in the aralkyl ester moiety of the (meth)acrylic acid ester is preferably an aralkyl group having a carbon number of 7 to 20, more preferably an aralkyl group having a carbon number of 7 to 12.

The molar ratio between a monomer corresponding to the acid group-containing polymerizable compound and a monomer corresponding to the acid group-free polymerizable compound is usually from 1:99 to 99:1, preferably from 30:70 to 99:1, more preferably from 50:50 to 99:1.

The content of the acid group in the alkali-soluble binder is not particularly limited but is preferably from 0.5 to 4.0 meq/g, more preferably from 1.0 to 3.0 meq/g. When the content is 0.5 meq/g or more, satisfactory alkali developability is obtained and an excellent pattern can be more unfailingly obtained. Also, when the content is 4.0 meq/g or less, the fear of impairing the strength of the permanent pattern can be reliably avoided.

The alkali-soluble binder preferably further has a crosslinking group, and this is preferred particularly in that both the curability of the exposed area and alkali developability of the unexposed area can be enhanced and a pattern having high durability is obtained (in particular, when higher durability is required of the solder resist, for example, when the wiring density of the metal wiring covered with a solder resist is high, the above-described effects are prominent). The crosslinking group as used herein indicates a group capable of crosslinking the binder polymer in the process of polymerization reaction brought about in the photosensitive layer when the photosensitive layer obtained from the polymerizable composition is exposed or heated. The crosslinking group is not particularly limited as long as it is a group having such a function, but examples of the functional group capable of undergoing an addition polymerization reaction include an ethylenically unsaturated bond group, an amino group and an epoxy group. The crosslinking group may be also a functional group capable of becoming a radical upon irradiation with light, and examples of such a crosslinking group include a thiol group and a halogen group. Above all, an ethylenically unsaturated bond group is preferred. The ethylenically unsaturated bond group is preferably a styryl group, a (meth)acryloyl group or an allyl group, and from the standpoint of satisfying both the stability of the crosslinking group before exposure and the strength of the permanent pattern, a (meth)acryloyl group is more preferred.

For example, a free radical (a polymerization initiating radical or a radical grown in the polymerization process of a polymerizable compound) is added to the crosslinking functional group of the alkali-soluble binder to cause addition polymerization between polymers directly or through a polymerization chain of the polymerizable compound, as a result, crosslinking is formed between polymer molecules and curing is thereby effected. Alternatively, an atom (for example, a hydrogen atom on the carbon atom adjacent to the functional crosslinkable group) in the polymer is withdrawn by a free radical to produce a polymer radical, and the polymer radicals combine with each other to form crosslinking between polymer molecules, thereby effecting curing.

The content of the crosslinkable group in the alkali-soluble binder is not particularly limited but is preferably from 0.5 to 3.0 meq/g, more preferably from 1.0 to 3.0 meq/g, still more preferably from 1.5 to 2.8 meq/g. When the content is 0.5 meq/g or more, the amount of curing reaction is sufficiently large and high sensitivity is obtained, and when 3.0 meq/g or less, storage stability of the polymerizable composition can be enhanced.

The content (meg/g) above can be measured, for example, by iodine value titration.

The alkali-soluble binder having a crosslinking group is described in detail in JP-A-2003-262958, and compounds described in this publication can be used also in the present invention.

The alkali-soluble binder having a crosslinking group is preferably an alkali-soluble binder having an acid group and a crosslinking group, and representative examples thereof are the followings:

(1) a urethane-modified polymerizable double bond-containing acrylic resin obtained by reacting a compound which has one unreacted isocyanate group allowed to remain after previously reacting an isocyanate group and an OH group and contains at least one (meth)acryloyl group, with a carboxyl group-containing acrylic resin;

(2) an unsaturated group-containing acrylic resin obtained by reacting a carboxyl group-containing acrylic resin with a compound having both an epoxy group and a polymerizable double bond within the molecule; and (3) a polymerizable double bond-containing acrylic resin obtained by reacting an OH group-containing acrylic resin with a dibasic acid anhydride having a polymerizable double bond.

Among these, the resins of (1) and (2) are preferred.

The alkali-soluble binder having an acid group and a crosslinking group also includes, for example, a polymer compound having an acidic group and an ethylenically unsaturated bond in the side chain and having a bisphenol A-type framework and a bisphenol F-type framework, a novolak resin having an acidic group and an ethylenically unsaturated bond, and a resol resin. These resins can be obtained by the technique described in paragraphs [0008] to [0027] of JP-A-11-240930.

As described above, the alkali-soluble binder is preferably a (meth)acrylic resin or a urethane-based resin, and the "(meth)acrylic resin" is preferably a copolymer having, as a polymerization component, a (meth)acrylic acid derivative such as (meth)acrylic acid, (meth)acrylic acid ester (e.g., alkyl ester, aryl eater, aralkyl ester), (meth)acrylamide and (meth)acrylamide derivative. The "urethane-based resin" is preferably a polymer produced by a condensation reaction between a compound having two or more isocyanate groups and a compound having two or more hydroxyl groups.

The (meth)acrylic resin is preferably, for example, a copolymer having an acid group-containing repeating unit. Preferred examples of the acid group include those described above. As the acid group-containing repeating unit, a (meth)acrylic acid-derived repeating unit or a repeating unit represented by the following formula (I) is preferably used.

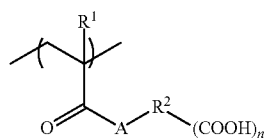

(In formula (I), $R^1$ represents a hydrogen atom or a methyl group, $R^2$ represents a single bond or an n+1-valent linking group, A represents an oxygen atom or $-NR^3-$, $R^3$ represents a hydrogen atom or a monovalent hydrocarbon group having a carbon number of 1 to 10, and n represents an integer of 1 to 5.)

The linking group represented by $R^2$ in formula (I) is preferably composed of one or more atoms selected from the group consisting of a hydrogen atom, a carbon atom, an oxygen atom, a nitrogen atom, a sulfur atom and a halogen atom, and the number of atoms constituting the linking groups represented by $R^2$ is preferably from 1 to 80. Specific examples of the linking group include an alkylene group and an arylene group, and the linking group may have a structure where a plurality of divalent linking groups described above are connected through any one of an amide bond, an ether bond, a urethane bond, a urea bond and an ester bond. $R^2$ is preferably a single bond, an alkylene group, or a structure where a plurality of alkylene groups are connected through at least one of an amide bond, an ether bond, a urethane bond, a urea bond and an ester bond.

The carbon number of the alkylene group is preferably from 1 to 5, more preferably from 1 to 3.

The carbon number of the arylene group is preferably from 6 to 14, more preferably from 6 to 10.

The alkylene group and arylene group may further have a substituent, and examples of the substituent include a monovalent nonmetallic atom group excluding hydrogen atom and include a halogen atom (—F, —Br, —Cl, —I), a hydroxyl group, a cyano group, an alkoxy group, an aryloxy group, a mercapto group, an alkylthio group, an arylthio group, an alkylcarbonyl group, an arylcarbonyl group, a carboxyl group and its conjugate base group, an alkoxycarbonyl group, an aryloxycarbonyl group, a carbamoyl group, an aryl group, an alkenyl group, and an alkynyl group.

The hydrocarbon group of $R^3$ preferably has a carbon number of 1 to 10, more preferably from 1 to 5, still more preferably from 1 to 3.

$R^3$ is most preferably a hydrogen atom or a methyl group.

n is preferably 1 to 3, more preferably 1 or 2, and most preferably 1.

The ratio (mol %) of the acid group-containing repeating unit occupying in all repeating unit components of the (meth) acrylic resin is, in view of developability, preferably from 10 to 90%, and in view of satisfying both developability and strength of the permanent pattern, the ratio is more preferably from 50 to 85%, still more preferably from 60 to 80%.

As already stated, the (meth)acrylic resin preferably further has a crosslinking group, and specific examples and content of the crosslinking group are the same as those described above.

The (meth)acrylic polymer for use in the present invention may contain, in addition to the acid group-containing polymerization unit and the crosslinking group-containing polymerization unit, a polymerization unit of (meth)acrylamide or a derivative thereof, a polymerization unit of α-hydroxymethyl acrylate, and a polymerization unit of styrene derivative. The alkyl group of the (meth)acrylic acid alkyl ester is preferably an alkyl group having a carbon number of 1 to 5 or an alkyl group with the above-described substituent having a carbon number of 2 to 8, more preferably a methyl group. Examples of the (meth)acrylic acid aralkyl ester include benzyl(meth)acrylate. Examples of the (meth)acrylamide derivative include N-isopropylacrylamide, N-phenylmethacrylamide, N-(4-methoxycarbonylphenyl)methacrylamide, N,N-dimethylacrylamide, and morpholinoacrylamide. Examples of the α-hydroxymethyl acrylate include ethyl α-hydroxymethylacrylate and cyclohexyl α-hydroxymethylacrylate. Examples of the styrene derivative include styrene and 4-tert-butylstyrene.

The "urethane-based resin" is preferably a urethane-based resin having, as a basic framework, a structural unit that is a reaction product of at least one diisocyanate compound represented by the following formula (1) and at least one diol compound represented by formula (2).

$$OCN-X-NCO \qquad (1)$$

$$HO-L^1-OH \qquad (2)$$

In formulae (1) and (2), each of X and $L^1$ independently represents a divalent organic residue.

At least one of the diisocyanate compound represented by formula (2) preferably contains an acid group. In this case, an alkali-soluble urethane-based resin having introduced thereinto an acid group can be suitably produced as a reaction product of the diisocyanate compound and the diol compound. According to such a method, an alkali-soluble urethane-based resin can be more easily produced than in the case of substituting or introducing an acid group on/into a desired side chain after the reaction and production of a urethane-based resin.

Out of at least either the diisocyanate compound represented by formula (1) or the diol compound represented by formula (2), at least one compound preferably has a crosslinking group. Examples of the crosslinking group include those described above. By containing a crosslinking group, an alkali-soluble urethane-based resin having introduced thereinto a crosslinking group can be suitably produced as a reaction product of the diisocyanate compound and the diol compound. According to such a method, a urethane-based resin having a crosslinking group can be more easily produced than in the case of substituting or introducing a crosslinking group on/into a desired side chain after the reaction and production of a urethane-based resin.

(1) Diisocyanate Compound

In formula (1), X is preferably a divalent aliphatic group, an aromatic hydrocarbon group, or a mixture thereof, and the carbon number thereof is preferably from 1 to 20, more preferably from 1 to 15. The divalent aliphatic or aromatic hydrocarbon group may further have a substituent incapable of reacting with the isocyanate group.

Specific examples of the diisocyanate compound represented by formula (1) include the followings:

that is, an aromatic diisocyanate compound such as 2,4-tolylene diisocyanate, dimerized 2,4-tolylene diisocyanate, 2,6-tolylene diisocyanate, p-xylylene diisocyanate, m-xylylene diisocyanate, 4,4'-diphenylmethane diisocyanate, 1,5-naphthylene diisocyanate, and 3,3'-dimethylbiphenyl-4,4'-diisocyanate; an aliphatic diisocyanate compound such as hexamethylene diisocyanate, trimethylhexamethylene diisocyanate, lysine diisocyanate, and dimer acid diisocyanate; an alicyclic diisocyanate compound such as isophorone diisocyanate, 4,4'-methylenebis(cyclohexylisocyanate), methylcyclohexane-2,4 (or 2,6)-diisocyanate, and 1,3-(isocyanatomethyl)cyclohexane; and a diisocyanate compound that is a reaction product of a diol with a diisocyanate, such as adduct of 1 mol of 1,3-butylene glycol and 2 mol of tolylene diisocyanate.

In the case where the diisocyanate compound represented by formula (1) has a crosslinking group, the diisocyanate compound includes, for example, a product obtained by an addition reaction of a triisocyanate compound with 1 equivalent of a monofunctional alcohol having a crosslinking group (e.g., ethylene unsaturated bond group) or a monofunctional amine compound. Specific examples of the triisocyanate compound, the crosslinking group-containing monofunctional alcohol, and the monofunctional amine compound include, but are not limited to, those described in paragraphs [0034], [0035] and [0037] to [0040] of Japanese Patent 4,401, 262.

Specific examples of the crosslinking group-containing diisocyanate compound include, but are not limited to, those described in paragraphs [0042] to [0049] of Japanese Patent 4,401,262.

(2) Diol Compound

The diol compound represented by formula (2) widely includes, for example, a polyether diol compounds, a polyester diol compound, and a polycarbonate diol compound. The polyether diol compound includes compounds represented by the following formulae (3), (4), (5) (6) and (7), and a random copolymer of hydroxyl group-terminated ethylene oxide and propylene oxide.

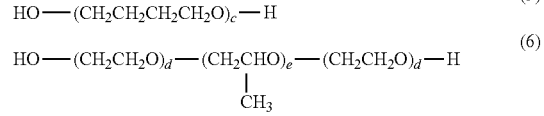

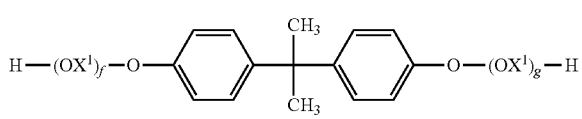

In formulae (3) to (7), $R^{14}$ represents a hydrogen atom or a methyl group, and $X^1$ represents a group shown below. Each of a, b, c, d, e, f, and g represents an integer of 2 or more and is preferably an integer of 2 to 100. Two d's may be the same or different. Also, two $X^1$s may be the same or different.

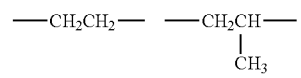

Specific examples of the polyether diol compounds represented by formulae (3) and (4) include the followings: that is, diethylene glycol, triethylene glycol, tetraethylene glycol, pentaethylene glycol, hexaethylene glycol, heptaethylene glycol, octaethylene glycol, di-1,2-propylene glycol, tri-1,2-propylene glycol, tetra-1,2-propylene glycol, hexa-1,2-propylene glycol, di-1,3-propylene glycol, tri-1,3-propylene glycol, tetra-1,3-propylene glycol, di-1,3-butylene glycol, tri-1,3-butylene glycol, hexa-1,3-butylene glycol, polyethylene glycol having a weight average molecular weight of 1,000, polyethylene glycol having a weight average molecular weight of 1,500, polyethylene glycol having a weight average molecular weight of 2,000, polyethylene glycol having a weight average molecular weight of 3,000, polyethylene glycol having a weight average molecular weight of 7,500, polypropylene glycol having a weight average molecular weight of 400, polypropylene glycol having a weight average molecular weight of 700, polypropylene glycol having a weight average molecular weight of 1,000, polypropylene glycol having a weight average molecular weight of 2,000, polypropylene glycol having a weight average molecular weight of 3,000, and polypropylene glycol having a weight average molecular weight of 4,000.

Specific examples of the polyether diol compound represented by formula (5) include the followings: that is, PTMG650, PTMG1000, PTMG2000 and PTMG3000 (trade names) produced by Sanyo Chemical Industries, Ltd.

Specific examples of the polyether diol compound represented by formula (6) include the followings: that is, NEWPOL PE-61, NEWPOL PE-62, NEWPOL PE-64, NEWPOL PE-68, NEWPOL PE-71, NEWPOL PE-74, NEWPOL PE-75, NEWPOL PE-78, NEWPOL PE-108, NEWPOL PE-128 and NEWPOL PE-61 (trade names) produced by Sanyo Chemical Industries, Ltd.

Specific examples of the polyether diol compound represented by formula (7) include the followings: that is, NEW- POL BPE-20, NEWPOL BPE-20F, NEWPOL BPE-20NK, NEWPOL BPE-20T, NEWPOL BPE-20G, NEWPOL BPE-40, NEWPOL BPE-60, NEWPOL BPE-100, NEWPOL BPE-180, NEWPOL BPE-2P, NEWPOL BPE-23P, NEWPOL BPE-3P and NEWPOL BPE-5P (trade names) produced by Sanyo Chemical Industries, Ltd.

Specific examples of the random copolymer of hydroxyl group-terminated ethylene oxide and propylene oxide include the followings:

that is, NEWPOL 50HB-100, NEWPOL 50HB-260, NEWPOL 50HB-400, NEWPOL 50HB-660, NEWPOL 50HB-2000 and NEWPOL 50HB-5100 (trade names) produced by Sanyo Chemical Industries, Ltd.

The polyester diol compound includes compounds represented by formulae (8) and (9):

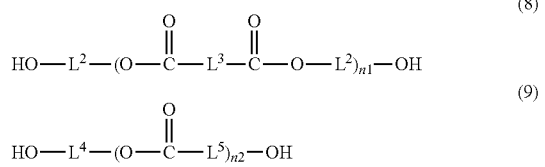

In formulae (8) and (9), each of $L^2$, $L^3$ and $L^4$ represents a divalent aliphatic or aromatic hydrocarbon group, and $L^5$ represents a divalent aliphatic hydrocarbon group. $L^2$, $L^3$ and $L^4$ may be the same or different. Each of $L^2$ to $L^4$ preferably represents an alkylene group, an alkenylene group, an alkynylene group or an arylene group, and $L^5$ preferably represents an alkylene group. Also, in $L^2$ to $L^5$, another bond or functional group incapable of reacting with the isocyanate group, such as ether bond, carbonyl bond, ester bond, cyano group, olefin bond, urethane bond, amide group, ureido group and halogen atom, may be present. Each of n1 and n2 represents an integer of 2 or more, preferably an integer of 2 to 100.

The polycarbonate diol compound includes a compound represented by formula (10).

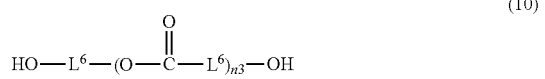

In formula (10), $L^6$s may be the same as or different from every others and each represents a divalent aliphatic or aromatic hydrocarbon group. $L^6$ preferably represents an alkylene group, an alkenylene group, an alkynylene group or an arylene group. Also, in $L^6$, another bond or functional group incapable of reacting with the isocyanate group, such as ether bond, carbonyl group, ester bond, cyano group, olefin bond, urethane bond, amide bond, ureido group and halogen atom, may be present. n3 represents an integer of 2 or more, preferably an integer of 2 to 100.

Specific examples of the diol compound represented by formula (8), (9) or (10) include (Compound No. 1) to (Compound No. 18) illustrated below. In specific examples, n represents an integer of 2 or more.

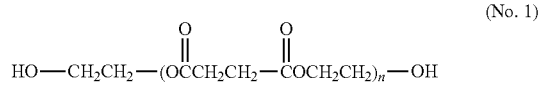

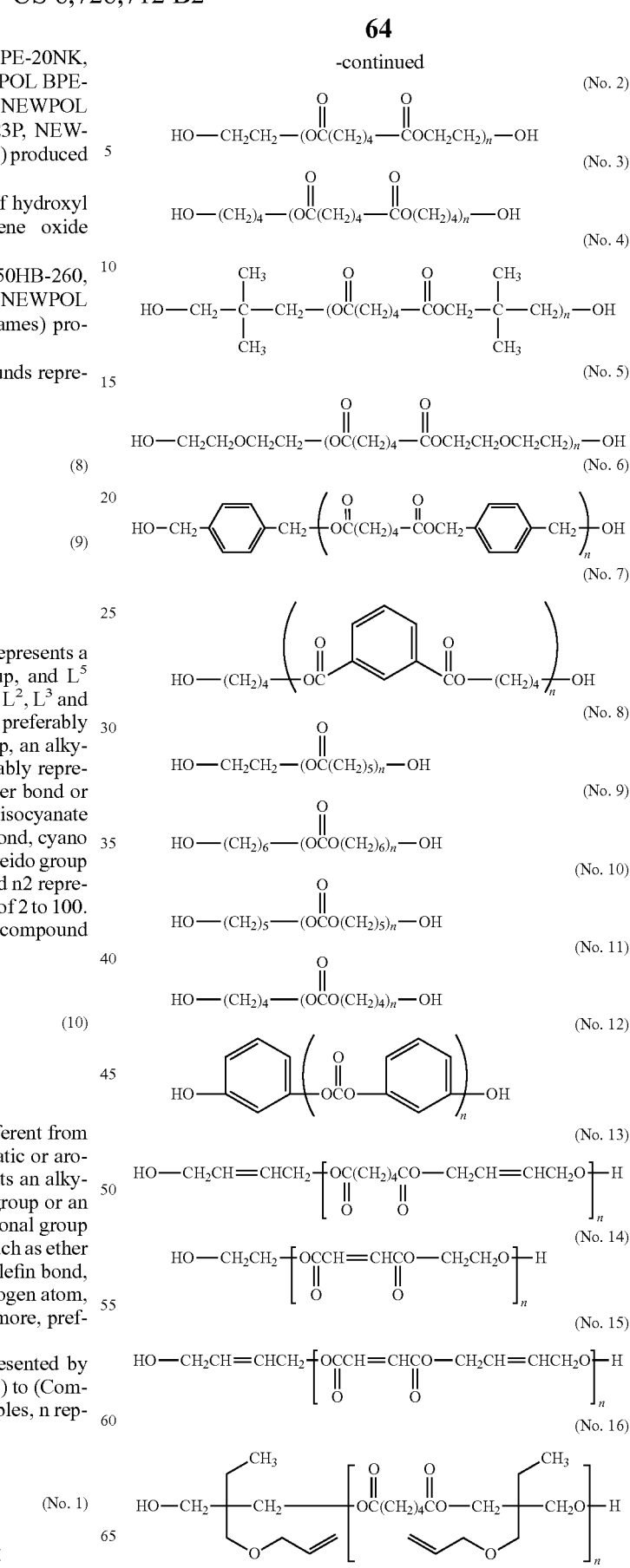

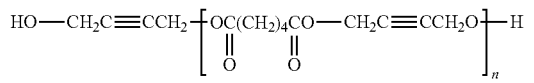
(No. 17)

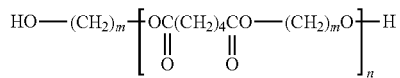
(No. 18)

m = 2, 4

In the synthesis of the urethane-based resin, other than the above-described diol compounds, a diol compound having a substituent incapable of reacting with the isocyanate group may be also used in combination. This diol compound includes, for example, the followings:

$$HO\text{-}L^7\text{-}O\text{—}CO\text{-}L^8\text{-}CO\text{—}O\text{-}L^7\text{-}OH \quad (11)$$

$$HO\text{-}L^8\text{-}CO\text{—}O\text{-}L^7\text{-}OH \quad (12)$$

In formulae (11) and (12), each of $L^7$ and $L^8$, which may be the same or different, represents a divalent aliphatic hydrocarbon group, an aromatic hydrocarbon group or a heterocyclic group. If desired, in $L^7$ and $L^8$, another bond or functional group incapable of reacting with the isocyanate group, such as carbonyl group, ester bond, urethane bond, amide bond and ureido group, may be present. Incidentally, $L^7$ and $L^8$ may form a ring.

The divalent aliphatic hydrocarbon group, aromatic hydrocarbon group and heterocyclic group may have a substituent, and examples of the substituent include an alkyl group, an aralkyl group, an aryl group, an alkoxy group, an aryloxy group, and a halogen atom such as —F, —Cl, —Br and —I.

At least one of the diol compound is preferably an acid group-containing diol compound as the above-described diol compound having a substituent incapable of reacting with the isocyanate group. Specific examples of the acid group include those described above, but the acid group is preferably a carboxylic acid. The diol compound having a carboxylic acid group includes, for example, those represented by the following formulae (13) to (15)

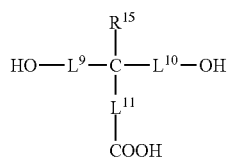
(13)

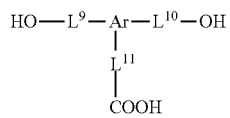
(14)

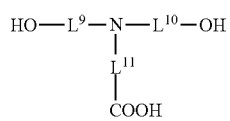
(15)

In formulae (13) to (15), $R^{15}$ represents a hydrogen atom, an alkyl group, an aralkyl group, an aryl group, an alkoxy group or an aryloxy group, preferably a hydrogen atom, an alkyl group having a carbon number 1 to 8, or an aryl group having a carbon number 6 to 15.

The alkyl group, aralkyl group, aryl group, alkoxy group and aryloxy group may have a substituent, and examples of the substituent include a cyano group, a nitro group, a halogen atom such as —F, —Cl, —Br and —I, —CONH$_2$, —COOR$^{16}$, —OR$^{16}$, —NHCONHR$^{16}$, —NHCOOR$^{16}$, —NHCOR$^{16}$, —OCONHR$^{16}$ (wherein $R^{16}$ represents an alkyl group having a carbon number of 1 to 10 or an aralkyl group having a carbon number of 7 to 15).

Each of $L^9$, $L^{10}$ and $L^{11}$, which may be the same or different, represents a single bond or a divalent aliphatic or aromatic hydrocarbon group, preferably an alkylene group having a carbon number of 1 to 20 or an arylene group having a carbon number of 6 to 15, more preferably an alkylene group having a carbon number of 1 to 8.

The divalent aliphatic or aromatic hydrocarbon group may have a substituent, and examples of the substituent include an alkyl group, an aralkyl group, an aryl group, an alkoxy group, and a halogen atom.

If desired, each of $L^9$ to $L^{11}$ may have a group containing another functional group incapable of reacting with the isocyanate group, such as carbonyl group, ester group, urethane group, amide group, ureido group and ether group. Incidentally, two or three members out of $R^{15}$, $L^7$, $L^8$ and $L^9$ may form a ring. Ar represents a trivalent aromatic hydrocarbon group which may have a substituent, and preferably represents an aromatic group having a carbon number of 6 to 15.

Specific examples of the carboxyl group-containing diol compounds represented by formulae (13) to (15) include the followings:

that is, 3,5-dihydroxybenzoic acid, 2,2-bis(hydroxymethyl)propionic acid, 2,2-bis(2-hydroxyethyl)propionic acid, 2,2-bis(3-hydroxypropyl)propionic acid, bis(hydroxymethyl)acetic acid, bis(4-hydroxyphenyl)acetic acid, 2,2-bis(hydroxymethyl)butyric acid, 4,4-bis(4-hydroxyphenyl)pentanoic acid, tartaric acid, N,N-dihydroxyethylglycine, and N,N-bis(2-hydroxyethyl)-3-carboxy-propionamide.

The presence of such a carboxyl group is preferred because characteristics such as hydrogen bonding property and alkali solubility can be imparted to the polyurethane resin.

In particular, a polyurethane resin having a carboxyl group in an amount of 0.5 to 4.0 meq/g, preferably from 1.0 to 3.0 meq/g, is preferred as the binder polymer for use in the present invention.

In the case where the diol compound represented by formula (2) has a crosslinking group, a method using an unsaturated group-containing diol compound as a raw material for the production of a polyurethane resin is also preferred. Such a diol compound may be, for example, a commercially available product such as trimethylolpropane monoallyl ether, or a compound easily produced by the reaction of a halogenated diol compound, a triol compound or an aminodiol compound with an unsaturated group-containing carboxylic acid, an acid chloride, an isocyanate, an alcohol, an amine, a thiol or an alkyl halide compound. Specific examples of the crosslinking group-containing diol compound include, but are not limited to, those described in paragraphs [0057] to [0066] of Japanese Patent 4,401,262.

Incidentally, the compounds illustrated as Compound Nos. 13 to 17 come under the diol compound represented by formula (8), (9) or (10) and at the same time, are a crosslinking group-containing diol compound.

In particular, a polyurethane resin having a crosslinking group (preferably an ethylenically unsaturated bond group) in an amount of 0.5 meq/g or more, preferably from 1.0 to 3.0 meq/g, is preferred as the binder polymer for use in the present invention.

In the synthesis of the urethane-based resin, other than these diols, a compound obtained by ring-opening a tetracarboxylic acid dianhydride represented by any one of the following formulae (16) to (18) with a diol compound may be used in combination.

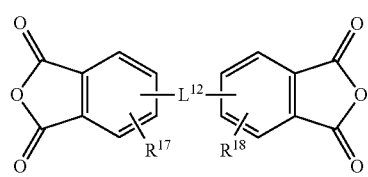

(16)

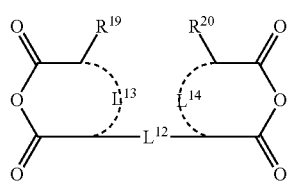

(17)

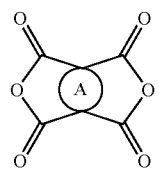

(18)

In formulae (16) to (18), $L^{12}$ represents a single bond, a divalent aliphatic or aromatic hydrocarbon group which may have a substituent (preferably, for example, an alkyl group, an aralkyl group, an aryl group, an alkoxy group, a halogeno group, an ester group or an amido group), —CO—, —SO—, —SO$_2$—, —O— or —S—, preferably a single bond, a divalent aliphatic hydrocarbon group having a carbon number of 1 to 15, —CO—, —SO$_2$—, —O— or —S—.

The divalent aliphatic or aromatic hydrocarbon group may have a substituent, and examples of the substituent include an alkyl group, an aralkyl group, an aryl group, an alkoxy group, a halogen atom, an ester bond-containing group (e.g., alkylcarbonyloxy group, alkyloxycarbonyl group, arylcarbonyloxy group, aryloxycarbonyl group), and an amido group.

Each of $R^{17}$ and $R^{18}$, which may be the same or different, represents a hydrogen atom, an alkyl group, an aralkyl group, an aryl group, an alkoxy group or a halogeno group, preferably a hydrogen atom, an alkyl group having a carbon number of 1 to 8, an aryl group having a carbon number of 6 to 15, an alkoxy group having a carbon number of 1 to 8, or a halogeno group.

Two members out of $L^{12}$, $R^{17}$ and $R^{18}$ may combine to form a ring.

Each of $R^{19}$ and $R^{20}$, which may be the same or different, represents a hydrogen atom, an alkyl group, an aralkyl group, an aryl group or a halogen group, preferably a hydrogen atom, an alkyl group having a carbon number of 1 to 8, or an aryl group having a carbon number of 6 to 15.

Two members out of $L^{12}$, $R^{19}$, and $R^{20}$ may combine to form a ring.

Each of $L^{13}$ and $L^{14}$, which may be the same or different, represents a single bond, a double bond or a divalent aliphatic hydrocarbon group, preferably a single bond, a double bond or a methylene group. A represents a mononuclear or polynuclear aromatic ring, preferably an aromatic ring having a carbon number of 6 to 18.

Specific examples of the compound represented by formula (16), (17) or (18) include the followings: that is, an aromatic tetracarboxylic dianhydride such as pyromellitic dianhydride, 3,3',4,4'-benzophenonetetracarboxylic dianhydride, 3,3',4,4'-diphenyltetracarboxylic dianhydride, 2,3,6,7-naphthalenetetracarboxylic dianhydride, 1,4,5,8-naphthalenetetracarboxylic dianhydride, 4,4'-sulfonyldiphthalic dianhydride, 2,2-bis(3,4-dicarboxyphenyl)propane dianhydride, bis(3,4-dicarboxyphenyl)ether dianhydride, 4,4'-[3,3'-(alkylphosphoryldiphenylene)-bis(iminocarbonyl)]diphthalic dianhydride, adduct of hydroquinone diacetate and trimellitic anhydride, and adduct of diacetyldiamine and trimellitic anhydride; an alicyclic tetracarboxylic dianhydride such as 5-(2,5-dioxotetrahydrofuryl)-3-methyl-3-cyclohexene-1,2-dicarboxylic anhydride (EPICLON B-4400, produced by DIC Corporation), 1,2,3,4-cyclopentanetetracarboxylic dianhydride, 1,2,4,5-cyclohexanetetracarboxylic dianhydride, and tetrahydrofurantetracarboxylic dianhydride; and an aliphatic tetracarboxylic dianhydride such as 1,2,3,4-butanetetracarboxylic dianhydride and 1,2,4,5-pentanetetracarboxylic dianhydride.

Examples of the method for introducing a compound obtained by ring-opening such a tetracarboxylic dianhydride with a diol compound into the polyurethane resin include the following methods:

a) a method of reacting a diisocyanate compound with an alcohol-terminated compound obtained by ring-opening the tetracarboxylic dianhydride with a diol compound, and b) a method of reacting the tetracarboxylic dianhydride with an alcohol-terminated urethane compound obtained by reacting a diisocyanate compound under diol compound-excess conditions.

Specific examples of the diol compound used for the ring-opening reaction include the followings:

that is, ethylene glycol, diethylene glycol, triethylene glycol, tetraethylene glycol, propylene glycol, dipropylene glycol, polyethylene glycol, polypropylene glycol, neopentyl glycol, 1,3-butylene glycol, 1,6-hexanediol, 2-butene-1,4-diol, 2,2,4-trimethyl-1,3-pentanediol, 1,4-bis-β-hydroxyethoxycyclohexane, cyclohexanedimethanol, tricyclodecanedimethanol, hydrogenated bisphenol A, hydrogenated bisphenol F, an ethylene oxide adduct of bisphenol A, a propylene oxide adduct of bisphenol A, an ethylene oxide adduct of bisphenol F, a propylene oxide adduct of bisphenol F, an ethylene oxide adduct of hydrogenated bisphenol A, a propylene oxide adduct of hydrogenated bisphenol A, hydroquinonedihydroxyethyl ether, p-xylylene glycol, dihydroxyethylsulfone, bis(2-hydroxyethyl)-2,4-tolylene dicarbamate, 2,4-tolylene-bis(2-hydroxyethylcarbamide), bis(2-hydroxyethyl)-m-xylylene dicarbamate, and bis(2-hydroxyethyl)isophthalate.

The urethane-based resin described above is synthesized by adding those diisocyanate and diol compounds and a known catalyst having an activity according to the reactivity of respective compounds in an aprotic solvent and heating the solution. The molar ratio ($M_a$:$M_b$) of the diisocyanate and diol compounds used for the synthesis is preferably from 1:1 to 1.2:1. A product having desired physical properties such as molecular weight and viscosity is preferably synthesized finally in the form of allowing no isocyanate group to remain by applying a treatment with alcohols or amines.

A urethane-based resin having a crosslinking group (for example, an unsaturated group) in the polymer terminal and main chain is also preferably used. By having a crosslinking group in the polymer terminal and main chain, the crosslinking reactivity is more enhanced between the polymerizable compound and the urethane-based resin or between urethane-based resins, and the strength of the permanent pattern is increased. In view of easy occurrence of a crosslinking reaction, the unsaturated group preferably contains a carbon-carbon double bond.

The method for introducing a crosslinking group into the polymer terminal includes the following method. That is, in the step of treating the residual isocyanate group at the polymer terminal with alcohols, amines or the like in the process of synthesizing the polyurethane resin, alcohols, amines or the like having a crosslinking group may be used. Specific examples of such a compound include the same compounds as those exemplified above for the monofunctional alcohol or monofunctional amine compound having a crosslinking group.

Incidentally, the crosslinking group is preferably introduced into the polymer side chain rather than into the polymer terminal, because the amount of the crosslinking group introduced can be easily controlled and can be increased and also, the crosslinking reaction efficiency is enhanced.

The method for introducing a crosslinking group into the main chain includes a method of using a diol compound having an unsaturated group in the main chain direction for the synthesis of the polyurethane resin. Specific examples of the diol compound having an unsaturated group in the main chain direction include the following compounds: that is, cis-2-butene-1,4-diol, trans-2-butene-1,4-diol, and polybutadiene diol.

As the alkali-soluble binder other than the (meth)acrylic resin and the urethane-based resin, an acetal-modified polyvinyl alcohol-based binder polymer having an acid group described, for example, in European Patents 993,966 and 1,204,000 and JP-A-2001-318463 is preferred because of excellent balance between film strength and developability. In addition, a water-soluble linear organic polymer such as polyvinylpyrrolidone and polyethylene oxide is useful. Also, an alcohol-soluble nylon, a polyether of 2,2-bis-(4-hydroxyphenyl)-propane and epichlorohydrin, and the like are useful for increasing the strength of the cured film.

Above all, a [benzyl(meth)acrylate/(meth)acrylic acid/if desired, another addition-polymerizable vinyl monomer] copolymer, and a [allyl(meth)acrylate/(meth)acrylic acid/if desired, another addition-polymerizable vinyl monomer] copolymer are preferred because of excellent balance among film strength, sensitivity and developability.

The weight average molecular weight of the binder polymer which can be used in the polymerizable composition of the present invention is preferably 3,000 or more, more preferably from 5,000 to 300,000, and most preferably from 10,000 to 30,000, and the number average molecular weight is preferably 1,000 or more, more preferably from 2,000 to 250,000. The polydispersity (weight average molecular weight/number average molecular weight) is preferably 1 or more, more preferably from 1.1 to 10.

The binder polymer may be any of a random polymer, a block polymer, a graft polymer and the like.

The alkali-soluble binder can be synthesized by a conventionally known method. Examples of the solvent used at the synthesis include tetrahydrofuran, ethylene dichloride, cyclohexanone, propylene glycol monomethyl ether, propylene glycol monomethyl ether acetate, and butyl acetate. One of these solvents may be used alone, or two o more thereof may be mixed and used.

The content of the alkali-soluble binder is preferably from 5 to 80 mass %, more preferably from 30 to 60 mass %, based on the entire solid content by mass of the polymerizable composition of the present invention. With a content in this range, the exposure sensitivity is good, the processing time can be short, and good TCT resistance is obtained.

[6] Infrared-Blocking Material Other than Tungsten Compound and Metal Boride

The polymerizable composition of the present invention may contain an infrared-blocking material other than a tungsten compound and a metal boride (hereinafter, sometimes referred to as "the other infrared-blocking material") within the range not impairing the effects of the present invention. The other infrared-blocking material is preferably a compound having absorption at a wavelength of 800 to 1,200 nm and exhibiting good transparency to light used for exposure, and from such viewpoints, the other infrared-blocking material is preferably selected from infrared-absorbing dyestuffs and infrared-absorbent inorganic pigments.

Examples of the infrared-absorbing dyestuff include a cyanine dye, a phthalocyanine dye, a naphthalocyanine dye, an immonium dye, an aminium dye, a quinolium dye, a pyrylium dye, and a metal complex dye such as Ni complex dye.

The dye usable as the infrared-blocking material is also available as a commercial product, and preferred examples thereof include the following commercially available dyes:

S0345, S0389, S0450, S0253, S0322, S0585, S0402, S0337, S0391, S0094, S0325, S0260, S0229, S0447, S0378, S0306 and S0484 produced by FEW Chemicals;

ADS795WS, ADS805WS, ADS819WS, ADS820WS, ADS823WS, ADS830WS, ADS850WS, ADS845MC, ADS870MC, ADS880MC, ADS890MC, ADS920MC, ADS990MC, ADS805PI, ADSW805PP, ADS810CO, ADS813MT, ADS815EI, ADS816EI, ADS818HT, ADS819MT, ADS821NH, ADS822MT, ADS838MT, ADS840MT, ADS905AM, ADS956BP, ADS1040P, ADS1040T, ADS1045P, ADS1040P, ADS1050P, ADS1065A, ADS1065P, ADS1100T and ADS1120F produced by American Dye Source, Inc.;

YKR-4010, YKR-3030, YKR-3070, MIR-327, MIR-371, SIR-159, PA-1005, MIR-369, MIR-379, SIR-128, PA-1006, YKR-2080, MIR-370, YKR-3040, YKR-3081, SIR-130, MIR-362, YKR-3080, SIR-132 and PA-1001 produced by Yamamoto Chemical Industry Co., Ltd.; and NK-123, NK-124, NK-1144, NK-2204, NK-2268, NK-3027, NKX-113, NKX-1199, NK-2674, NK-3508, NKX-114, NK-2545, NK-3555, NK-3509 and NK-3519 produced by Hayashibara Biochemical Labs, Inc.

Among these dyes, in view of heat resistance, a phthalocyanine dye and a metal complex dye are preferred.

One of these dyes may be used alone, or for the purpose of bringing out good light-blocking effect at a wavelength of 800 to 1,200 nm, two or more dyes according to this purpose may be mixed and used.

Examples of the infrared-absorbent inorganic pigment which can be used as the other infrared-blocking material include zinc flower, lead white, lithopone, titanium oxide, chromium oxide, precipitating barium sulfate, barite powder, red lead, iron oxide red, lead yellow, zinc yellow (type 1 zinc yellow, type 2 zinc yellow), ultramarine blue, Prussian blue (iron/potassium ferrocyanide), zircon grey, praseodymium yellow, chrome-titanium yellow, chrome green, peacock blue, Victoria green, iron blue (irrelevant to Prussian blue), vanadium-zirconium blue, chrome-tin pink, manganese pink and salmon pink. Furthermore, as a black pigment, for example, a metal oxide, a metal nitride or a mixture thereof each containing one metal element or two or more metal elements selected from the group consisting of Co, Cr, Cu, Mn, Ru, Fe, Ni, Sn, Ti and Ag, may be used.

The black pigment is preferably titanium black that is a titanium nitride-containing black pigment, because shielding property in the infrared region at a wavelength of 800 to 1,200 nm is good.

Titanium black can be obtained by a conventionally known method, and as the commercially available product, titanium black produced, for example, by Ishihara Sangyo Kaisha, Ltd., Ako Kasei Co., Ltd., JEMCO Inc., Mitsubishi Materials Corp., or Mitsubishi Materials Electronic Chemicals Co., Ltd. may be used.

Titanium black indicates a black particle having a titanium atom, and low-order titanium oxide, titanium oxynitride or the like is preferred. As the titanium black particle, a surface-modified particle may be used, if desired, for the purpose of improving dispersibility, preventing aggregation, or the like.

The surface modification method includes a method of covering the surface with one or more members selected from silicon oxide, titanium oxide, germanium oxide, aluminum oxide, magnesium oxide, and zirconium oxide. Also, the surface may be treated with a water-repellent substance described in paragraphs [0010] to [0027] of JP-A-2007-302836.

Examples of the method for producing titanium black include, but are not limited to, a method of reducing a mixture of titanium dioxide and metal titanium by heating it in a reductive atmosphere (JP-A-49-5432); a method of reducing ultrafine titanium dioxide obtained by high-temperature hydrolysis of titanium tetrachloride, in a reductive atmosphere containing hydrogen (JP-A-57-205322); a method of reducing titanium dioxide or titanium hydroxide at high temperature in the presence of ammonia (JP-A-60-65069, JP-A-61-201610); and a method of attaching a vanadium compound to titanium dioxide or titanium hydroxide and then reducing it at high temperature in the presence of ammonia (JP-A-61-201610).

The particle diameter of the titanium black particle is not particularly limited but in view of dispersibility and colorability, the particle diameter is preferably from 3 to 2,000 nm, more preferably from 10 to 500 nm.

The specific surface area of titanium black is not particularly limited, but usually, the value measured by the BET method is preferably on the order of 5 to 150 m$^2$/g, more preferably on the order of 20 to 100 m$^2$/g, because titanium black after surface treatment with a water-repellent agent can have a predetermined performance in terms of water repellency.

With respect to the particle diameter of the inorganic pigment used as the other infrared-blocking material, the average particle diameter is preferably from 3 nm to 0.01 mm, and in view of dispersibility, light-blocking effect and precipitation with aging, the average particle diameter is preferably from 10 nm to 1 μM.

The polymerizable composition may or may not contain the other infrared-blocking material but in the case of containing the other infrared-blocking material, the content thereof is preferably from 5 to 75 mass %, more preferably from 10 to 40 mass %, based on the mass of the compound (C).

[7] Dispersant

In the present invention, when the compound (C) is particularly a fine particle (that is, when the tungsten compound is particularly a tungsten fine particle, or when the metal boride is particularly a metal boride fine particle), the fine particle may be dispersed using a known dispersant for the purpose of enhancing the dispersibility and dispersion stability of the compound (C) in the polymerizable composition.

As the dispersant, for example, a known dispersant or surfactant may be appropriately selected and used.

Specifically, many kinds of compounds are usable, and examples thereof include a cationic surfactant such as Organosiloxane Polymer KP341 (produced by Shin-Etsu Chemical Co.), (meth)acrylic acid-based (co)polymer Polyflow No. 75, No. 90 and No. 95 (produced by Kyoeisha Chemical Co., Ltd.), and W001 (produced by Yusho Co., Ltd.); a nonionic surfactant such as polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid ester; an anionic surfactant such as W004, W005 and W017 (produced by Yusho Co., Ltd.); a polymer dispersant such as EFKA-46, EFKA-47, EFKA-47EA, EFKA POLYMER 100, EFKA POLYMER 400, EFKA POLYMER 401, EFKA POLYMER 450 (all produced by Ciba Specialty Chemicals), DISPERSE AID 6, DISPERSE AID 8, DISPERSE AID 15, and DISPERSE AID 9100 (all produced by SAN NOPCO LTD.); various Solsperse dispersants such as SOLSPERSE 3000, 5000, 9000, 12000, 13240, 13940, 17000, 24000, 26000, 28000, 32000 and 36000 (produced by The Lubrizol Corporation); ADEKA PLURONIC L31, F38, L42, L44, L61, L64, F68, L72, P95, F77, P84, F87, P94, L101, P103, F108, L121 and P-123 (produced by ADEKA), ISONET S-20 (produced by Sanyo Chemical Industries, Ltd.), and Disperbyk 101, 103, 106, 108, 109, 111, 112, 116, 130, 140, 142, 162, 163, 164, 166, 167, 170, 171, 174, 176, 180, 182, 2000, 2001, 2050 and 2150 (produced by BYK Chemie Japan). Other examples include an oligomer or polymer having a polar group in the molecular terminal or side chain, such as acrylic copolymer.

In view of dispersibility, developability, precipitation, the following resins described in JP-A-2010-106268 are preferred, and particularly in view of dispersibility, a polymer dispersant having a polyester chain in the side chain is preferred. Also, in view of dispersibility and resolution of a pattern formed by photolithography, a resin having an acid group and a polyester chain is preferred. As the acid group in the dispersant, in view of adsorptive property, an acid group with pKa of 6 or less is preferred, and a carboxylic acid, a sulfonic acid or a phosphoric acid is more preferred.

The dispersant resin described in JP-A-2010-106268, which is preferably used in the present invention, is described below.

The dispersant resin is preferably a graft copolymer containing, in the molecule, a graft chain having a number of atoms, excluding hydrogen atom, of 40 to 10,000 and being selected from a polyester structure, a polyether structure and a polyacrylate structure, which is a graft copolymer containing a structural unit represented by any one of the following formulae (1) to (5).

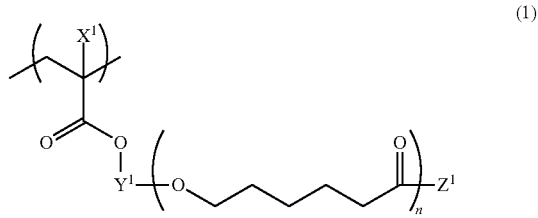

(1)

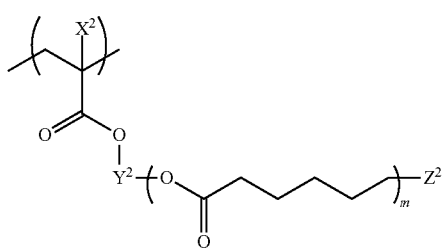

(2)

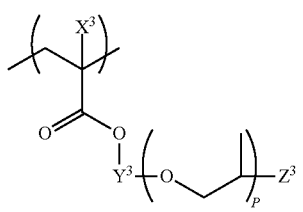

(3)

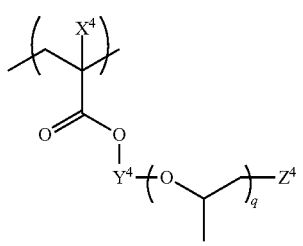

(4)

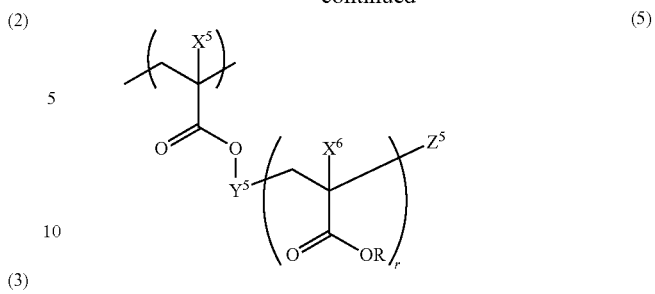

(5)

[In Formulae (1) to (5), each of $X^1$, $X^2$, $X^3$, $X^4$, $X^5$ and $X^6$ independently represents a hydrogen atom or a monovalent organic group, each of $Y^1$, $Y^2$, $Y^3$, $Y^4$ and $Y^5$ independently represents a divalent linking group, each of $Z^1$, $Z^2$, $Z^3$, $Z^4$ and $Z^5$ independently represents a hydrogen atom or a monovalent organic group, R represents a hydrogen atom or a monovalent organic group, R's differing in the structure may be present in the copolymer, and each of n, m, p, q and r represents an integer of 1 to 500.]

Specific examples thereof include the compounds illustrated below. In the compounds illustrated below, the numerical value attached to each structural unit (numerical value attached to the main-chain repeating unit) indicates the content [mass %; shown as (wt %)] of the structural unit. The numerical value attached to the side-chain repeating moiety indicates the repetition number of the repeating moiety.

(Exemplefied Compound 1)

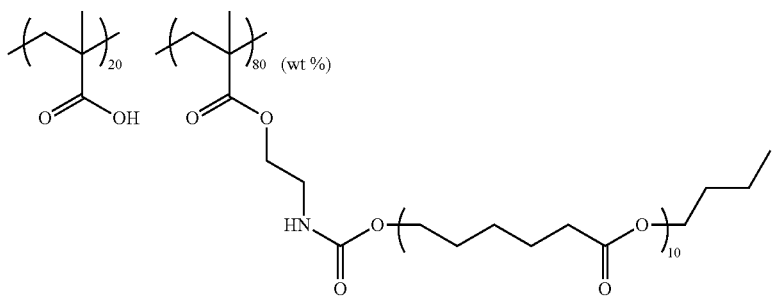

(Exemplefied Compound 2)

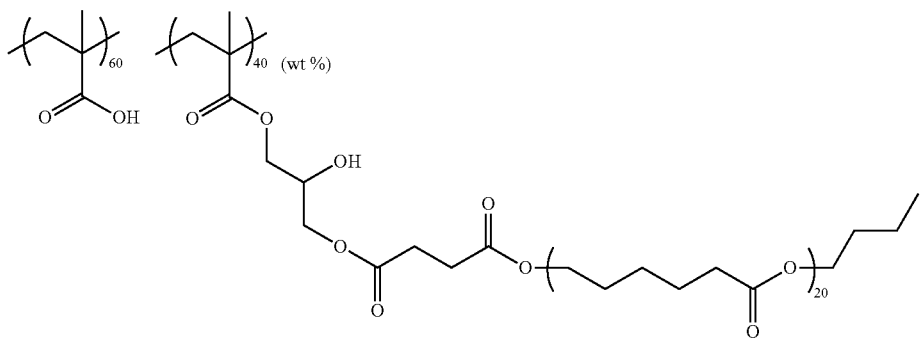

-continued
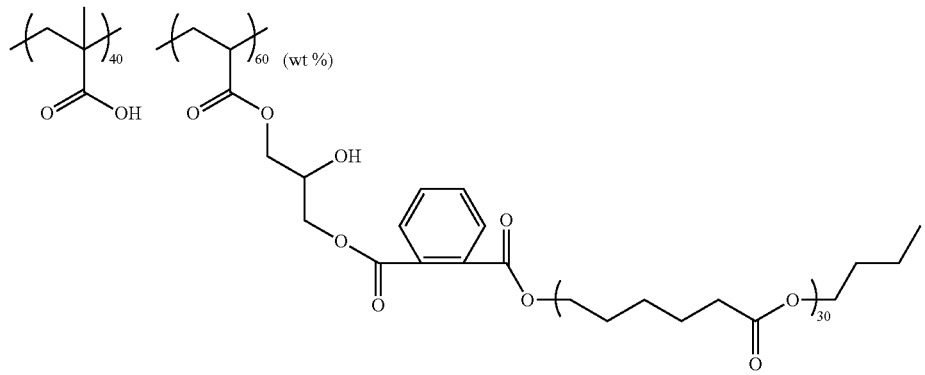
(Exemplefied Compound 3)
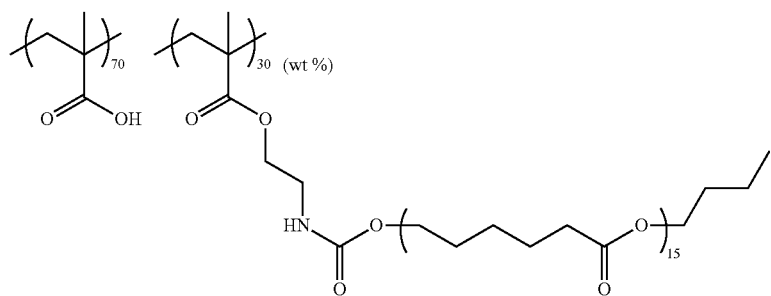
(Exemplefied Compound 4)
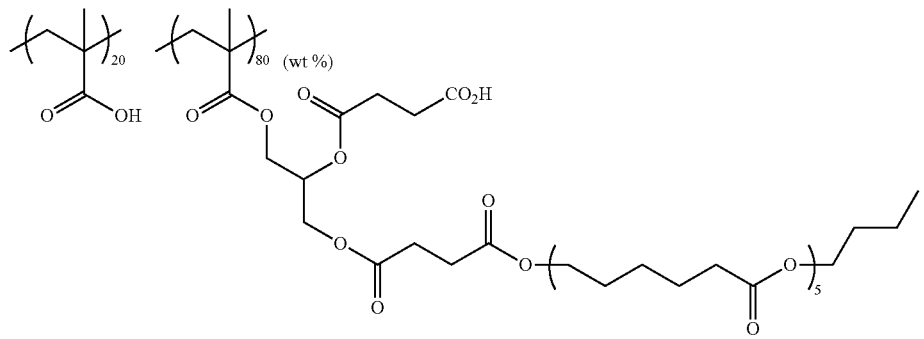
(Exemplefied Compound 5)
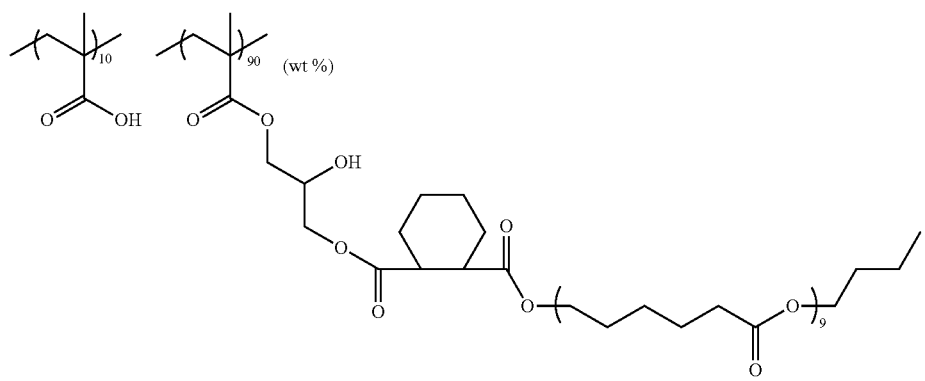
(Exemplefied Compound 6)

(Exemplified Compound 7)
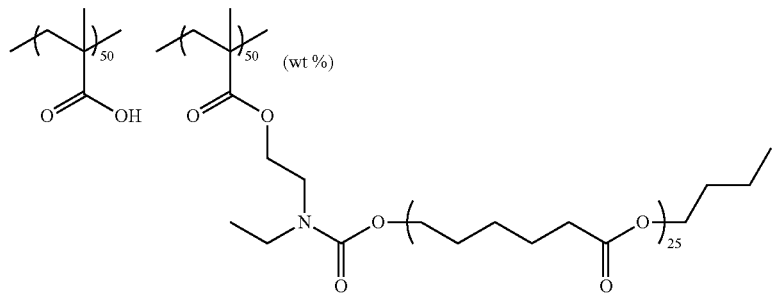
(Exemplified Compound 8)
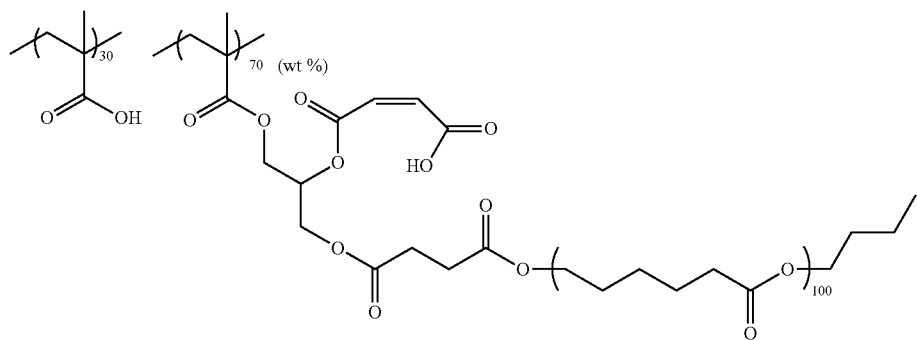
(Exemplified Compound 9)
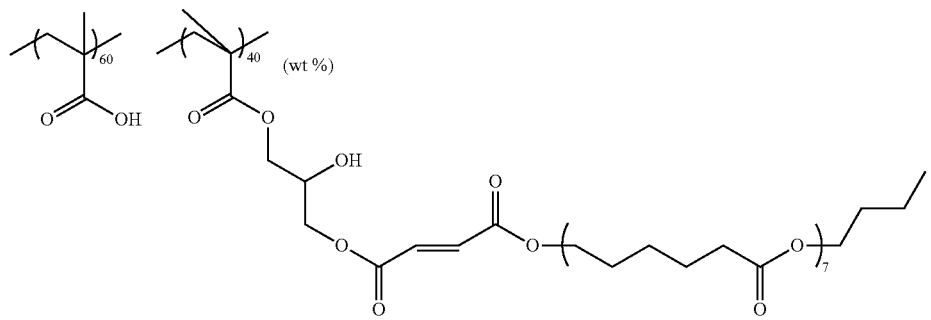
(Exemplified Compound 10)
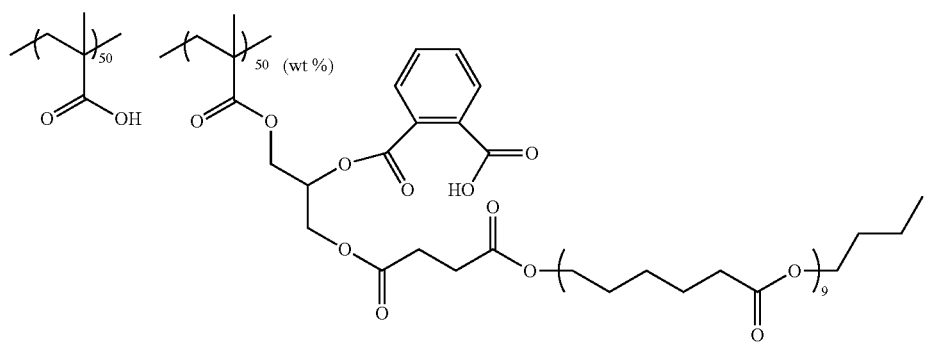

(Exemplefied Compound 11)
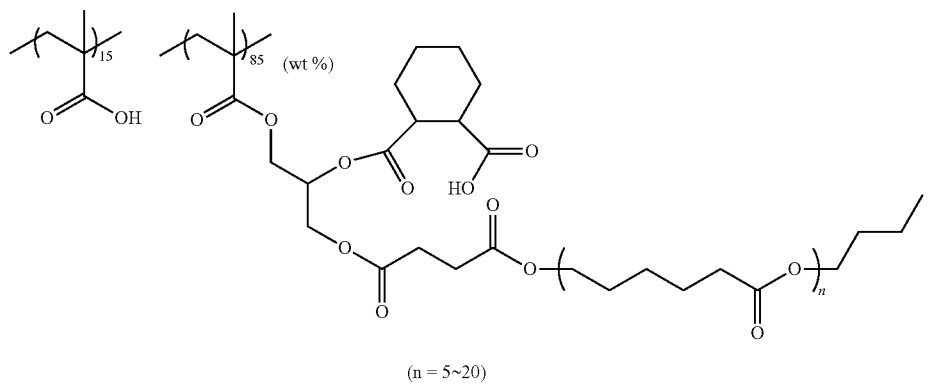
(n = 5~20)
(Exemplefied Compound 12)
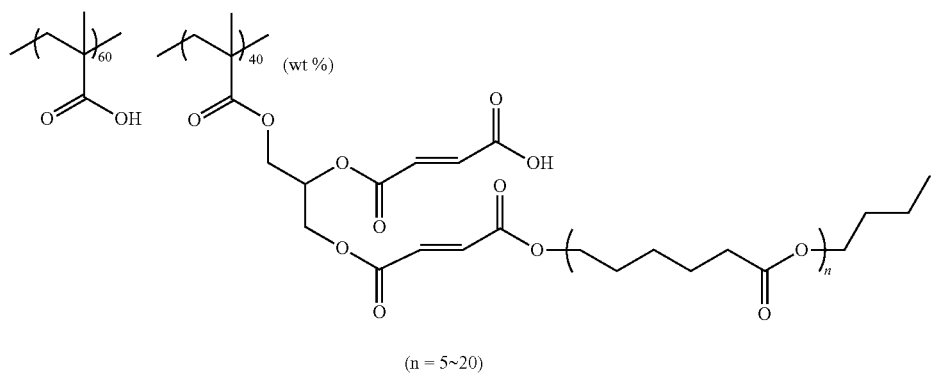
(n = 5~20)
(Exemplefied Compound 13)
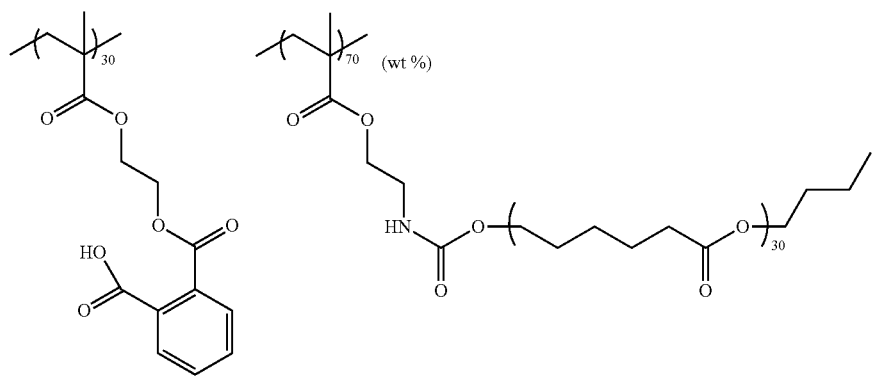
(Exemplefied Compound 14)
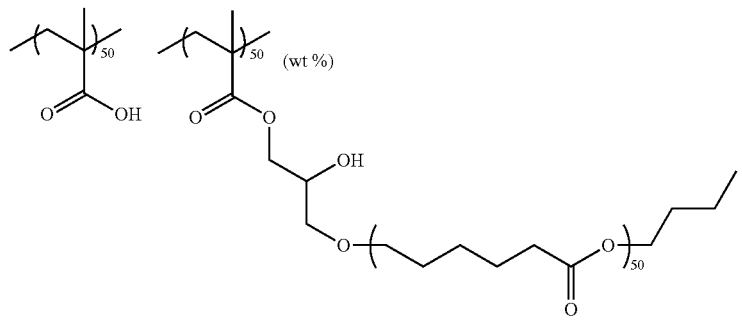

(Exmplefied Compound 15)
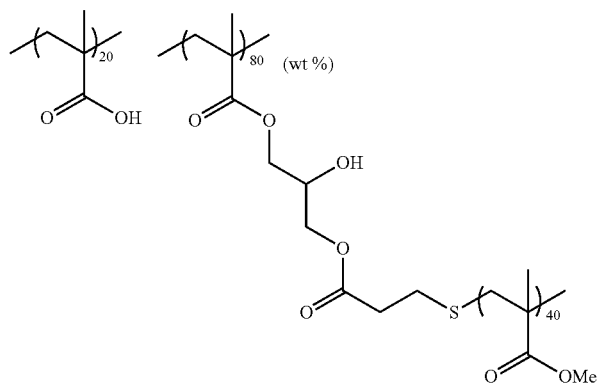
(Exemplefied Compound 16)
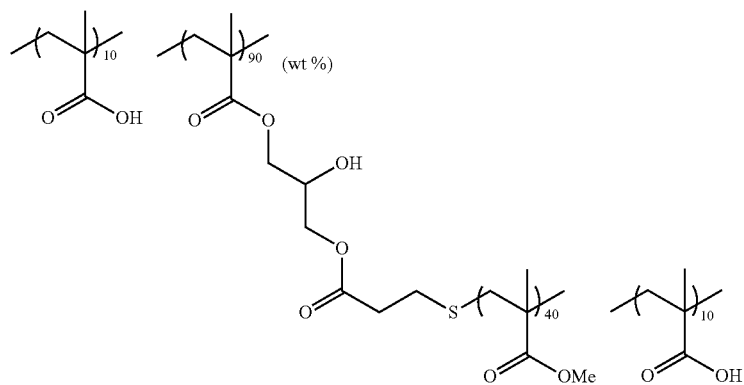
(Exemplefied Compound 20)
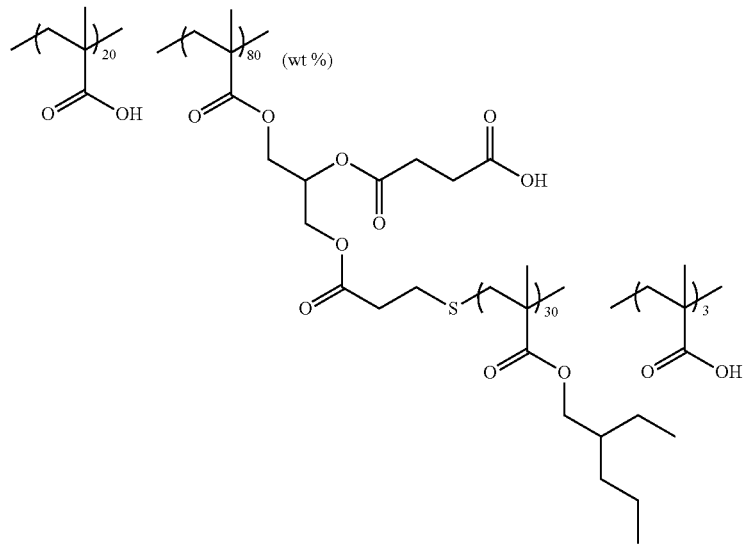

-continued
(Exemplified Compound 21)
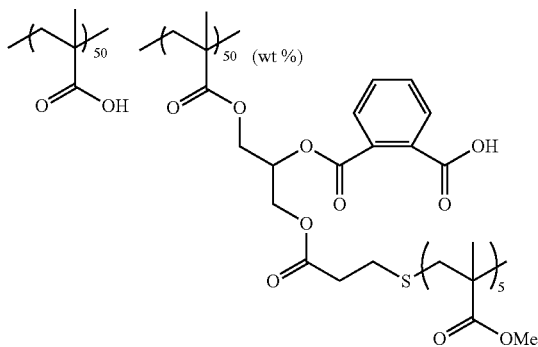
(Exemplified Compound 22)
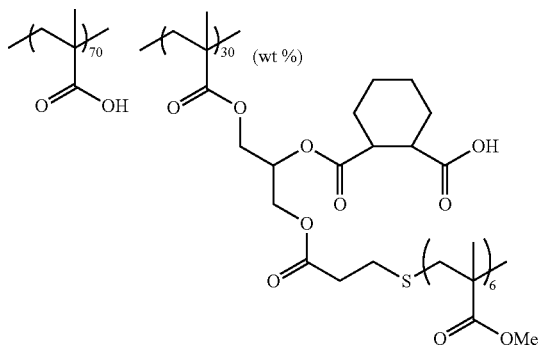
(Exemplified Compound 23)
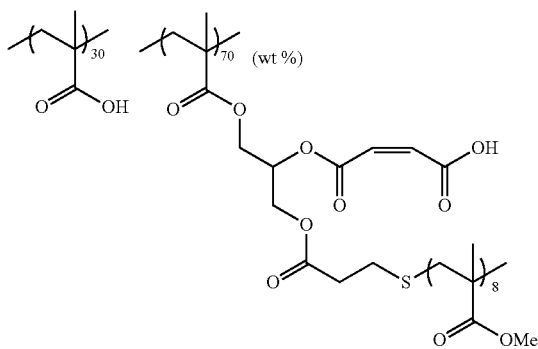
(Exemplified Compound 24)
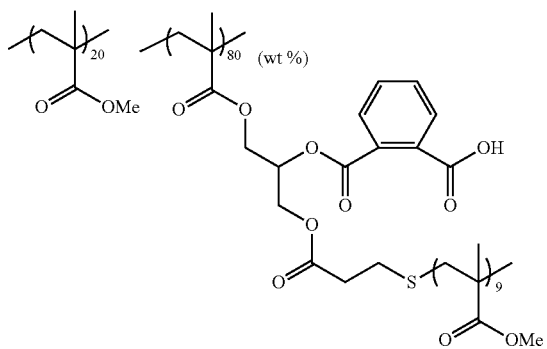
(Exemplified Compound 25)
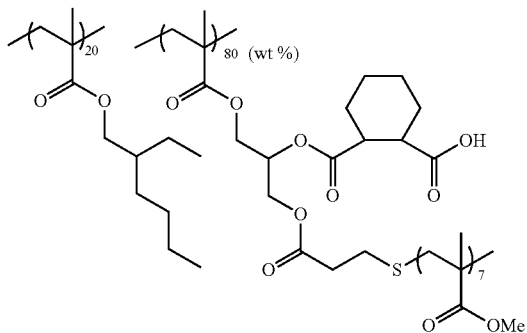
(Exemplified Compound 26)
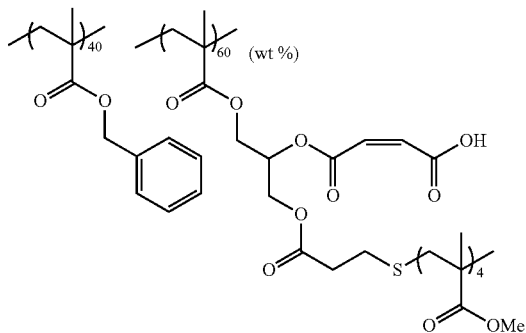
(Exemplified Compound 27)
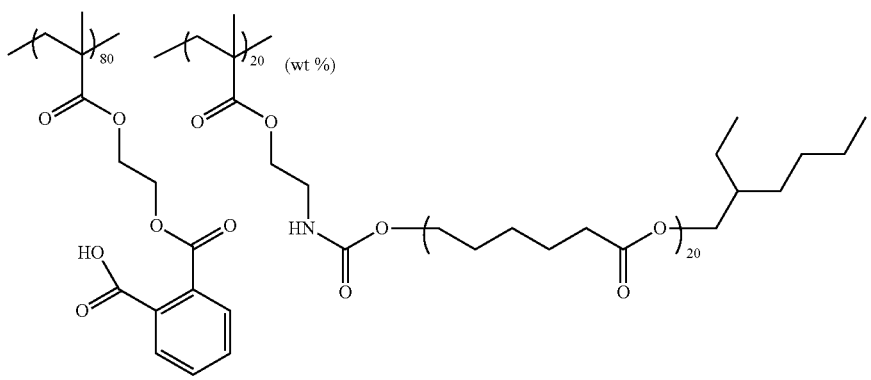

(Exemplified Compound 28)
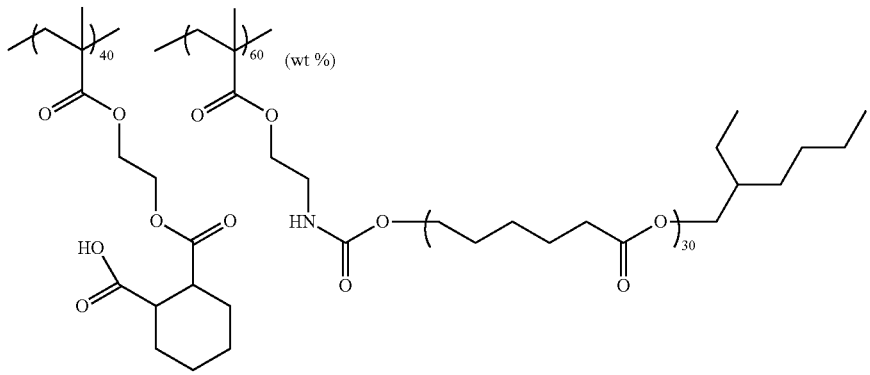
(Exemplified Compound 29)
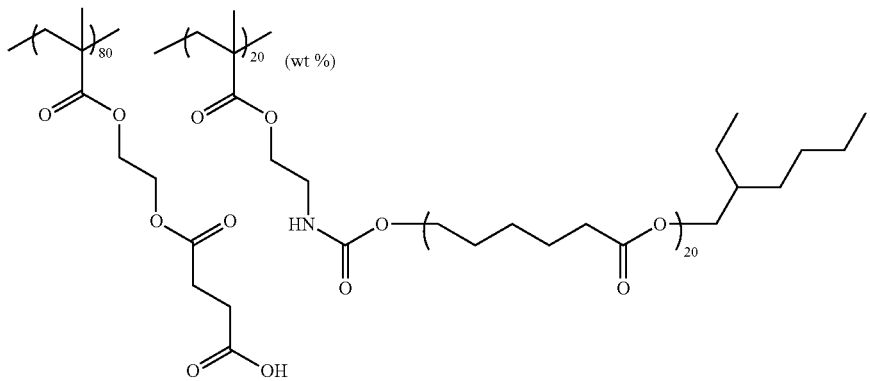
(Exemplified Compound 30)
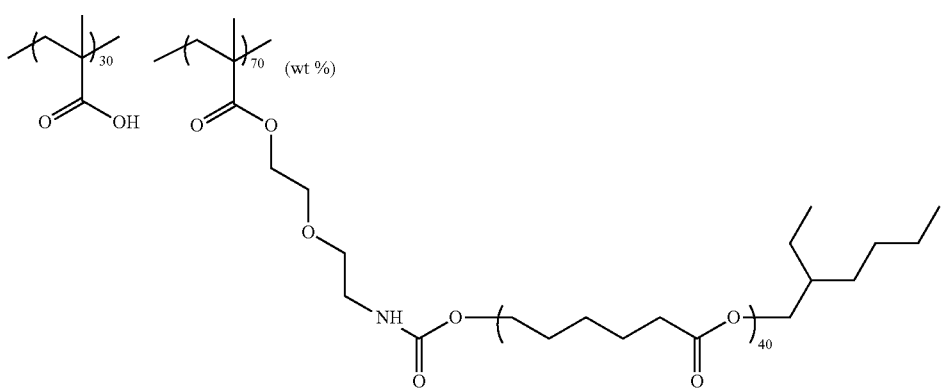
(Exemplified Compound 31)
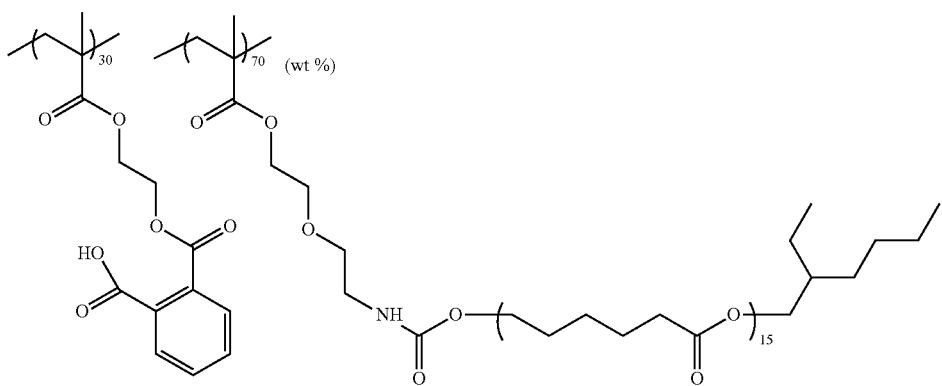

-continued
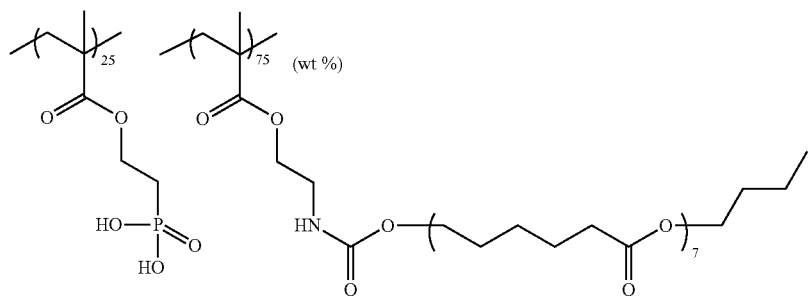
(Exemplified Compound 32)
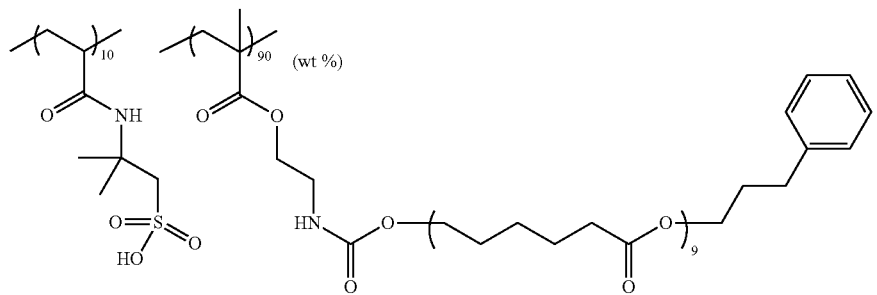
(Exemplified Compound 33)
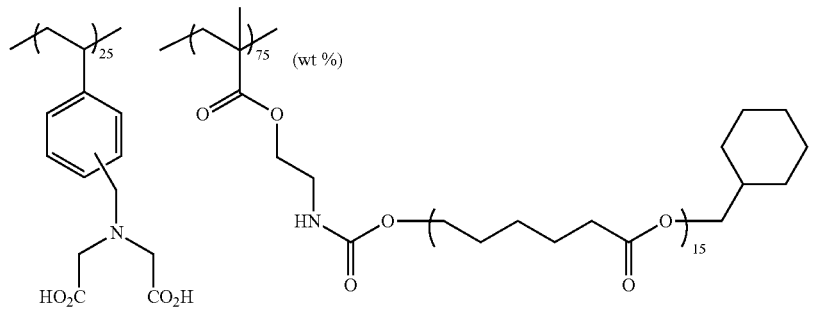
(Exemplified Compound 34)
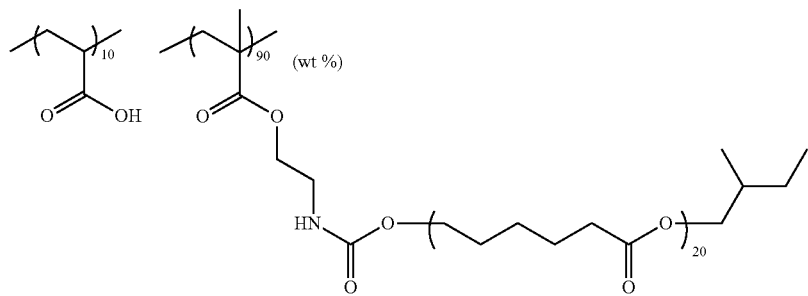
(Exemplified Compound 35)
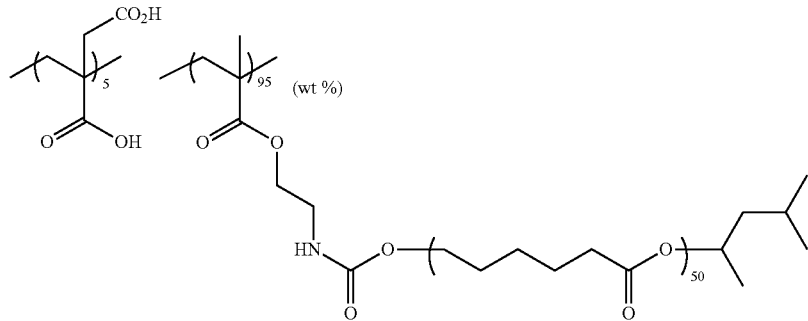
(Exemplified Compound 36)

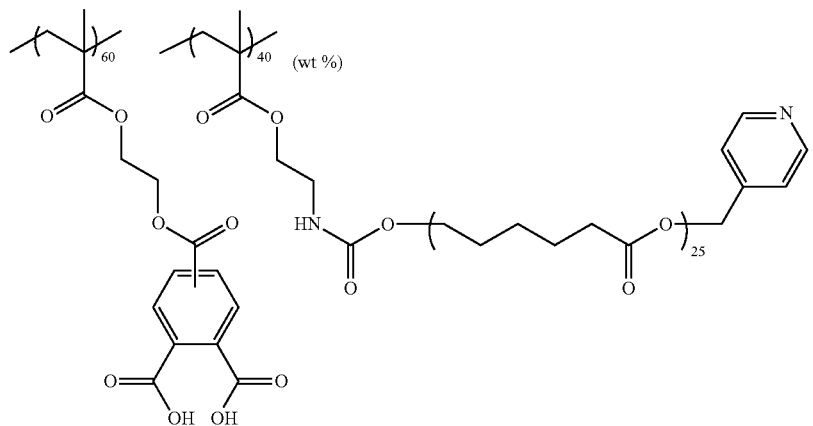
(Exemplified Compound 37)
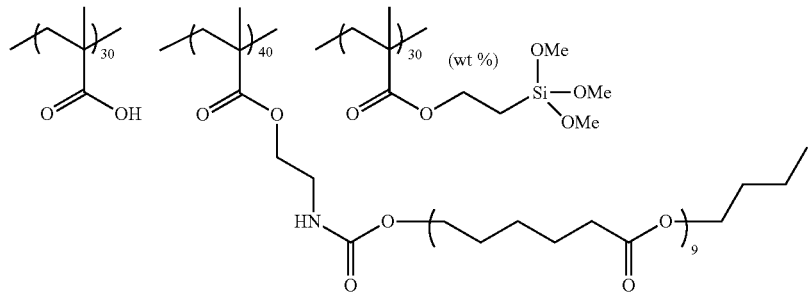
(Exemplified Compound 38)
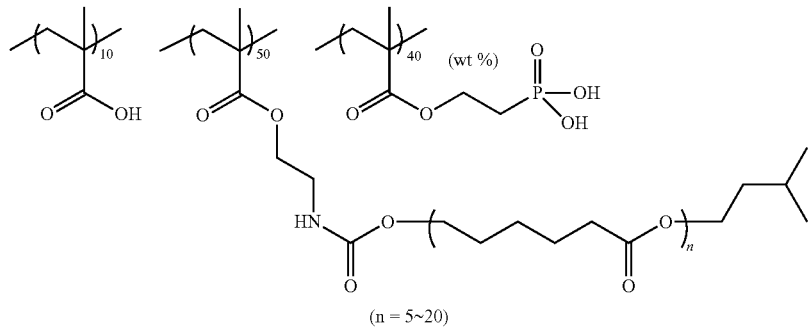
(Exemplified Compound 39)
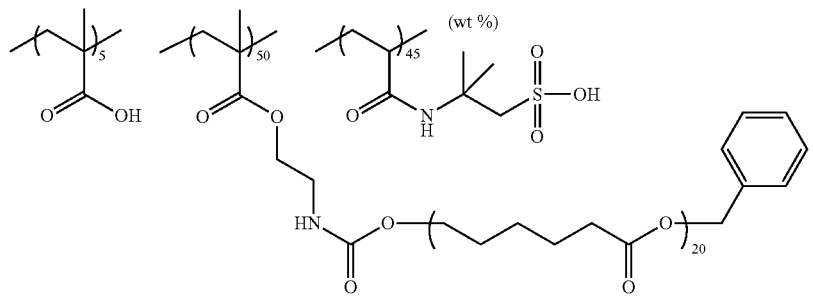
(Exemplified Compound 40)

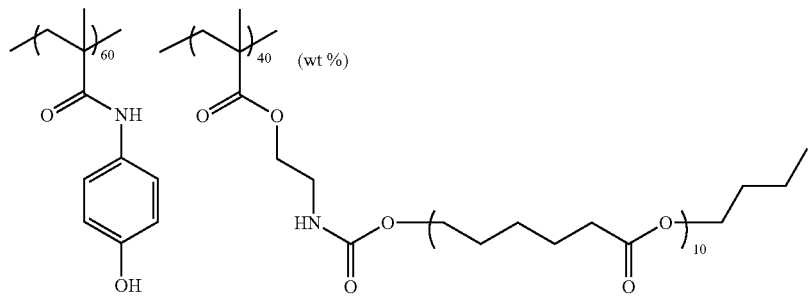
(Exemplefied Compound 41)
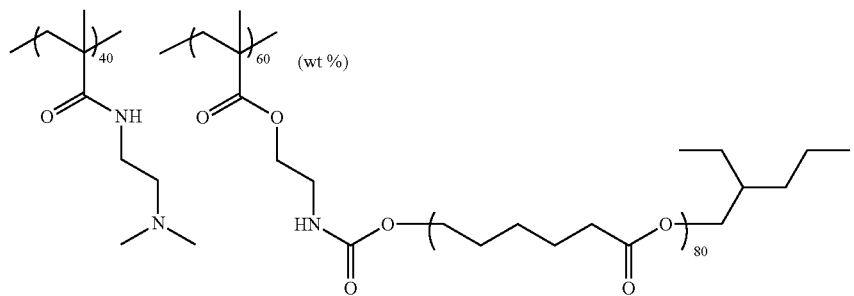
(Exemplefied Compound 42)
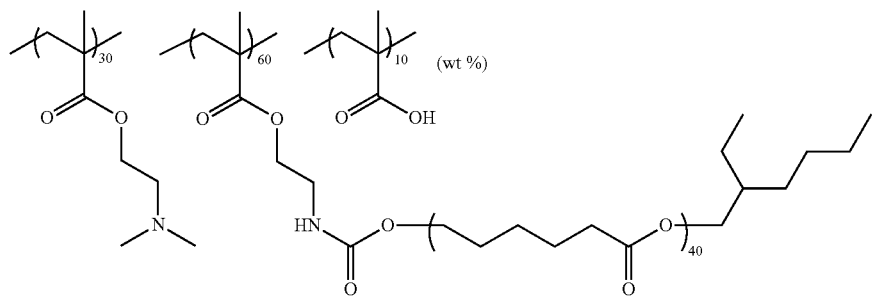
(Exemplefied Compound 43)
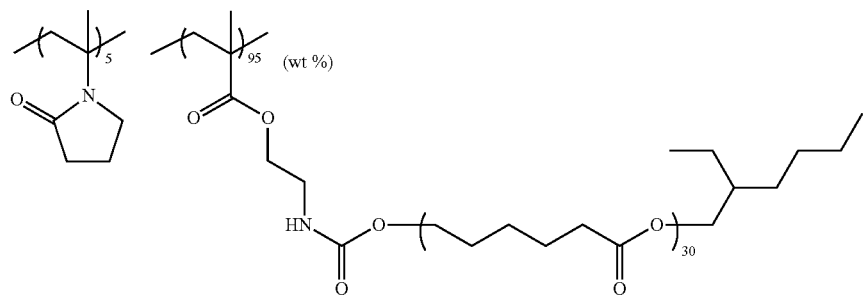
(Exemplefied Compound 44)
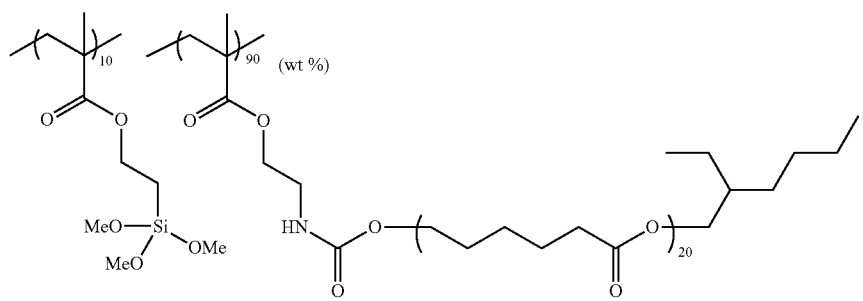
(Exemplefied Compound 45)

(Exemplified Compound 46)
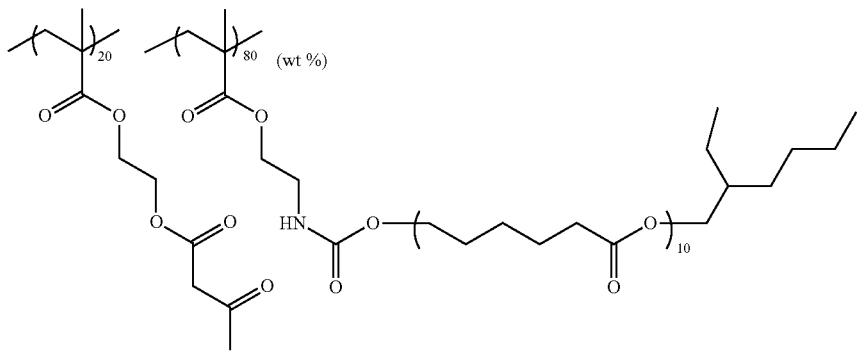
(Exemplefied Compopund 47)
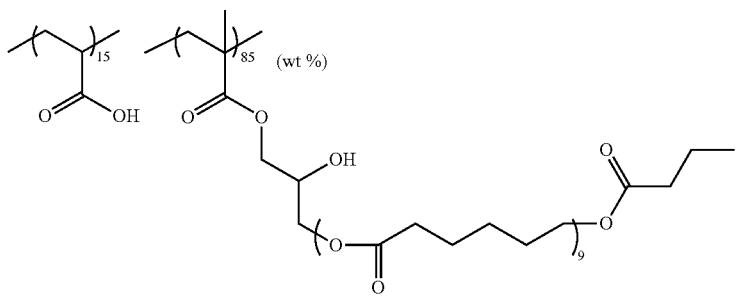
(Exemplefied Compound 48)
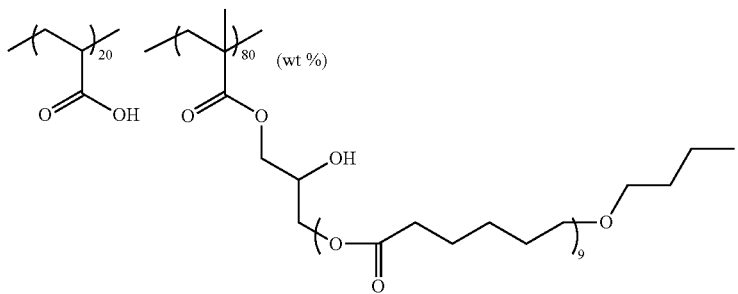
(Exemplefied Compound 49)
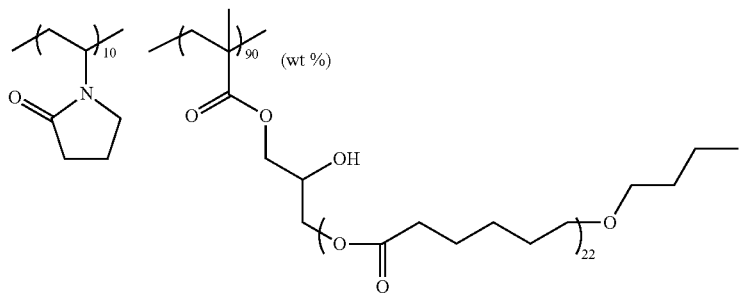
(Exemplefied Compound 50)
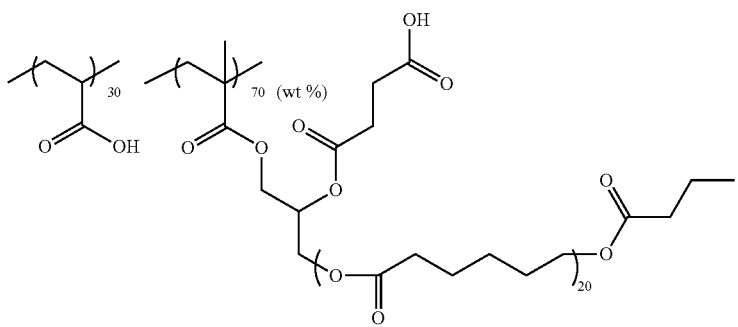

(Exemplefied Compound 51)
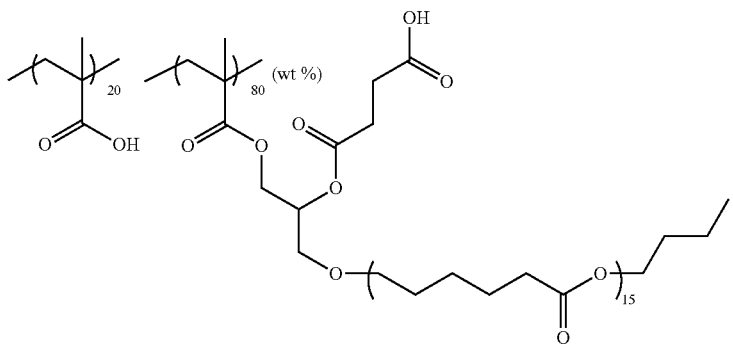
(Exemplefied Compound 52)
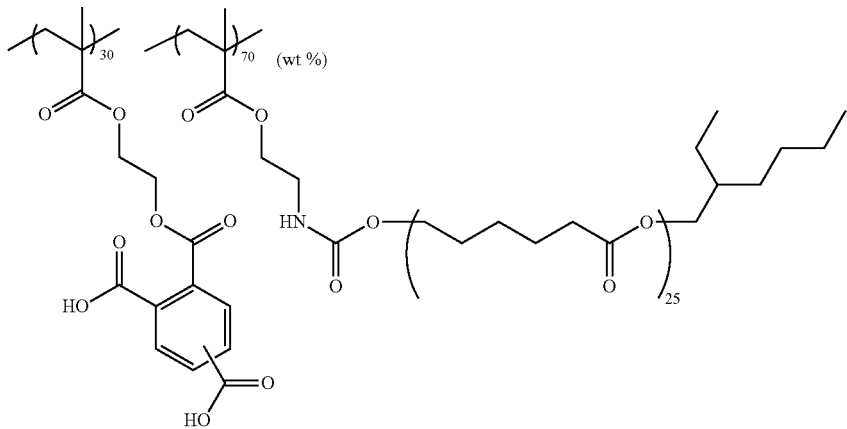
(Exemplefied Compound 53)
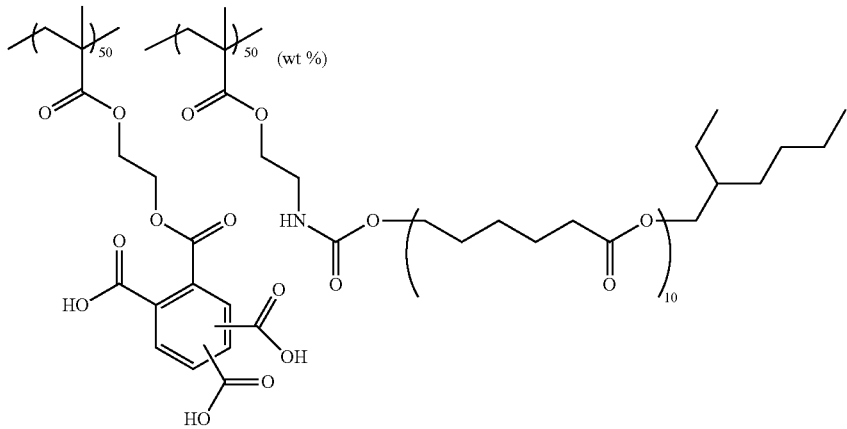
(Exemplefied Compound 54)
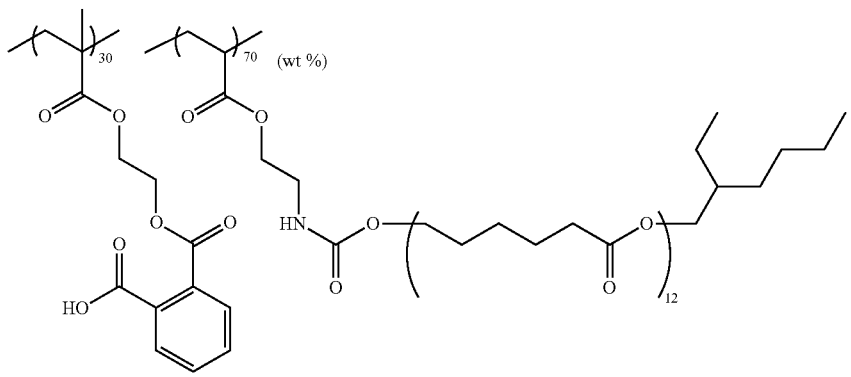

(Exemplefied Compound 55)
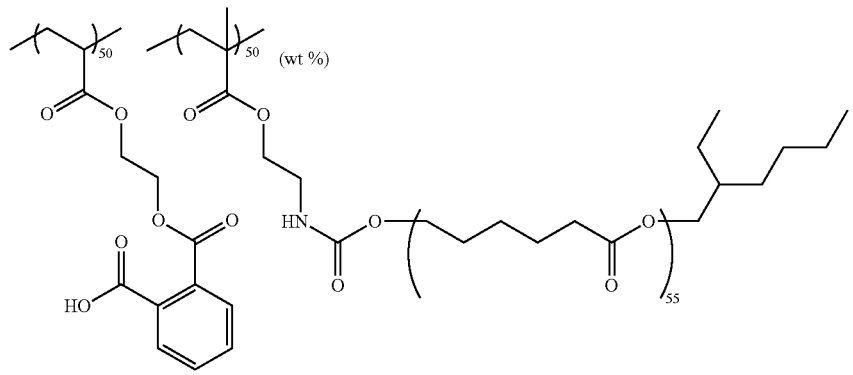
(Exemplefied Compound 56)
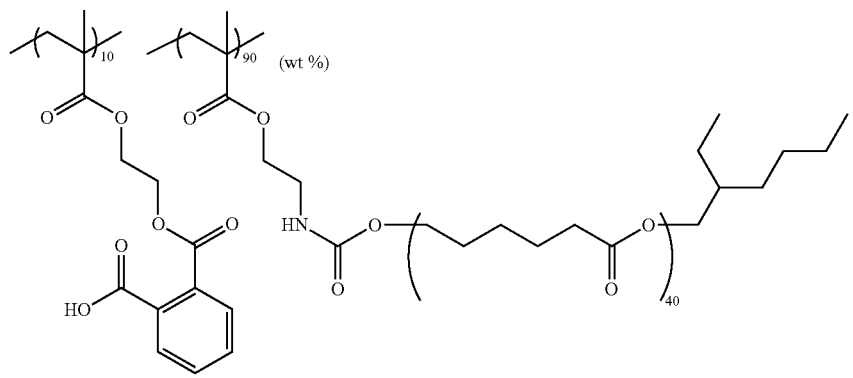
(Exemplefied Compound 57)
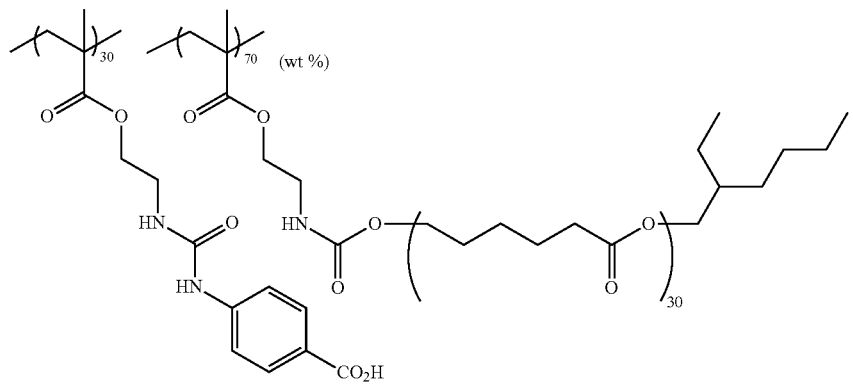
(Exemplefied Compound 58)
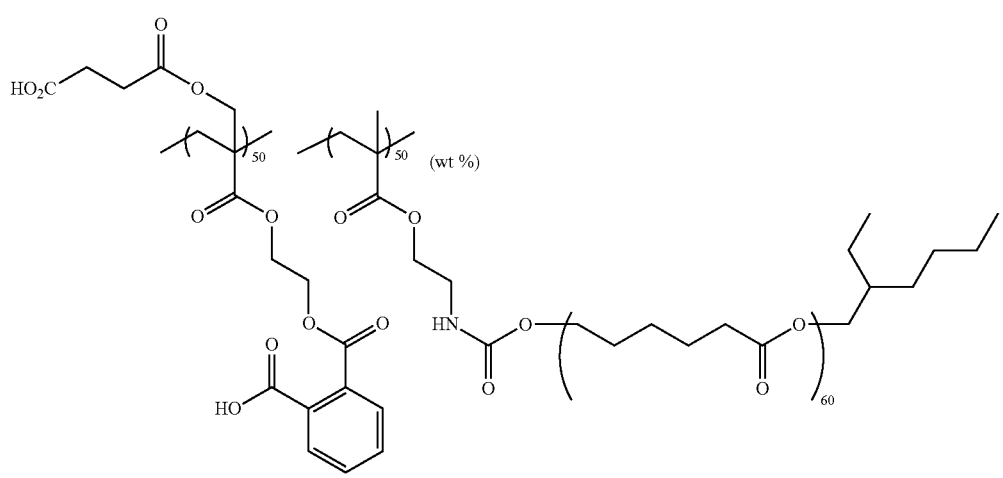

(Exemplified Compound 59)
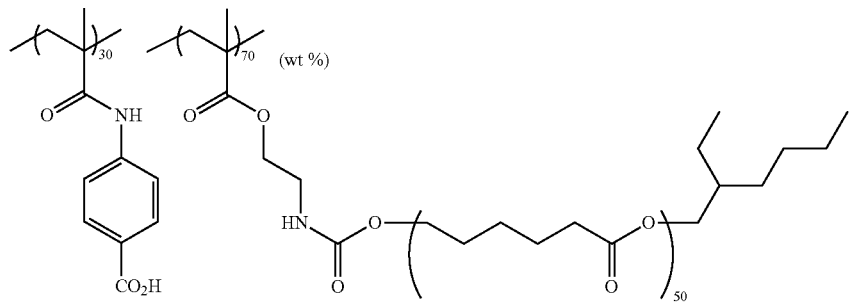
(Exemplified Compound 60)
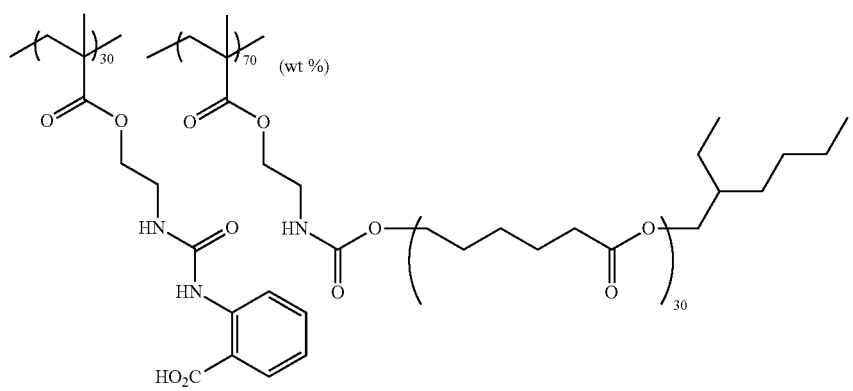
(Exemplified Compound 61)
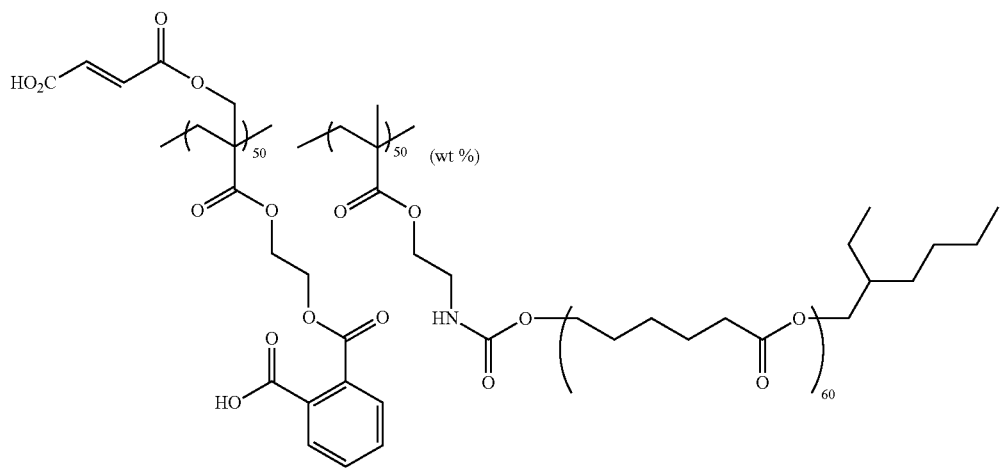
(Exemplified Compound 62)
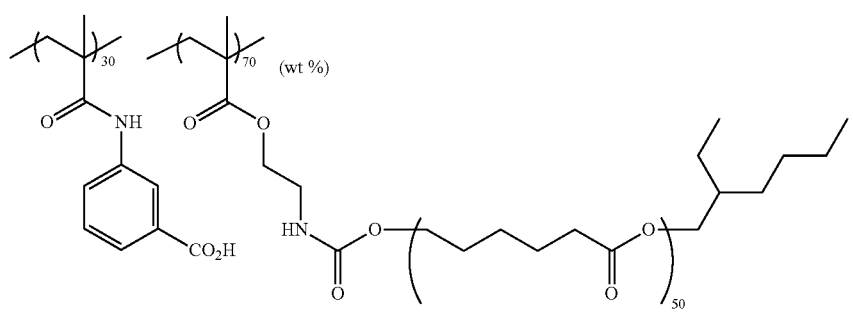

(Exemplified Compound 63)
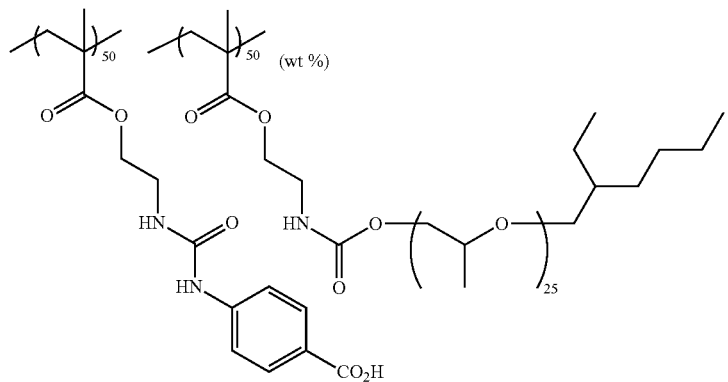
(Exemplified Compound 64)
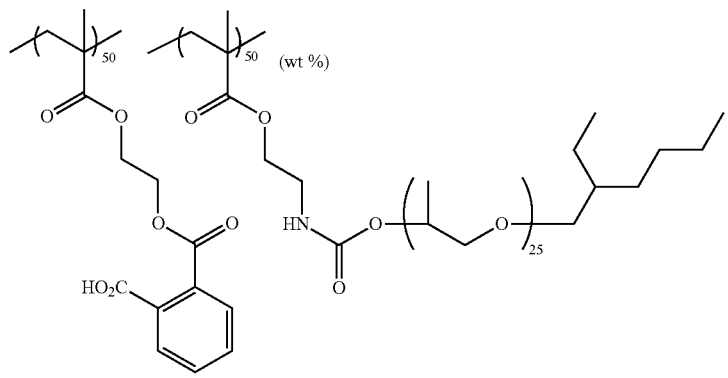
(Exemplified Compound 65)
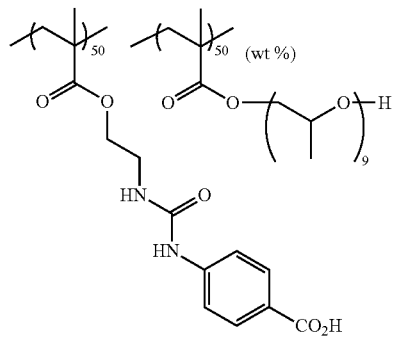
(Exemplified Compound 66)
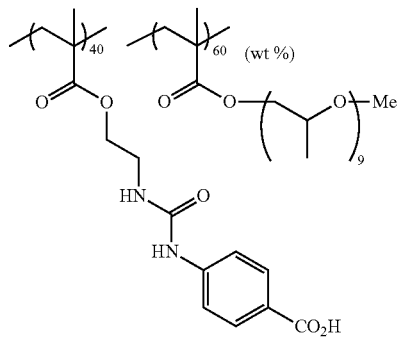
(Exemplified Compound 67)
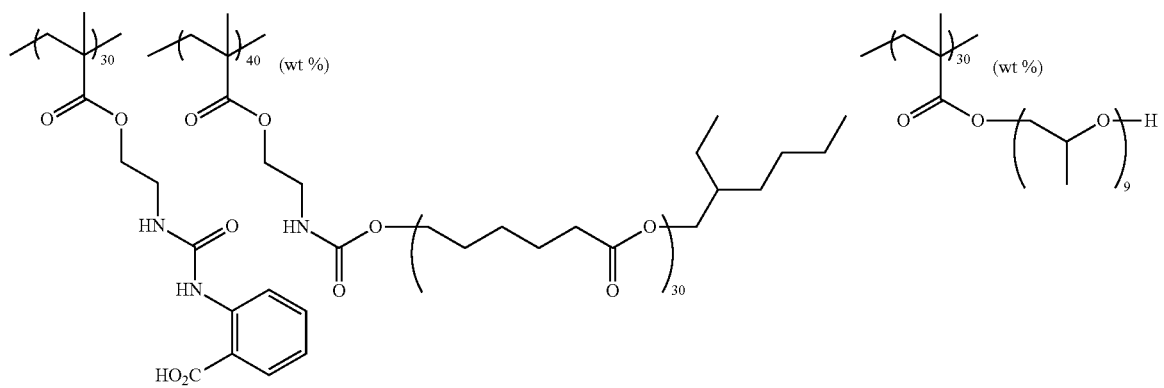

-continued
(Exemplefied Compound 68)
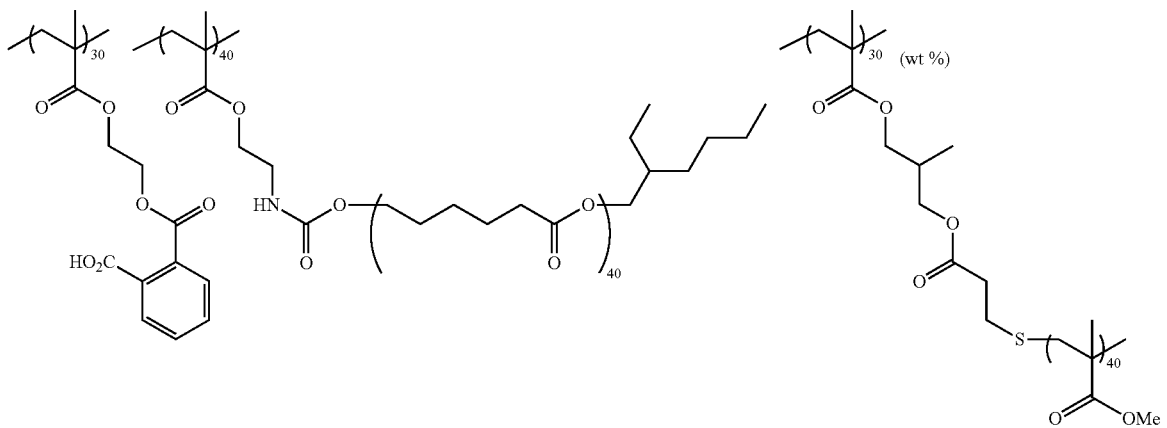
(Exemplefied Compound 69)
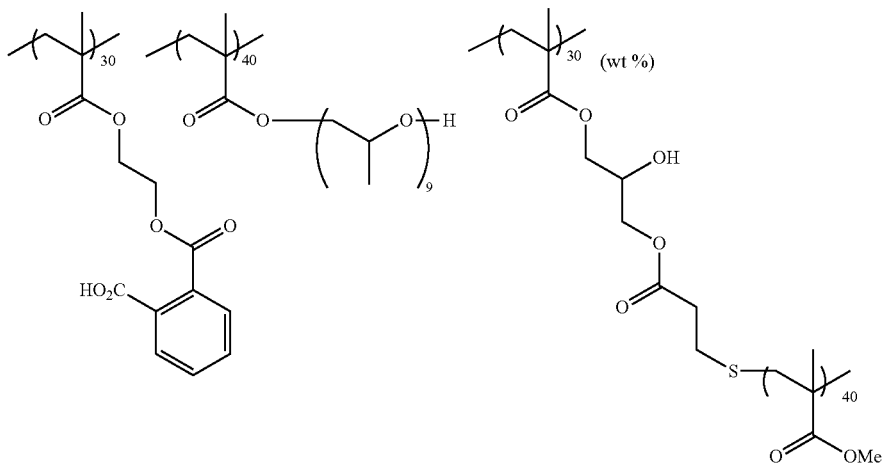
(Exemplefied Compound 70)
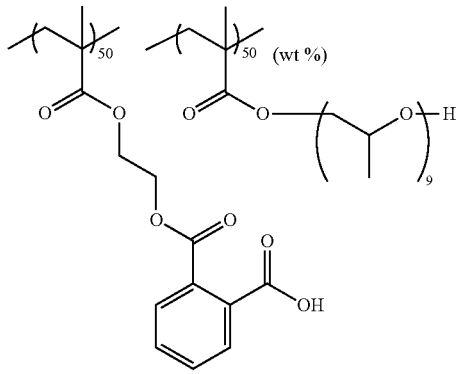

(Exemplefied Compound 71)

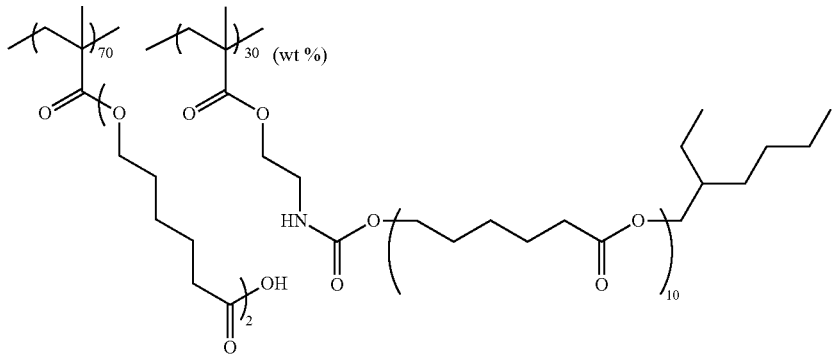

An amphoteric surfactant such as Hinoact T-8000E produced by Kawaken Fine Chemicals, Ltd. may be also used as the dispersant.

In the case of using a dispersant, from the standpoint of enhancing the dispersibility, a dispersion composition is preferably prepared using the compound (C) (and the other infrared-blocking material, if desired), a dispersant and an appropriate solvent and then blended in the polymerizable composition.

The polymerizable composition may or may not contain a dispersant, but in the case of containing a dispersant, the content thereof in the dispersion composition is preferably from 1 to 90 mass %, more preferably from 3 to 70 mass %, based on the entire solid content by mass of the compound (C) in the dispersion composition or in the case of using the other infrared-blocking material and using an infrared-absorbent inorganic pigment as the other infrared-blocking material, based on the sum of the entire solid contents by mass of the compound (C) and the infrared-absorbent inorganic pigment.

[8] Sensitizer

The polymerizable composition of the present invention may contain a sensitizer for the purpose of enhancing the radical generating efficiency of the polymerization initiator and achieving a longer photosensitive wavelength. The sensitizer which can be used in the present invention is preferably a sensitizer capable of sensitizing the photopolymerization initiator by an electron transfer mechanism or an energy transfer mechanism. The sensitizer which can be used in the present invention include those belonging to the compounds enumerated below and having an absorption wavelength in the wavelength region of 300 to 450 nm.

Preferred examples of the sensitizer include those belonging to the following compounds and having an absorption wavelength in the wavelength region of 330 to 450 nm.

Examples include polynuclear aromatics (e.g., phenanthrene, anthracene, pyrene, perylene, triphenylene, 9,10-dialkoxyanthracene), xanthenes (e.g., fluorescein, eosin, erythrosine, Rhodamine B, Rose Bengal), thioxanthones (isopropylthioxanthone, diethylthioxanthone, chlorothioxanthone), cyanines (e.g., thiacarbocyanine, oxacarbocyanine), merocyanines (e.g., merocyanine, carbomerocyanine), phthalocyanines, thiazines (e.g., thionine, methylene blue, toluidine blue), acridines (e.g., acridine orange, chloroflavin, acriflavin), anthraquinones (e.g., anthraquinone), squaryliums (for example, squarylium), acridine orange, coumarins (e.g., 7-diethylamino-4-methylcoumarin), ketocoumarin, phenothiazines, phenazines, styryl benzenes, azo compounds, diphenylmethane, triphenylmethane, distyryl benzenes, carbazoles, porphyrin, Spiro compounds, quinacridones, indigo, styryl, pyrylium compounds, pyromethene compounds, pyrazolotriazole compounds, benzothiazole compounds, barbituric acid derivatives, thiobarbituric acid derivatives, aromatic ketone compounds such as acetophenone, benzophenone, thioxanthone and Michler's ketone, and heterocyclic compounds such as N-aryl oxazolidinone.

Examples further include compounds described in European Patent 568,993, U.S. Pat. Nos. 4,508,811 and 5,227,227, JP-A-2001-125255 and JP-A-11-271969.

the polymerizable composition may or may not contain a sensitizer but in the case of containing a sensitizer, the content thereof is preferably from 0.01 to 10 mass %, more preferably from 0.1 to 2 mass %, based on the entire solid content by mass of the polymerizable composition of the present invention.

[9] Crosslinking Agent

The polymerizable composition of the present invention may further contain a crosslinking agent for the purpose of enhancing the strength of the permanent pattern.

The crosslinking agent is not particularly limited as long as it is a compound having a crosslinking group, and the compound preferably has two or more crosslinking groups. Specific preferred examples of the crosslinking group include an oxetane group, a cyanate group, and the same groups as those described for the crosslinking group which the alkali-soluble binder may have. Among these, an epoxy group, an oxetane group and a cyanate group are preferred. That is, the crosslinking group is preferably an epoxy compound, an oxetane compound or a cyanate compound.

Examples of the epoxy compound which ca be suitably used as the crosslinking agent in the present invention include an epoxy compound containing at least two oxirane groups per molecule, and an epoxy compound containing, per molecule, at least two epoxy groups each having an alkyl group at the β-position.

Examples of the epoxy compound having at least two oxirane groups per molecule include, but are not limited to, a bixylenol-type or biphenol-type epoxy compound (e.g., "YX4000 produced by Japan Epoxy Resins Co., Ltd."), a mixture thereof, a heterocyclic epoxy compound having an isocyanurate framework or the like (e.g., "TEPIC produced by Nissan Chemicals Industries, Ltd.", "ARALDITE PT810 produced by Chiba Specialty Chemicals"), a bisphenol A-type epoxy compound, a novolak-type epoxy compound, a bisphenol F-type epoxy compound, a hydrogenated bisphenol A-type epoxy compound, a bisphenol S-type epoxy compound, a phenol novolak-type epoxy compound, a cresol novolak-type epoxy compound, a halogenated epoxy compound (such as low brominated epoxy compound, high halogenated epoxy compound, brominated phenol novolak-type epoxy compound), an allyl group-containing bisphenol A-type epoxy compound, a trisphenolmethane-type epoxy compound, a diphenyldimethanol-type epoxy compound, a phenol biphenylene-type epoxy compound, a dicyclopentadiene-type epoxy compound (e.g., "HP-7200, HP-7200H produced by Dainippon Ink and Chemicals, Inc."), a glycidylamine-type epoxy compound (such as diaminodiphenylmethane-type epoxy compound, glycidylaniline and triglycidylaminophenol), a glycidyl ester-type epoxy compound (e.g., diglycidyl phthalate, diglycidyl adipate, glycidyl hexahydrophthalate, glycidyl dimerate), a hydantoin-type epoxy compound, an alicyclic epoxy compound (e.g., 3,4-epoxycyclohexylmethyl-3',4'-epoxycyclohexanecarboxylate, bis(3,4-epoxycyclohexylmethyl)adipate, dicyclopentadiene diepoxide, "GT-300, GT-400, ZEHPE3150 produced by Daicel Chemical Industries, Ltd."), an imide-type alicyclic epoxy compound, a trihydroxyphenylmethane-type epoxy compound, bisphenol A novolak-type epoxy compound, a tetraphenylolethane-type epoxy compound, a glycidyl phthalate compound, a tetraglycidyl xylenoylethane compound, a naphthalene group-containing epoxy compound (such as naphthol aralkyl-type epoxy compound, naphthol novolak-type epoxy compound, tetrafunctional naphthalene-type epoxy compound, and commercially available "ESN-190, ESN-360 produced by Nippon Steel Chemical Co., Ltd.", and "HP-4032, EXA-4750, EXA-4700 produced by Dainippon Ink and Chemicals, Inc."), a reaction produce of epichlorohydrin with a polyphenol compound obtained by an addition reaction between a phenol compound and a diolefin compound such as divinylbenzene and dicyclopentadiene, a 4-vinylcyclohexene-1-oxide ring-opening polymerization product epoxidized with peracetic acid or the like, an epoxy compound having a linear phosphorus-containing structure, an epoxy compound having a cyclic phosphorus-containing structure, an α-methylstilbene-type liquid crystal epoxy compound, a dibenzoyloxybenzene-type liquid crystal epoxy compound, an azophenyl-type liquid crystal epoxy compound, an azomethine phenyl-type liquid crystal epoxy compound, a binaphthyl-type liquid crystal epoxy compound, an azine-type epoxy compound, a glycidyl methacrylate copolymer-based epoxy compound (e.g., "CP-50S, CP-50M produced by NOF Corporation"), a copolymerized epoxy compound of cyclohexyl maleimide and glycidyl methacrylate, a bis(glycidyloxyphenyl)fluorene-type epoxy compound, and a bis(glycidyloxyphenyl)adamantane-type epoxy compound. One of these epoxy resins may be used alone, or two or more thereof may be used in combination.

Other than the epoxy compound containing at least two oxirane groups per molecule, an epoxy compound containing, per molecule, at least two epoxy groups each having an alkyl group at the β-position may be used, and a compound containing an epoxy group substituted with an alkyl group at the β-position (more specifically, a β-alkyl-substituted glycidyl group or the like) is particularly preferred.

In the epoxy compound containing at least an epoxy group having an alkyl group at the β-position, all of two or more epoxy groups contained per molecule may be a β-alkyl-substituted glycidyl group, or at least one epoxy group may be a β-alkyl-substituted glycidyl group.

Examples of the oxetane compound include an oxetane resin having at least two oxetanyl groups per molecule.

Specific examples thereof include polyfunctional oxetanes such as bis[(3-methyl-3-oxetanylmethoxy)methyl]ether, bis[(3-ethyl-3-oxetanylmethoxy)methyl]ether, 1,4-bis[(3-methyl-3-oxetanylmethoxy)methyl]benzene, 1,4-bis[(3-ethyl-3-oxetanylmethoxy)methyl]benzene, (3-methyl-3-oxetanyl) methyl acrylate, (3-ethyl-3-oxetanyl)methyl acrylate, (3-methyl-3-oxetanyl)methyl methacrylate, (3-ethyl-3-oxetanyl)methyl methacrylate, and an oligomer or copolymer thereof; and ether compounds of an oxetane group-containing compound and a hydroxyl group-containing resin such as novolak resin, poly(p-hydroxystyrene), cardo-type bisphenols, calixarenes, calixresorcinarenes and silsesquioxane. Other examples include a copolymer of an oxetane ring-containing unsaturated monomer and an alkyl(meth)acrylate.

Examples of the bismaleimide compound include 4,4'-diphenylmethane bismaleimide, bis-(3-ethyl-5-methyl-4-maleimidophenyl)methane, and 2,2'-bis-[4-(4-maleimidophenoxy)phenyl]propane.

Examples of the cyanate compound include a bis A-type cyanate compound, a bis F-type cyanate compound, a cresol novolak-type cyanate compound, and a phenol novolak-type cyanate compound.

The polymerizable composition may or may not contain a crosslinking agent, but in the case of containing a crosslinking agent, the content thereof is preferably from 1 to 40 mass %, more preferably from 3 to 20 mass %, based on the entire solid content by mass of the polymerizable composition of the present invention.

[10] Curing Accelerator

The polymerizable composition of the present invention may further contain a curing accelerator for the purpose of accelerating thermal curing of the crosslinking agent such as the above-described epoxy compound and oxetane compound.

Examples of the curing accelerator which can be used include an amine compound (such as dicyandiamide, benzyldimethylamine, 4-(dimethylamino)-N,N-dimethylbenzylamine, 4-methoxy-N,N-dimethylbenzylamine and 4-methyl-N,N-dimethylbenzylamine), a quaternary ammonium salt compound (such as triethylbenzyl ammonium chloride), a block isocyanate compound (such as dimethylamine), an imidazole derivative-bicyclic amidine compound and a salt thereof (such as imidazole, 2-methylimidazole, 2-ethylimidazole, 2-ethyl-4-methylimidazole, 2-phenylimidazole, 4-phenylimidazole, 1-cyanoethyl-2-phenylimidazole and 1-(2-cyanoethyl)-2-ethyl-4-methylimidazole), a phosphorus compound (such as triphenylphosphine), a guanamine compound (such as melamine, guanamine, acetoguanamine and benzoguanamine), and an S-triazine derivative (such as 2,4-diamino-6-methacryloyloxyethyl-S-triazine, 2-vinyl-2,4-diamino-S-triazine, 2-vinyl-4,6-diamino-S-triazine-isocyanuric acid adduct, 2,4-diamino-6-methacryloyloxyethyl-S-triazine-isocyanuric acid adduct). These may be used alone or in combination. One of these compounds may be used alone, or two or more thereof may be used in combination.

The polymerizable composition may or may not contain a curing accelerator, but in the case of containing a curing accelerator, the content thereof is usually from 0.01 to 15 mass %, based on the entire solid content of the polymerizable composition.

[11] Filler

The polymerizable composition of the present invention may further contain a filler. The filler which can be used in the present invention includes spherical silica surface-treated with a silane coupling agent.

The polymerizable composition of the present preferably contains a filler, because a pattern having high durability is obtained (in particular, when higher durability is required of the solder resist, for example, when the wiring density of the metal wiring covered with a solder resist is high, the above-described effect is prominent).

By using spherical silica surface-treated with a silane coupling agent, the thermal cycle test resistance and storage stability of the polymerizable composition are enhanced, and the same good profile as that immediately after pattern formation can be maintained, for example, even through a severe atmosphere such as thermal cycle test.

The term "spherical" in the spherical filler may be sufficient if the particle is not of a needle-like, columnar or amorphous shape but is rounded, and the shape need not be necessarily "truly spherical". However, the typical "spherical" shape is "a truly spherical" shape.

Whether the filler is spherical can be confirmed by observing it though a scanning electron microscope (SEM).

The volume average primary particle diameter of the filler is not particularly limited and may be appropriately selected according to the purpose but is preferably from 0.05 to 3 μm, more preferably from 0.1 to 1 μm. When the volume average primary particle diameter of the filler is in the range above, this is advantageous in that impairment of the processability due to development of thixotropy is suppressed and the maximum particle diameter is kept from becoming large, as a result, generation of a defect due to attachment of extraneous material to the cured film obtained or non-uniformity of the coated film can be prevented.

The volume average primary particle diameter of the filler can be measured by a dynamic light scattering particle diameter distribution measuring apparatus.

The filler can be dispersed using the above-described dispersant and binder. As stated earlier, in view of curability, an alkali-soluble binder having a crosslinking group in the side chain is preferred.

—Surface Treatment—

The surface treatment of the filler is described below. The surface treatment of the filler is not particularly limited and may be appropriately selected according to the purpose, but a treatment of covering silica with a silane coupling agent is preferred.

—Silane Coupling Agent—

The silane coupling agent used for the surface treatment of the filler is not particularly limited and may be appropriately selected according to the purpose, but at least one functional group selected from an alkoxysilyl group, a chlorosilyl group and an acetoxysilyl group (hereinafter, sometimes referred to as a "first functional group") and at least one functional group selected from a (meth)acryloyl group, an amino group and an epoxy group (hereinafter, sometimes referred to as a "second functional group). The second functional group is more preferably a (meth)acryloyl group or an amino group, and it is still more preferred that the second functional group is a (meth)acryloyl group. When the second functional group is a (meth)acryloyl group, this is advantageous in view of storage stability and TCT resistance.

A coupling agent containing, as a first functional group, at least one member selected from an alkoxysilyl group, a chlorosilyl group and an acetoxysilyl group and, as a second functional group, at least one member selected from an imidazole group, an alkylimidazole group and a vinylimidazole group, described in JP-B-7-68256, can be also preferably used.

The silane coupling agent is not particularly limited, but preferred examples thereof include a γ-aminopropyltriethoxysilane, N-(β-aminoethyl)-γ-aminopropyltrimethoxysilane, N-(β-aminoethyl)-γ-aminopropylmethyldimethoxysilane, γ-glycidoxypropyltrimethoxysilane, γ-glycidoxypropylmethyldimethoxysilane, γ-methacryloxypropyltriethoxysilane, γ-methacryloxypropylmethyldimethoxysilane, α-[[3-(trimethoxysilyl)propoxy]methyl]-imidazole-1-ethanol described in JP-B-7-68256, 2-ethyl-4-methyl-α-[[3-(trimethoxysilyl)propoxy]methyl]-imidazole-1-ethanol, 4-vinyl-α-[[3-(trimethoxysilyl)propoxy]methyl]-imidazole-1-ethanol, 2-ethyl-4-methylimidazopropyltrimethoxysilane, and their salts, intramolecular condensates and intermolecular condensates. One of these compounds may be used alone, or two or more thereof may be used in combination.

The surface treatment of spherical silica with the silane coupling agent may be previously performed only for the spherical silica (in this case, hereinafter, sometimes referred to as a "pretreatment") or may be performed together with a part or all of other fillers contained in the polymerizable composition.

The method for performing the pretreatment is not particularly limited, and examples of the method include a dry method, an aqueous solution method, an organic solvent method and a spray method. The temperature at which the pretreatment is performed is not particularly limited but is preferably from normal temperature to 200° C.

It is also preferred to add a catalyst when performing the pretreatment. The catalyst is not particularly limited, and examples thereof include an acid, a base, a metal compound, and an organic metal compound.

In the case of performing the pretreatment, the amount of the silane coupling agent added is not particularly limited but is preferably from 0.01 to 50 parts by mass, more preferably from 0.05 to 50 parts by mass, per 100 parts by mass of the spherical silica. When the amount added is in this range, a surface treatment sufficiently enough to develop the effect is performed and at the same time, impairment of the handleability due to aggregation of spherical silica after treatment is reduced.

The above-described silane coupling agent has an action of enhancing the adherence between the base material and the photosensitive layer, because the first functional group reacts with an active group in the base material surface, spherical silica surface and binder and the second functional group reacts with a carboxyl group and an ethylenically unsaturated group of the binder. On the other hand, the silane coupling agent has high reactivity and if the silane coupling agent itself is added to the polymerizable composition, mainly the second functional group sometimes undergoes reaction or deactivation during storage due to its diffusion action, giving rise to reduction in the shelf life or pot life.

However, when spherical silica pretreated with a silane coupling agent is used, the diffusion action is suppressed to greatly improve the problem of shelf life or pot life, and it is possible to take even a one-component system. Furthermore, in the case of applying the pretreatment to spherical silica, the conditions such as stirring condition, temperature condition and use of catalyst can be freely selected, so that compared to the addition without performing the pretreatment, the reaction ratio of the first functional group of the silane coupling agent with an active group in the spherical silica can be significantly increased. Accordingly, very good results are obtained in terms of required characteristics under severe conditions such as electroless gold plating, electroless solder plating and moisture resistance load test. Also, by performing the pretreatment, the amount of the silane coupling agent used can be decreased, and the shelf life and pot life can be more improved.

Examples of the spherical silica surface-treated with a silane coupling agent, which can be used in the present invention, include FB and SFP Series of Denki Kagaku Kogyo Kabushiki Kaisha; 1-FX of Tatsumori Ltd.; HSP Series of Toagosei Co., Ltd.; and SP Series of Fuso Chemical Co., Ltd.

The polymerizable composition may or may not contain a filler, but in the case of containing a filler, the content thereof based on the entire solid content by mass of the polymerizable composition is not particularly limited and may be appropriately selected according to the purpose. The content is preferably from 1 to 60 mass %. When the amount added is in this range, sufficient reduction in the linear expansion coefficient is achieved and at the same time, the cured film formed can be kept from embrittlement, as a result, when wiring is formed using a permanent patter, the function as a protective film of the wiring is adequately exerted.

[12] Elastomer

The polymerizable composition of the present invention may further contain an elastomer.

By containing an elastomer, the adherence to the conductive layer of a printed wiring board when using the polymerizable composition for a solder resist can be more improved and at the same time, heat resistance, thermal shock resistance, flexibility and toughness of the cured film can be more enhanced.

The elastomer which can be used in the present invention is not particularly limited and may be appropriately selected according to the purpose, and examples thereof include a styrene-based elastomer, an olefin-based elastomer, a urethane-based elastomer, a polyester-based elastomer, a polyamide-based elastomer, an acrylic elastomer, and a silicone-based elastomer. Such an elastomer is composed of a hard segment component and a soft segment component, where in general, the former contributes to heat resistance and strength and the latter contributes to flexibility and toughness. Among these, a polyester-based elastomer is advantageous in view of compatibility with other materials.

Examples of the styrene-based elastomer include a styrene-butadiene-styrene block copolymer, a styrene-isoprene-styrene block copolymer, a styrene-ethylene-butylene-styrene block copolymer, and a styrene-ethylene-propylene-styrene block copolymer. As the component constituting the styrene-based elastomer, other than styrene, a styrene derivative such as α-methylstyrene, 3-methylstyrene, 4-propylstyrene and 4-cyclohexylstyrene can be used. Specific examples thereof include TUFPRENE, SOLPRENE T, ASAPRENE T, Tuftec (all produced by ADEKA), Elastomer AR (produced by Aronkasei Co., Ltd.), Kraton G, Califlex (both produced by Shell in Japan), JSR-TR, TSR-SIS, Dynaron (all produced by JSR), Denka STR (produced Denki Kagaku Kogyo K.K.), Quintac (produced by ZEON Corporation), TPE-SB Series (produced by Sumitomo Chemical Co., Ltd.), Rabalon (produced by Mitsubishi Chemical Corporation), Septon, HYBRAR (both produced by Kuraray Co., Ltd.), Sumiflex (produced by Sumitomo Bakelite Co., Ltd.), Leostomer, and Actymer (both produced by Riken Vinyl Industry Co., Ltd.).

The olefin-based elastomer is a copolymer of α-olefin having a carbon number of 2 to 20, such as ethylene, propylene, 1-butene, 1-hexene and 4-methyl-pentene, and examples thereof include an ethylene-propylene copolymer (ERR) and an ethylene-propylene-diene copolymer (EPDM). Also, the olefin-based elastomer includes, for example, a copolymer of an α-olefin and a nonconjugated diene having a carbon number of 2 to 20, such as dicyclopentadiene, 1,4-hexadiene, cyclooctadiene, methylenenorbornene, ethylidenenorbornene, butadiene and isoprene, and an epoxidized polybutadiene. The olefin-based elastomer further includes, for example, carboxyl-modified NBR obtained by copolymerizing methacrylic acid with a butadiene-acrylonitrile copolymer. Other examples of the olefin-based elastomer include an ethylene-α-olefin copolymer rubber, an ethylene-α-olefin-nonconjugated diene copolymer rubber, a propylene-α-olefin copolymer rubber, and a butene-α-olefin copolymer rubber.

Specific examples of the olefin-based elastomer include Milastomer (produced by Mitsui Petrochemical Industries, Ltd.), EXACT (produced by Exxon Chemical), ENGAGE (produced by Dow Chemical), hydrogenated styrene-butadiene rubber "DYNABON HSBR" (produced by JSR), butadiene-acrylonitrile copolymer "NBR Series" (produced by JSR), butadiene-acrylonitrile copolymer modified at both ends with a carboxyl group having a crosslinking site "XER Series" (produced by JSR), and epoxidized polybutadiene obtained by partially epoxidizing polybutadiene "BF-1000" (produced by Nippon Soda Co., Ltd.).

The urethane-based elastomer consists of structural units, that is, a hard segment composed of low molecular (short chain) diol and diisocyanate, and a soft segment composed of polymer (long chain) diol and diisocyanate. Examples of the polymer (long chain) diol include polypropylene glycol, polytetramethylene oxide, poly(1,4-butylene adipate), poly(ethylene-1,4-butylene adipate), polycaprolactone, poly(1,6-hexylene carbonate), and poly(1,6-hexylene-neopentylene adipate). The number average molecular weight of the polymer (long chain) diol is preferably from 500 to 10,000. Examples of the low molecular (short chain) diol include ethylene glycol, propylene glycol, 1,4-butanediol, and bisphenol A. The number average molecular weight of the short chain diol has is preferably from 48 to 500. Specific examples of the urethane-based elastomer include PANDEX T-2185 and T-2983N (both produced by DIC Corporation), and Shirakutoran E790.

The polyester-based elastomer is obtained by polycondensing a dicarboxylic acid or a derivative thereof and a diol compound or a derivative thereof. Specific examples of the dicarboxylic acid include an aromatic dicarboxylic acid such as terephthalic acid, isophthalic acid and naphthalenedicarboxylic acid; an aromatic dicarboxylic acid where a hydrogen atom of the above-described aromatic ring is substituted with a methyl group, an ethyl group, a phenyl group or the like; an aliphatic dicarboxylic acids having a carbon number of 2 to 20, such as adipic acid, sebacic acid and dodecanedicarboxylic acid; and an alicyclic dicarboxylic acid such as cyclohexanedicarboxylic acid. One of these compounds or two or more thereof may be used. Specific examples of the diol compound include an aliphatic or alicyclic diol such as ethylene glycol, 1,3-propanediol, 1,4-butanediol, 1,6-hexanediol, 1,10-decanediol and 1,4-cyclohexanediol, bisphenol A, bis-(4-hydroxyphenyl)-methane, bis-(4-hydroxy-3-methylphenyl)-propane, and resorcin. One of these compounds or two or more thereof may be used. A multi-block copolymer using an aromatic polyester (e.g. polybutylene terephthalate) moiety for the hard segment component and an aliphatic polyester (e.g. polytetramethylene glycol) moiety for the soft segment component, can be used. The polyester-based elastomer includes various grades according to the kind, ratio and difference in the molecular weight of the hard segment and the soft segment. Specific examples of the polyester-based elastomer include Hytrel (produced by Du Pont-Toray Co., Ltd.), PELPRENE (produced by Toyobo Co., Ltd.), and ESPEL (produced by Hitachi Chemical Co., Ltd.).

The polyamide-based elastomer consists of a hard segment composed of polyamide and a soft segment composed of polyether or polyester and is roughly classified into two types, that is, a polyether block amide type and a polyether ester block type. Examples of the polyamide include polyamide-6, polyamide-11, and polyamide-12. Examples of the polyether include polyoxyethylene, polyoxypropylene, and polytetramethylene glycol. Specific examples of the polyamide-based elastomer include UBE Polyamide Elastomer (produced by Ube Industries, Ltd.), DAIAMID (produced by Daicel-Huels), PEBAX (produced by Toray Industries, Inc.), Grilon ELY (EMS Japan), Novamid (produced by Mitsubishi Chemical Corporation), and Grilax (produced by DIC Corporation).

The acrylic elastomer is obtained by copolymerizing an acrylic acid ester such as ethyl acrylate, butyl acrylate, methoxyethyl acrylate and ethoxyethyl acrylate, an epoxy group-containing monomer such as glycidyl methacrylate and alkyl glycidyl ether, and/or a vinyl-based monomer such as acrylonitrile and ethylene. Examples of the acrylic elastomer include an acrylonitrile-butyl acrylate copolymer, an acrylonitrile-butyl acrylate-ethyl acrylate copolymer, and an acrylonitrile-butyl acrylate-glycidyl methacrylate copolymer.

The silicone-based elastomer is mainly composed of an organopolysiloxane and can be classified into a polydimethylsiloxane type, a polymethylphenylsiloxane type and a polydiphenylsiloxane type. An organopolysiloxane partially modified with a vinyl group, an alkoxy group or the like may be also used. Specific examples of the silicone-based elastomer include KE Series (produced by Shin-Etsu Chemical Co., Ltd.), SE Series, CY Series and SH Series (all produced by Dow Corning Toray Silicone Co., Ltd.).

Other than the elastomers described above, a rubber-modified epoxy resin may be used. The rubber-modified epoxy resin is obtained by modifying a part or all of epoxy groups in the above-described bisphenol F-type epoxy resin, bisphenol A-type epoxy resin, salicylaldehyde-type epoxy resin, phenol novolak-type epoxy resin, cresol novolak-type epoxy resin or the like with, for example, a both-terminal carboxylic acid-modified butadiene-acrylonitrile rubber or a terminal amino-modified silicone rubber.

Among the elastomers, in view of shear adherence and thermal shock resistance, a both-terminal carboxyl group-modified butadiene-acrylonitrile copolymer, and ESPEL that is a polyester-based elastomer having a hydroxyl group (ESPEL 1612 and 1620, produced by Hitachi Chemical Co., Ltd.), and epoxidized polybutadiene are preferred.

The polymerizable composition of the present invention may or may not contain an elastomer, but in the case of containing an elastomer, the content thereof based on the entire solid content by mass of the polymerizable composition is not particularly limited and may be appropriately selected according to the purpose. The content is preferably from 0.5 to 30 mass %, more preferably from 1 to 10 mass %, still more preferably from 3 to 8 mass %, based on the solid content. When the content is in this preferred range, the shear adherence and thermal shock resistance can be advantageously more enhanced.

[13] Surfactant

From the standpoint of more enhancing the coatability, in the photosensitive resin composition of to the present invention, various surfactants may be added. As the surfactant, a variety of surfactants such as fluorine-containing surfactant, nonionic surfactant, cationic surfactant, anionic surfactant and silicone-containing surfactant may be used.

In particular, when the polymerizable composition of the present invention contains a fluorine-containing surfactant, the liquid characteristics (particularly, fluidity) of a coating solution prepared can be more enhanced and therefore, uniformity of the coating thickness and liquid saving performance can be more improved.

That is, in the case of forming a film by using a coating solution to which a polymerizable composition containing a fluorine-containing surfactant is applied, the interfacial tension between the surface to be coated and the coating solution is lowered, whereby wettability of the surface to be coated is improved and coatability on the surface to be coated is enhanced. This is effective in that even when a thin film on the order of several μm is formed with a small amount of solution, a film being reduced in the thickness unevenness and having a uniform thickness can be more successfully performed.

The fluorine content of the fluorine-containing surfactant is preferably from 3 to 40 mass %, more preferably from 5 to 30 mass %, still more preferably from 7 to 25 mass %. The fluorine-containing surfactant having a fluorine content in this range is effective in view of thickness uniformity of the coated film or liquid saving performance and also exhibits good solubility in the polymerizable composition.

Examples of the fluorine-containing surfactant include Megaface F171, Megaface F172, Megaface F173, Megaface F176, Megaface F177, Megaface F141, Megaface F142, Megaface F143, Megaface F144, Megaface R30, Megaface F437, Megaface F475, Megaface F479, Megaface F482, Megaface F554, Megaface F780, Megaface F781 (all produced by DIC Corporation), Fluorad FC430, Fluorad FC431, Fluorad FC171 (all produced by Sumitomo 3M Ltd.), Surflon S-382, Surflon SC-101, Surflon SC-103, Surflon SC-104, Surflon SC-105, Surflon SC-1068, Surflon SC-381, Surflon SC-383, Surflon S-393, Surflon KH-40 (all produced by Asahi Glass Co., Ltd.), and Solsperse 20000 (produced by The Lubrizol Corporation).

Specific examples of the nonionic surfactant include glycerol, trimethylolpropane, trimethylolethane, their ethoxylate and propoxylate (e.g., glycerol propoxylate, glycerin ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (such as Pluronic L10, L31, L61, L62, 10R5, 17R2 and 25R2, and Tetronic 304, 701, 704, 901, 904 and 150R1, produced by BASF).

Specific examples of the cationic surfactant include a phthalocyanine derivative (EFKA-745, trade name, produced by Morishita Sangyo K.K.), organosiloxane polymer KP341 (produced by Shin-Etsu Chemical Co., Ltd.), (meth)acrylic acid (co)polymers POLYFLOW No. 75, No. 90 and No. 95 (produced by Kyoeisha Chemical Co., Ltd.), and W001 (produced by Yusho Co., Ltd.).

Specific examples of the anionic surfactant include W004, W005 and W017 (produced by Yusho Co Ltd.).

Examples of the silicone-containing surfactant include "TORAY SILICONE DC3PA", "TORAY SILICONE SH7PA", "TORAY SILICONE DC11PA", "TORAY SILICONE SH21PA", "TORAY SILICONE SH28PA", "TORAY SILICONE SH29PA", "TORAY SILICONE SH30PA" and "TORAY SILICONE SH8400" produced Dow Corning Toray Silicone Co., Ltd.; "TSF-4440", "TSF-4300", "TSF-4445", "TSF-4460" and "TSF-4452" produced by Momentive Performance Materials Inc.; "KP341", "KF6001" and "KF6002" produced by Shin-Etsu Silicone; and "BYK307", "BYK-323" and "BYK-330" produced by BYK Chemie.

As the surfactant, one kind of a surfactant may be used, or two or more kinds of surfactants may be used in combination.

The polymerizable composition may or may not contain a surfactant, but in the case of containing a surfactant, the content thereof is preferably from 0.001 to 1 mass %, more preferably from 0.01 to 0.1 mass %, based on the entire solid content by mass of the polymerizable composition of the present invention.

[14] Other Components

In the polymerizable composition of the present invention, in addition to the above-described essential components and preferred additives, other components may be appropriately selected and used according to the purpose within the range not impairing the effects of the present invention.

Examples of other components which can be used in combination include a curing accelerator, a thermal polymerization inhibitor, a plasticizer, and a colorant (colored pigment or dyestuff). Furthermore, an adherence promoter to substrate and other auxiliary agents (for example, an electrically conductive particle, a filler, a defoaming agent, a flame retardant, a leveling agent, a release promoter, an antioxidant, a perfume, a surface tension adjusting agent and a chain transfer agent) may be also used in combination.

By appropriately incorporating these components, the properties of the solder resist, such as stability, photographic property and film property, can be adjusted in a targeted manner.

The thermal polymerization inhibitor is described in detail, for example, in paragraphs [0101] and [0102] of JP-A-2008-250074.

The plasticizer is described in detail, for example, in paragraphs [0103] and [0104] of JP-A-2008-250074.

The colorant is described in detail, for example, in paragraphs [0105] and [0106] of JP-A-2008-250074 and paragraphs [0038] and [0039] of JP-A-2009-205029.

The adherence promoter is described in detail, for example, in paragraphs [0107] to [0109] of JP-A-2008-250074.

All of the additives described in these publications are usable for the polymerizable composition of the present invention.

The solid content concentration of the thus-obtained polymerizable composition of the present invention is preferably from 5 to 90 mass %, more preferably from 20 to 80 mass %, and most preferably from 40 to 60 mass %.

The use application of the polymerizable composition of the present invention is not particularly limited, but examples thereof include a solder resist, a light-blocking film for back surface of a silicon substrate in a solid-state imaging device, and a light-blocking film for wafer-level lens, with a solder resist being preferred.

In the case where the polymerizable composition of the present invention is used for a solder resist, in order to form a coated film having a relatively large thickness, the solid content concentration is preferably from 30 to 80 mass %, more preferably from 35 to 70 mass %, and most preferably from 40 to 60 mass %.

The viscosity of the polymerizable composition of the present invention is preferably from 1 to 3,000 mPa·s, more preferably from 10 to 2,000 mPa·s, and most preferably from 100 to 1,500 mPa·s.

In the case where the polymerizable composition of the present invention is used for a solder resist, in view of thick film formability and uniform coatability, the viscosity is preferably from 10 to 3,000 mPa·s, more preferably from 500 to 1,500 mPa·s, and most preferably from 700 to 1,400 mPa·s.

The present invention also relates to a photosensitive layer formed of the polymerizable composition of the present invention. This photosensitive layer is formed of the polymerizable composition of the present invention and therefore, is a photosensitive layer exhibiting high light-blocking effect in the infrared region and high light transparency in the visible region and being capable of forming a pattern having a desired profile as well excellent durability (for example, durability against high temperature/high humidity, or adherence to substrate).

The present invention also relates to a permanent pattern formed using the polymerizable composition of the present invention. The permanent pattern of the present invention is obtained by applying exposure and alkali development to the photosensitive layer formed of the polymerizable composition of the present invention and by virtue of using the polymerizable composition of the present invention, this is a pattern exhibiting high light-blocking effect in the infrared region and high light transparency in the visible region and having a desired profile as well excellent durability (for example, durability against high temperature/high humidity, or adherence to substrate).

Furthermore, the present invention also relates to a pattern forming method comprising, in order, a step of forming a photosensitive layer by using the polymerizable composition of the present invention, a step of pattern-exposing the photosensitive layer to cure the exposed area, and a step of removing the unexposed area by alkali development to form a permanent pattern.

The method for forming a permanent pattern by using the polymerizable composition of the present invention is described in detail below by referring, for example, a patterned solder resist. However, descriptions regarding the kind and amount used of the solvent for preparation of a coating solution, the coating method of the coating solution, the thickness of the photosensitive layer, the exposure step or other steps, and the like are not limited to the application to a solder resist. Here, for example, a case of forming a photosensitive layer (polymerizable composition layer) by using the polymerizable composition is described.

—Photosensitive Layer—

In order to form a patterned solder resist (solder resist pattern), a photosensitive layer is first formed using the polymerizable composition of the present invention. The photosensitive layer is not particularly limited as long as it is a layer formed by containing the polymerizable composition, and the film thickness, laminate structure and the like can be appropriately selected according to the purpose.

The method forming the photosensitive layer includes a method comprising dissolving, emulsifying or dispersing the polymerizable composition of the present invention in water or a solvent to prepare a coating solution, applying the coating solution directly on a support, and drying the coating to form the photosensitive layer.

The solvent for preparation of the coating solution is not particularly limited and may be appropriately selected according to the purpose from those capable of uniformly dissolving or dispersing respective components of the polymerizable composition of the present invention. Examples thereof include alcohols such as methanol, ethanol, normal propanol, isopropanol, normal butanol, secondary butanol and normal hexanol; ketones such as acetone, methyl ethyl ketone, methyl isobutyl ketone, cyclohexanone and diisobutyl ketone; esters such as ethyl acetate, butyl acetate, normal amyl acetate, methyl sulfate, ethyl propionate, dimethyl phthalate, ethyl benzoate, propylene glycol monomethyl ether acetate and methoxy propyl acetate; aromatic hydrocarbons such as toluene, xylene, benzene and ethylbenzene; halogenated hydrocarbons such as carbon tetrachloride, trichloroethylene, chloroform, 1,1,1-trichloroethane, methylene chloride and monochlorobenzene; ethers such as tetrahydrofuran, diethyl ether, ethylene glycol monomethyl ether, ethylene glycol monoethyl ether, 1-methoxy-2-propanol and propylene glycol monomethyl ether; dimethylformamide, dimethylacetamide, dimethylsulfoxide and sulfolane. One of these solvents may be used alone, or two or more thereof may be used in combination. Also, a known surfactant may be added.

The method for applying the coating solution on a support is not particularly limited and may be appropriately selected according to the purpose, and examples thereof include a coating method using a spin coater, a slit spin coater, a roll coater, a die coater or a curtain coater.

The conditions when drying the coating vary depending on respective components, the kind of solvent, the ratio used and the like but are usually a temperature of 60 to 150° C. and from 30 seconds to 15 minutes.

The thickness of the photosensitive layer is not particularly limited and may be appropriately selected according to the purpose but, for example, is preferably from 1 to 100 μm, more preferably from 2 to 50 μm, still more preferably from 4 to 30 μm.

(Solder Resist Pattern Forming Method)

The method for forming a solder resist permanent pattern by using the polymerizable composition for solder resist of the present invention comprises at least a exposure step and usually, further comprises a development step under conditions appropriately selected as needed and other steps. The term "exposure" as used in the present invention includes not only exposure to light at various wavelengths but also irradiation with radiation such as electron beam and i-line.

<Exposure Step>

The exposure step is a step of exposing the photosensitive layer formed of the polymerizable composition layer through a mask, and in this step, only the region irradiated with light is cured.

The exposure is preferably performed by the irradiation with radiation, and the radiation that can be used for exposure is preferably an electron beam, KrF, ArF, ultraviolet ray such as g-line, h-line and i-line, or visible light. Among these, g-line, h-line and i-line are preferred.

The exposure system includes, for example, stepper exposure and exposure using a high-pressure mercury lamp.

The exposure dose is preferably from 5 to 3,000 mJ/cm$^2$, more preferably from 10 to 2,000 mJ/cm$^2$, and most preferably from 50 to 1,000 mJ/cm$^2$.

<Other Steps>

Other steps are not particularly limited and may be appropriately selected according to the purpose. Examples thereof include a step of surface-treating a base material, a development step, a curing treatment step and a post-exposure step.

<Development Step>

Following the exposure step, alkali development (development step) is performed, whereby the portion not irradiated with light in the exposure step is dissolved out into an aqueous alkali solution. As a result, only the photocured portion remains, and a patterned solder resist having light-blocking effect is formed.

The developer is preferably an organic alkali developer that does not damage the underlying circuit. The development temperature is usually from 20 to 40° C., and the development time is from 10 to 180 seconds.

As for the alkali used in the developer, for example, an aqueous alkaline solution obtained by diluting an organic alkaline compound such as aqueous ammonia, ethylamine, diethylamine, dimethylethanolamine, tetramethylammonium hydroxide, tetraethylammonium hydroxide, choline, pyrrole, piperidine and 1,8-diazabicyclo-[5,4,0]-7-undecene with pure water to a concentration of generally from 0.001 to 10 mass %, preferably from 0.01 to 1 mass %, is used. In the case of using a developer composed of such an aqueous alkaline solution, the film after development is generally washed (rinsed) with pure water.

<Curing Treatment Step>

The curing treatment step is a step of, after the development step is performed, if desired, applying a curing treatment to the photosensitive layer in the formed pattern, and by performing this treatment, the mechanical strength of the permanent pattern is enhanced.

The curing treatment step is not particularly limited and may be appropriately selected according to the purpose, but examples thereof include an entire surface exposure treatment and an entire surface heating treatment.

The method for the entire surface exposure treatment includes, for example, a method of, after the development step, exposing the entire surface of the laminate having the patterned photosensitive layer formed. By the entire surface exposure, curing of the polymerization components in the polymerizable composition forming the photosensitive layer is promoted, and curing of the permanent pattern further proceeds, whereby the mechanical strength and durability are improved.

The apparatus used for performing the entire surface exposure is not particularly limited and may be appropriately selected according to the purpose. Preferred examples thereof include an UV exposure machine such as ultrahigh-pressure mercury lamp.

The method for the entire surface heating treatment includes a method of, after the development step, heating the entire surface of the laminate having the patterned photosensitive layer formed. By the entire surface heating, the film strength of the pattern is increased.

The heating temperature in the entire surface heating is preferably from 120 to 250° C. When the heating temperature is 120° C. or more, the film strength is increased by the heating treatment, and when it is 250° C. or less, the film quality can be prevented from becoming weak and brittle due to decomposition of the resin in the photopolymerizable composition.

The heating time in the entire surface heating is preferably from 3 to 180 minutes, more preferably from 5 to 120 minutes.

The apparatus used for performing the entire surface heating is not particularly limited and may be appropriately selected according to the purpose from conventional apparatuses. Examples thereof include a dry oven, a hot plate and an IR heater.

The thus-formed patterned resist has an excellent infrared-blocking effect and therefore, has a wide range of application. The polymerizable composition has an excellent light-blocking effect in the infrared region and light transparency in the ultraviolet to visible region, so that a pattern having an excellent profile can be formed. At the same time, the pattern (cured film) formed has an excellent infrared-blocking effect and in turn, is useful in forming a solder resist for a device with a photodiode having sensitivity even to the infrared region, particularly, a solid-state imaging device.

As described above, the polymerizable composition of the present invention is useful for the formation of not only a solder resist but also a light-blocking film for back surface of a silicon substrate in a solid-state imaging device, or a light-blocking film for wafer-level lens.

In this way, the present invention also relates to a solid-state imaging device having a permanent pattern formed of the polymerizable composition of the present invention.

The solid-state imaging device according to an embodiment of the present invention is described below by referring to FIGS. 1 and 2, but the present invention is not limited the following specific example.

Figure 2:
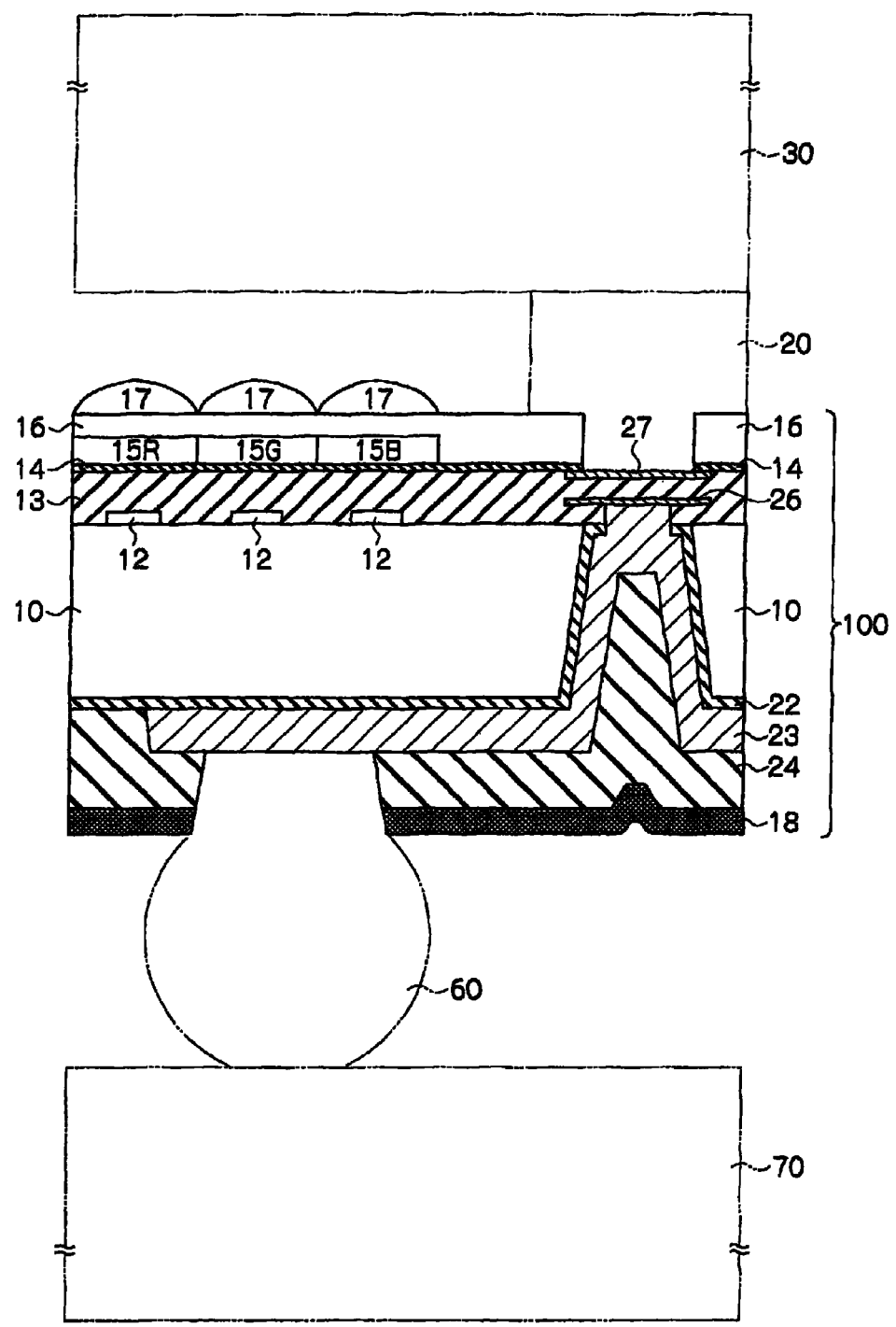
FIG. 2 is a schematic cross-sectional view showing the solid-state imaging device according to an embodiment of the present invention.

Incidentally, common numerical references are used for the portions common between FIG. 1 and FIG. 2.

Also, in the description, the "top", "above" and "upper side" indicate the side father from the silicon substrate 10, and the "bottom", "below" and "lower side" indicate the side closer to the silicon substrate 10.

FIG. 1 is a schematic cross-sectional view showing a configuration of a camera module having a solid-state imaging device according to a specific example of the one embodiment above.

In FIG. 1, the camera module 200 is connected to a circuit substrate 70 as a package substrate through a solder ball 60 as a connection member.

In detail, the camera module 200 is configured to include a solid-state imaging device substrate 100 having an imaging element part on the first major surface of a silicon substrate, a glass substrate 30 (light transmitting substrate) disposed above the first major surface of the solid-state imaging device substrate 100, an infrared cut filter 42 disposed above the glass substrate 30, a lens holder 50 being disposed above the glass substrate 30 and the infrared cut filter 42 and having an imaging lens 40 in the internal space, and a light-blocking and electromagnetic shield 44 disposed to surround the peripheries of the solid-state imaging device substrate 100 and the glass substrate 30. Each member is bonded through an adhesive 20, 41, 43 or 45.

In the camera module 200, incident light hv from the outside sequentially passes through the imaging lens 40, the infrared cut filter 42 and the glass substrate 30 and reaches the imaging device part of the solid-state imaging device substrate 100.

Also, the camera module 200 is connected to a circuit substrate 70 through a solder ball 60 (connection material) on the second major surface side of the solid-state imaging device substrate 100.

FIG. 2 is a cross-sectional view on an enlarged scale showing the solid-state imaging device substrate 100 in FIG. 1.

The solid-state imaging device substrate 100 is configured to include a silicon substrate 10 as a base body, an imaging element 12, an interlayer insulating film 13, a base layer 14, a red color filter 15R, a green color filter 15G, a blue color filter 15B, an overcoat 16, a microlens 17, a light-blocking film 18, an insulating film 22, a metal electrode 23, a solder resist layer 24, an internal electrode 26, and a device surface electrode 27.

The solder resist layer 24 may be omitted.

First, the configuration on the first major surface side of a solid-state imaging device substrate 100 is mainly described.

As shown in FIG. 2, an imaging element part where a plurality of imaging elements 12 such as CCD and CMOS are two-dimensionally arranged is provided on the first major surface side of a silicon substrate 10 that is the base body of the solid-state imaging device substrate 100.

An interlayer insulating film 13 is formed on the imaging element 12 in the imaging element part, and a base layer 14 is formed on the interlayer insulating film 13. Furthermore, a red color filter 15R, a green color filter 15G and a blue color filter 15B (hereinafter sometimes collectively referred to as "color filter 15") are disposed on the base layer 14 to correspond to respective imaging elements 12.

A light-blocking film not shown may be provided in the boundaries of the red color filter 15R, the green color filter 15G and the blue color filter 15B and in the peripheries of the imaging element part. This light-blocking film can be produced, for example, by using a known black color resist.

An overcoat 16 is formed on the color filter 15, and a microlens 17 is formed on the overcoat 16 to correspond to the imaging element 12 (color filter 15).

A peripheral circuit (not shown) and an internal electrode 26 are provided in the periphery of the imaging element part on the first major surface side, and the internal electrode 26 is electrically connected to the imaging element 12 through the peripheral circuit.

Furthermore, a device surface electrode 27 is formed on the internal electrode 26 through the interlayer insulating film 13, and in the interlayer insulating film 13 between the internal electrode 26 and the device surface electrode 27, a contact plug (not shown) for electrically connecting these electrodes is formed. The device surface electrode 27 is used, for example, for applying a voltage or reading a signal through the contact plug and the internal electrode 26.

A base layer 14 is formed on the device surface electrode 27, and an overcoat 16 is formed on the base layer 14. The base layer 14 and the overcoat 16 formed on the device surface electrode 27 are opened to form a pad opening part, and a part of the device surface electrode 27 is thereby exposed.

This is the configuration on the first major surface side of the solid-state imaging device substrate 100.

On the first major surface side of the solid-state imaging device substrate 100, an adhesive 20 is provided in the periphery of the imaging element part, and the solid-state imaging device substrate 100 and the glass substrate 30 are bonded through the adhesive 20.

Also, the silicon substrate 10 has a through hole penetrating the silicon substrate 10, and a through-electrode as a part of a metal electrode 23 is provided inside the through hole. The imaging element part and a circuit substrate 70 are electrically connected by the through-electrode.

The configuration on the second major surface side of the solid-state imaging device substrate 100 is mainly described below.

On the second major surface side, an insulating film 22 is formed over an area from the second major surface to the inner wall of the through hole.

A metal electrode 23 patterned to extend from the region on the second major surface of the silicon substrate 10 to the inside of the through hole is provided on the insulating film 22. The metal electrode 23 is an electrode for connection between the imaging element part in the solid-state imaging device substrate 100 and a circuit substrate 70.

Out of this metal electrode 23, the portion formed inside the through hole is the through-electrode. The through-electrode penetrates a part of the silicon substrate 10 and the interlayer insulating film to reach below the internal electrode 26 and electrically connected to the internal electrode 26.

Furthermore, on the second major surface side, a solder resist layer 24 (protective insulating film) covering the second major surface on which the metal electrode 23 is formed, and having an opening part exposing a part of the metal electrode 23, is provided.

In addition, on the second major surface side, a light-blocking film 18 covering the second major surface on which the solder resist layer 24 is formed, and having an opening part exposing a part of the metal electrode 23, is provided.

In this configuration, (1) a light-blocking solder resist layer where the light-blocking film 18 and the solder resist layer 24 are united into a single layer may be formed of the polymerizable composition of the present invention, or (2) while the light-blocking layer 18 and the solder resist layer 24 are separate layers, the light-blocking film 18 may be formed of the polymerizable composition of the present invention (in this case, the solder resist layer may be formed of a known solder resist composition).

Incidentally, in FIG. 2, the light-blocking film 18 is patterned to cover a part of the metal electrode 23 and expose the remaining portion but may be patterned to expose the entirety of the metal electrode 23 (the same applies to the patterning of the solder resist layer 24).

Also, the solder resist layer 24 may be omitted, or the light-blocking film 18 may be formed directly on the second major surface where the metal electrode 23 is formed.

A solder ball 60 as a connection member is provided on the exposed metal electrode 23, and the metal electrode 23 of the solid-state imaging device substrate 100 and the connection electrode not shown of the circuit substrate 70 are electrically connected through the solder ball 60.

In the above, the configuration of the solid-state device substrate 100 is described, but each part except for the light-blocking film 18 of the solid-state imaging device substrate 100 can be formed by a known method such as method described in paragraphs 0033 to 0068 of JP-a-2009-158863 and method described in paragraphs 0036 to 0065 of JP-A-2009-99591.

The light-blocking film 18 can be formed by the above-described production method for the light-blocking film of the present invention.

The interlayer insulating film 13 is formed, for example, as an $SiO_2$ film or an SiN film by sputtering, CVD (chemical vapor deposition) or the like.

The color filter 15 is formed, for example, by photolithography using a known color resist.

The overcoat 16 and the base layer 14 are formed, for example, by photolithography using a known resist for organic interlayer film formation.

The microlens 17 is formed, for example, by photolithography using a styrene-based resin or the like.

In the case where the solder resist layer 24 and the light-blocking layer 18 are combined to form a light-blocking solder resist layer as a single layer, the layer is preferably formed of the polymerizable composition of the present invention.

On the other hand, when the solder resist layer 24 and the light-blocking film 18 are separate layers, the solder resist layer 24 is preferably formed, for example, by photolithography using a known solder resist containing a phenolic resin, a polyimide-based resin or an amine-based resin.

The solder ball 60 is formed, for example, using Sn—Pb (eutectic), 95Pb—Sn (high-lead high-melting-point solder) or a Pb-free solder such as Sn—Ag, Sn—Cu and Sn—Ag—Cu. The solder ball 60 is formed, for example, as a sphere having a diameter of 100 to 1,000 µm (preferably a diameter of 150 to 700 µm).

The internal electrode 26 and the device surface electrode 27 are formed as a metal electrode such as Cu, for example, by CMP (chemical mechanical polishing), photolithography or etching.

The metal electrode 23 is formed as a metal electrode such as Cu, Au, Al, Ni, W, Pt, Mo, Cu compound, W compound and Mo compound, for example, by sputtering, photolithography, etching or electrolytic plating. The metal electrode 23 may be in a single-layer configuration or a multilayer configuration consisting of two or more layers.

The film thickness of the metal electrode 23 is, for example, from 0.1 to 20 µm (preferably from 0.1 to 10 µm. The silicon substrate 10 is not particularly limited, but a silicon substrate reduced in the thickness by shaving the back surface of the substrate may be used. The thickness of the substrate is not limited, but, for example, a silicon wafer having a thickness of 20 to 200 µm (preferably from 30 to 150 µm) is used.

The through hole of the silicon substrate 10 is formed, for example, by photolithography and RIE (reactive ion etching).

In the forgoing pages, the solid-state imaging device substrate 100 as a specific example of the above-described one embodiment is described by referring to FIGS. 1 and 2, but the one embodiment is not limited to the mode of FIG. 1 and FIG. 2, and the configuration of the embodiment is not particularly limited as long as it is a configuration having a metal electrode and a light-blocking film on the back surface side.

An example where the permanent pattern obtained using the polymerizable composition of the present invention is applied to the light-blocking film of a wafer-level lens is described below by referring to the drawings.

Figure 3:
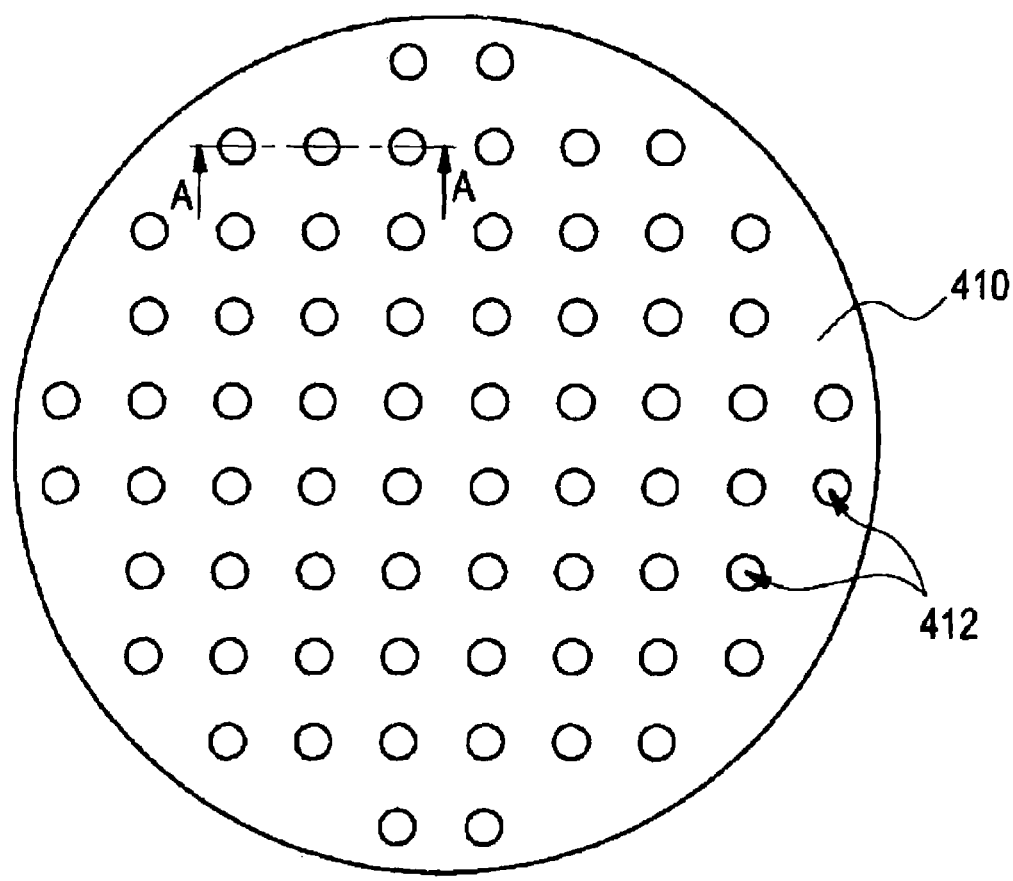
FIG. 3 is a plan view showing one example of the wafer-level lens array.

FIG. 3 is a plan view showing one example of the configuration of a wafer-level lens array having a plurality of wafer-level lenses.

As shown in FIG. 3, the wafer-level lens array has a substrate 410 and lenses 412 arranged on the substrate 410. here, in FIG. 3, a plurality of lenses 412 are two-dimensionally arranged with respect to the substrate 410 but may be one-dimensionally arranged.

Figure 4:
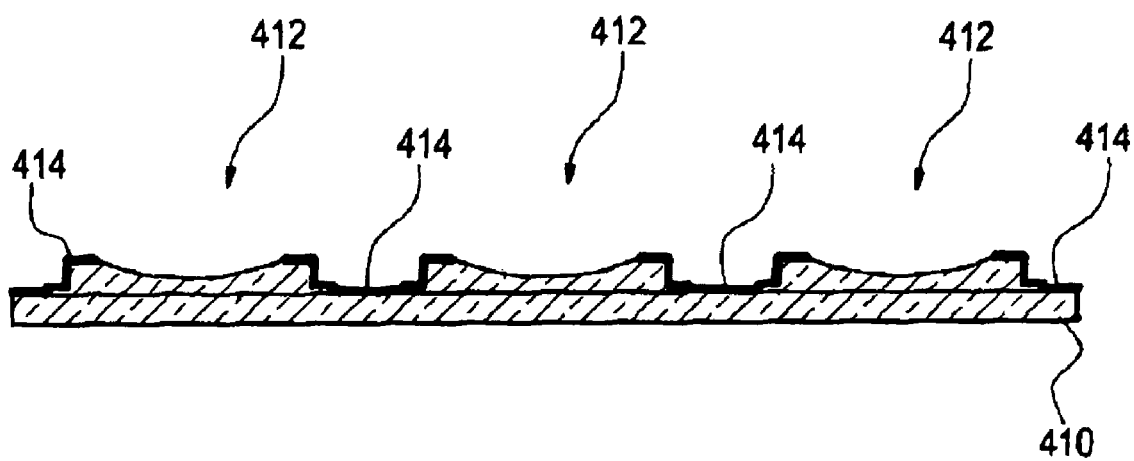
FIG. 4 is a cross-sectional view along line A-A in FIG. 3.

FIG. 4 is a cross-sectional view along line A-A in FIG. 3.

As shown in FIG. 4, in the waver-level lens array, a light-blocking film 414 for preventing light transmission through a portion except for the lens 412 is provided between a plurality of lenses 412 arranged on the substrate 410.

The wafer-level lens is composed of one lens 412 present on the substrate 410 and a light-blocking film 414 provided in the circumferential periphery thereof. The polymerizable composition of the present invention is used for formation of this light-blocking film 414.

The wafer-level lens is described below by referring, for example, to a configuration where, as shown in FIG. 3, a plurality of lenses 412 are two-dimensionally arranged with respect to a substrate 410.

The lens 412 is generally composed of the same material as the substrate 410 and is molded integrally on the substrate 410 or is molded as a separate structure and fixed on the substrate. Here, an example is described, but the wafer-level lens is not limited to this embodiment and may take various embodiments such as a wafer-level lens having a multilayer structure or a wafer-level lens separated into a lens module by dicing.

The material forming the lens 412 includes, for example, glass. There are an abundant variety of glasses, and since glass having a high refractive index can be selected, this is suitable as the material of the lens. Also, the glass is excellent in the heat resistance and has the advantage of withstanding the reflow mounting on an imaging unit or the like.

Other materials for forming the lens 412 include a resin. The resin is excellent in the processability and is suitable for simply and inexpensively forming a lens surface by a mold or the like.

In this case, an energy-curable resin is preferably used for formation of the lens 412. The energy-curable resin may be either a resin capable of curing by heat or a resin capable of curing by irradiation with an active energy ray (for example, irradiation with heat, ultraviolet ray or electron beam).

As the energy-curable resin, all of known resins may be used, but in consideration of reflow mounting of the imaging unit, a resin having a relatively high softening point, for example, a softening point of 200° C. or more is preferred. A resin having a softening point of 250° C. or more is more preferred.

The mode and production of the wafer-level lens are specifically described below by referring, for example, to the production method of a wafer-level lens array based on FIGS. 5 to 10.

[Mode and Production (1) of Wafer-Level Lens]

—Formation of Lens—

The method for forming a lens 412 on a substrate 410 is described by referring to FIG. 5 and FIGS. 6A to 6C.

Figure 5:
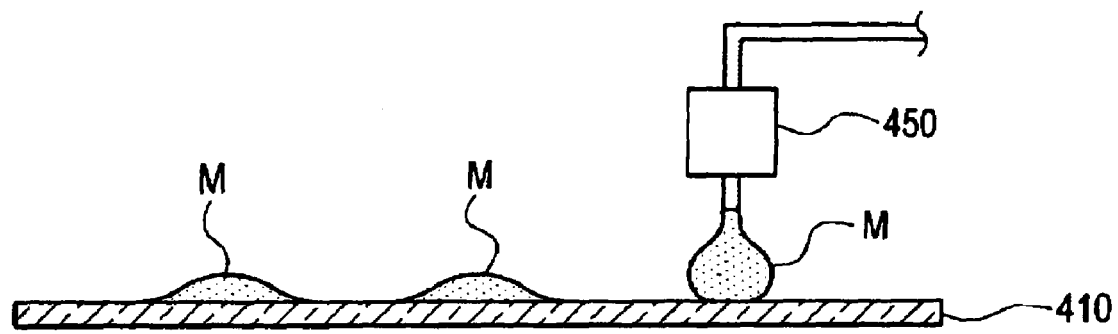
FIG. 5 is a view showing how a molding material working out to a lens is supplied to a substrate.

FIG. 5 is a view showing how a molding material (indicated by M in FIG. 5) as a resin composition for lens formation is supplied to a substrate 410.

Figure 6A:
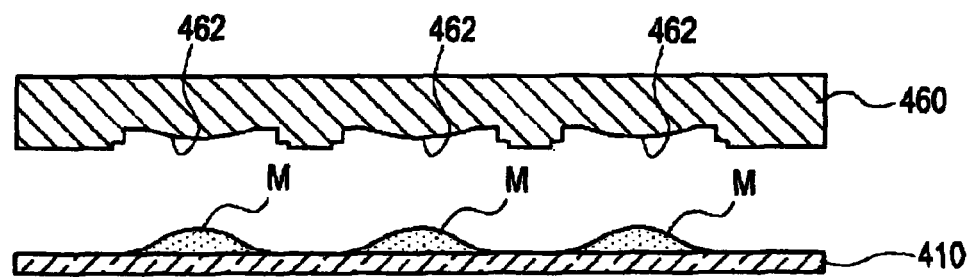
FIGS. 6A to 6C are views showing the procedure of molding a lens on a substrate by using a mold.
Figure 6B:
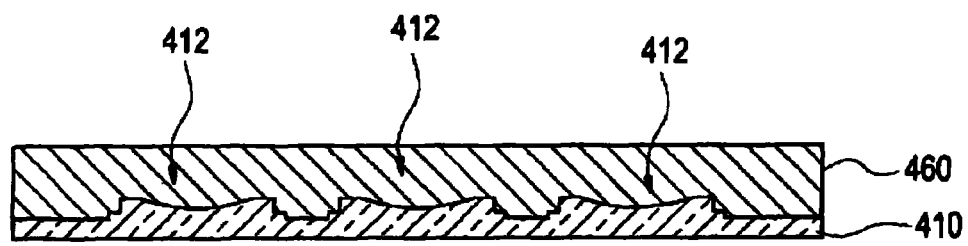
Figure 6C:
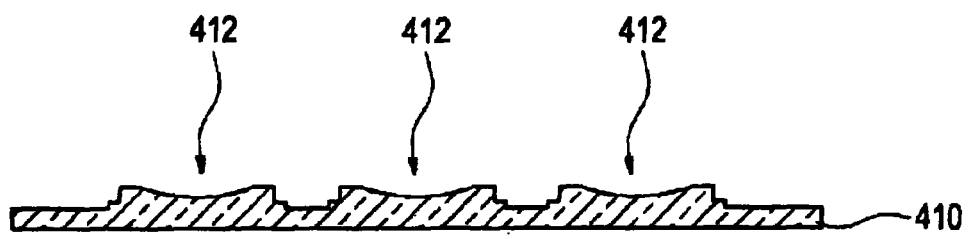

Also, FIGS. 6A to 6C are views showing the procedure of molding a lens 412 on a substrate 410 by using a mold 460.

As shown in FIG. 5, a molding material M is dropped on a lens 412 molding site of a substrate 410 by using a dispenser 450. Here, a molding material M in an amount corresponding to one lens 412 is supplied to one site to be fed.

After supplying the molding material M to the substrate 410, as shown in FIG. 6A, a mold 460 for molding lenses 412 is disposed on the substrate 410 surface side to which the molding material M is supplied.

In the mold 460, concaves 462 for transferring the lens 412 shape are provided according to the desired number of lenses 412.

As shown in FIG. 6B, the mold 460 is pressed against molding material M on the substrate 410 to deform the molding material M along the lines of the concave 462 shape. In the state of the mold 460 being pressed against the molding material M, when the molding material M is a thermosetting resin or an ultraviolet-curable resin, the mold 460 is externally irradiated with heat or ultraviolet ray to cure the molding material M.

After curing the molding material M, as shown in FIG. 6C, the substrate 410 and lenses 412 are separated from the mold 460.

—Formation of Light-Blocking Film—

The method for forming a light-blocking film 414 in the circumferential periphery of the lens 412 is described below by referring to FIGS. 7A to 7C.

Figure 7A:
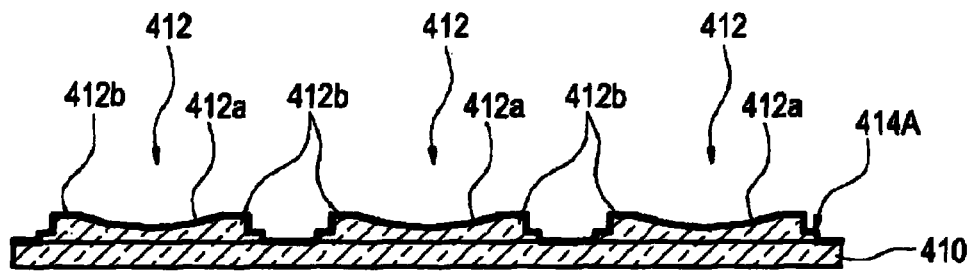
FIGS. 7A to 7C are schematic views showing the process of forming a patterned light-blocking film on a substrate having molded thereon a lens.
Figure 7B:
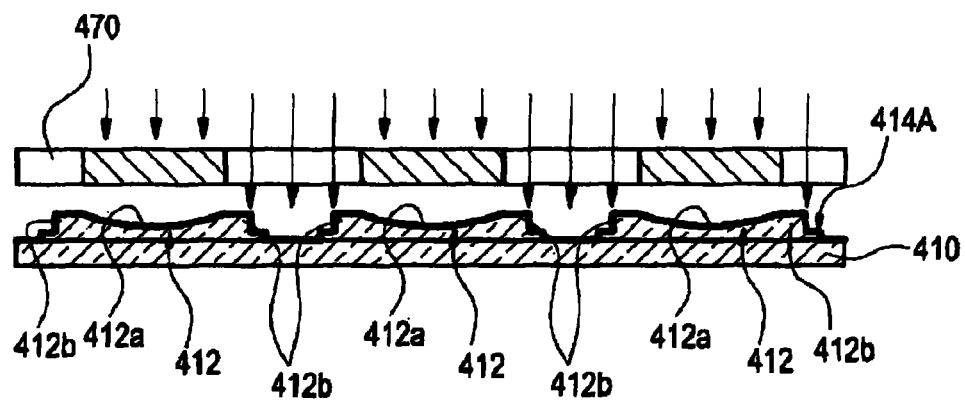
Figure 7C:
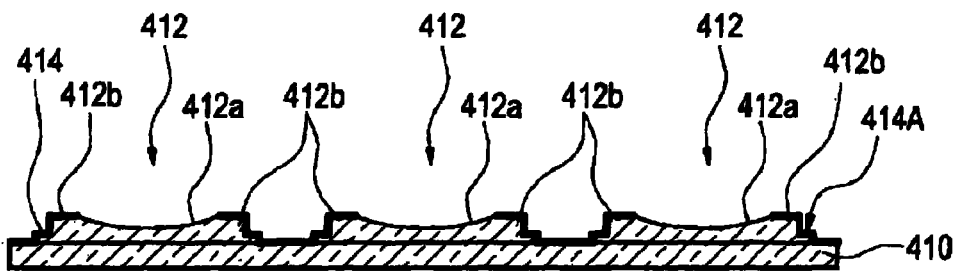

FIGS. 7A to 7C are schematic cross-sectional views showing the process of providing a light-blocking film 414 on the substrate 410 having molded thereon lenses 412.

The method for forming the light-blocking film 414 includes a light-blocking coating layer forming step of coating the polymerizable composition of the present invention on a substrate 410 to form a light-blocking coating layer 414A (see, FIG. 7A), an exposure step of pattern-exposing the light-blocking coating layer 414A through a mask 470 (see, FIG. 7B), and a development step of developing the light-blocking coating layer 414A after exposure to remove the uncured area and form a patterned light-blocking film 414 (see, FIG. 7C).

Incidentally, formation of the light-blocking film 414 can be arbitrarily performed before producing the lens 412 or after the lens 412 is produced, but here, the method of performing the formation after production of the lens 412 is described in detail.

The steps in the method of forming the light-blocking film 414 are described below.

<Light-Blocking Coating Layer Forming Step>

In the light-blocking coating layer forming step, as shown in FIG. 7(A), a polymerizable composition is coated on a substrate 410 to form a light-blocking coating layer 414A having low optical reflectance and being composed of the polymerizable composition. At this time, the light-blocking coating layer 414A is formed to cover all of the substrate 410 surface and the lens surface 412a and lens edge 412b surface of the lens 412.

The substrate 410 which can be used in this step is not particularly limited. Examples thereof include soda glass, alkali-free glass, Pyrex (registered trademark) glass, quartz glass and transparent resin.

The substrate 410 as used herein indicates an embodiment containing both the lens 412 and the substrate 410 in the case of integrally forming the lens 412 and the substrate 410.

On the substrate 410, if desired, an undercoat layer may be provided so as to improve adherence to an overlying layer, prevent diffusion of the material, or flatten the substrate 410 surface.

As the method for coating the polymerizable composition on the substrate 410 and the lens 412, various coating methods such as slit coating, spray coating, inkjet printing, spin coating, cast coating, roll coating and screen printing may be applied.

In view of thickness uniformity of the coated film and easy drying of the coating solvent, the film thickness immediately after coating of the polymerizable composition is preferably from 0.1 to 10 µm, more preferably from 0.2 to 5 µm, still more preferably from 0.2 to 3 µm.

Drying (prebaking) of the light-blocking coating layer 414A coated on the substrate 410 may be performed using a hot plate, an oven or the like at a temperature of 50 to 140° C. for 10 to 300 seconds.

The thickness of the coated film after drying of the polymerizable composition (hereinafter, sometimes referred to as "dry thickness") may be arbitrarily selected by taking into consideration the performance such as desired light-blocking effect and is generally from 0.1 µm to less than 50 µm.

<Exposure Step>

In the exposure step, the light-blocking coating layer 414A formed in the light-blocking coating layer forming step is pattern-exposed. The pattern exposure may be scanning exposure, but an embodiment of, as shown in FIG. 7B, performing the exposure through a mask 70 having a predetermined mask pattern is preferred.

As for the exposure in this step, the pattern exposure of the light-blocking coating layer 414A is performed by exposure through a predetermined mask pattern, where only the portion irradiated with light out of the light-blocking coating layer 414A is cured by the exposure. In this exposure, a mask pattern allowing for irradiation with light on the lens edge 412b surface and the substrate 410 surface between lenses 412 is used. By using such a mask pattern, the light-blocking coating layer 414A only in the region excluding the lens surface 412a is cured by the irradiation with light, and the cured region forms the light-blocking film 414.

The radiation which can be used for exposure is preferably an ultraviolet ray such as g-line, h-line and i-line. For this radiation, a light source having a single wavelength may be used, or a light source containing all wavelengths, such as high-pressure mercury lamp, may be used.

<Development Step>

Subsequently, alkali development (development step) is performed, whereby the portion not irradiated with light in the exposure, that is, the uncured region of the light-blocking coating layer 414A, is dissolved out into an aqueous alkali solution and only the region cured by the irradiation with light is allowed to remain.

Specifically, by developing the light-blocking coating layer 414A exposed as shown in FIG. 7B, only the light-blocking coating layer 414A formed on the lens surface 12a is, as shown in FIG. 7C, removed and a light-blocking film 414 cured is formed in other regions.

As the alkali agent contained in the developer (aqueous alkaline solution) used in the development step, all of an organic alkali agent, an inorganic alkali agent and a combination thereof may be used. For the light-blocking film formation in the present invention, an organic alkali agent is preferably used, because it scarcely damages the neighboring circuit or the like.

Examples of the alkali agent used in the developer include an organic alkaline compound (organic alkali agent) such as aqueous ammonia, ethylamine, diethylamine, dimethylethanolamine, tetramethylammonium hydroxide, tetraethylammonium hydroxide, choline, pyrrole, piperidine and 1,8-diazabicyclo-[5,4,0]-7-undecene, and an inorganic compound (inorganic alkali agent) such as sodium hydroxide, potassium hydroxide, sodium hydrogencarbonate and potassium hydrogencarbonate. An aqueous alkaline solution obtained by diluting such an alkali agent with pure water to a concentration of 0.001 to 10 mass %, preferably from 0.01 to 1 mass %, is preferably used as the developer.

The development temperature is usually from 20 to 30° C., and the development time is from 20 to 90 seconds.

In the case of using a developer composed of such an aqueous alkaline solution, after removing the unexposed area of the coated film with a developer, the film is generally washed (rinsed) with pure water. That is, after the development, the film is thoroughly washed with pure water to remove the excess developer and then further subjected to a drying step.

Incidentally, after performing the above-described light-blocking coating layer forming step, exposure step and development step, a curing step of curing the formed light-blocking film (light-blocking pattern) by heating (post-baking) and/or exposure may be provided, if desired.

The post-baking is a heating treatment after development so as to achieve complete curing, and a thermal curing treatment usually at 100 to 250° C. is performed. The conditions of post-baking, such as temperature and time, may be appropriately set according to the material of the substrate 410 or lens 412. For example, when the substrate 412 is glass, out of the temperature range above, a temperature of 180 to 240° C. is preferably used.

This post-baking treatment is applied to the light-blocking film 414 formed after development and can be performed in a continuous system or a batch system by using a heating device such as hot plate, convection oven (hot air circulating drier) and high-frequency heater to establish the above-described conditions.

The procedure above is described by referring, for example, a case where the lens 412 has a concave shape, but the shape is not particularly limited and may be convex or aspheric. Also, the procedure above is described by referring, for example, a wafer-level lens where a plurality of lenses 412 are molded on one surface of a substrate 410, but a configuration where a plurality of lenses 412 are molded on both surfaces of a substrate 410 may be also employed and in this case, the patterned light-blocking film 414 is formed on both surfaces in the regions excluding lens surfaces.

[Mode and Production (2) of Wafer-Level Lens]

Figure 8:
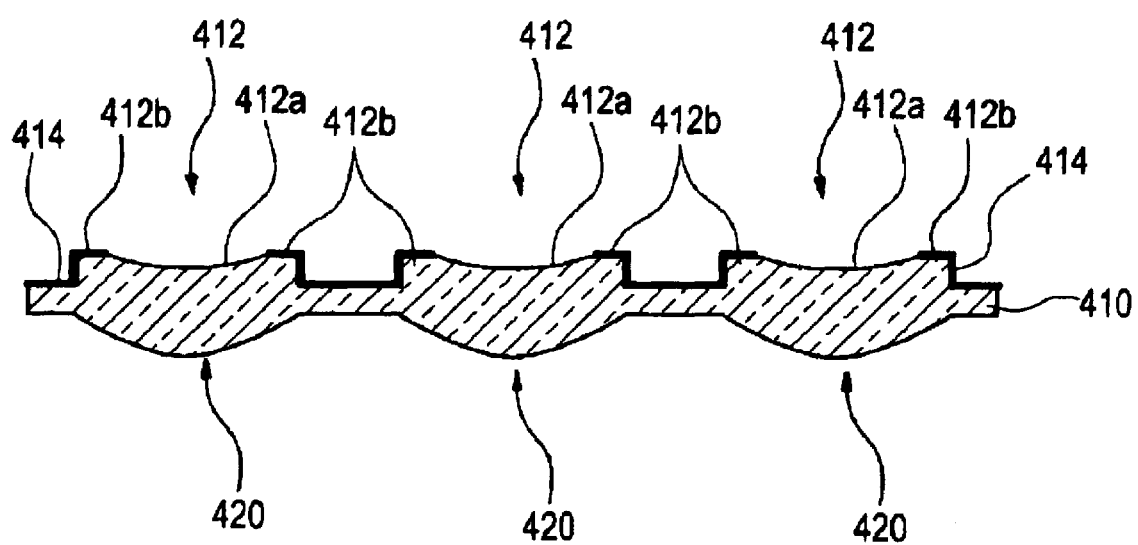
FIG. 8 is a cross-sectional view showing one example of the wafer-level lens array.

FIG. 8 is a view showing another configuration example of the wafer-level lens array.

The wafer-level lens shown in FIG. 8 is in a configuration (monolithic type) where the substrate 410 and the lens 412 are simultaneously molded using the same molding material.

As the molding material for the preparation of such a wafer-level lens, the same as those described above may be used. Also, in this example, a plurality of concave lenses 412 are formed on one surface (surface on the upper side in the Figure) of a substrate 410, and a plurality of convex lenses 420 are formed on another surface (surface on the lower side in the Figure). Furthermore, a patterned light-blocking film 414 is formed in the regions excluding lens surfaces 412a of the substrate 410, that is, formed on the substrate 410 surface and the lens edge 412b surface. As the patterning method when forming the light-blocking film 414, the above-described procedure may be applied.

[Mode and Production (3) of Wafer-Level Lens]

Still another configuration example of the wafer-level lens array and the production procedure therefor are described below by referring to FIGS. 9A to 9C and FIGS. 10A to 10C.

Figure 9A:
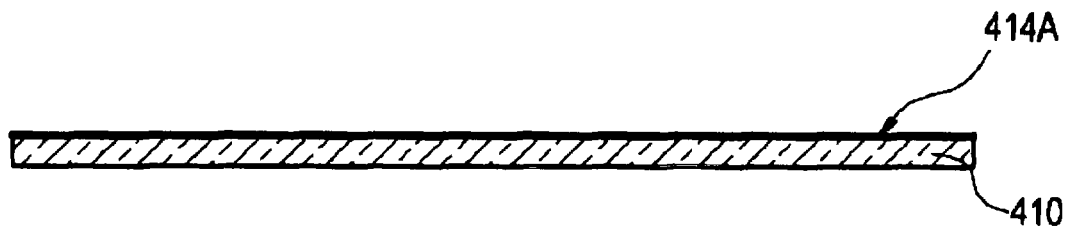
FIGS. 9A to 9C are schematic views showing another embodiment of the process of forming a light-blocking film.
Figure 9B:
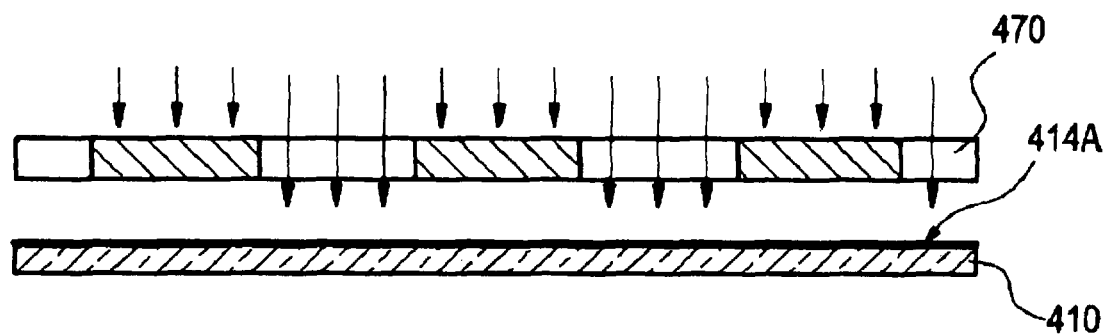
Figure 9C:
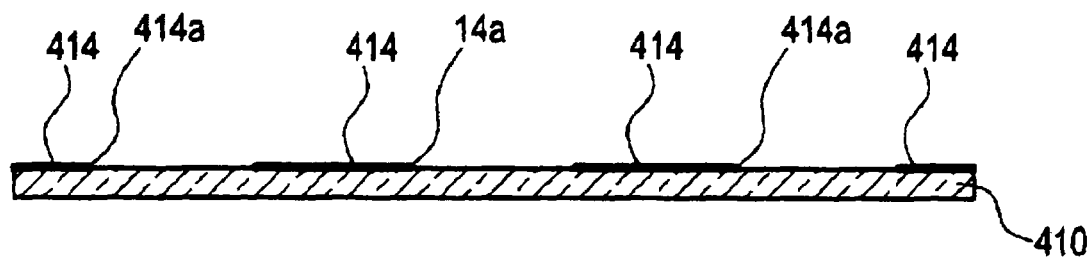

FIGS. 9A to 9C are schematic views showing another process of forming a patterned light-blocking film 414.

Figure 10A:
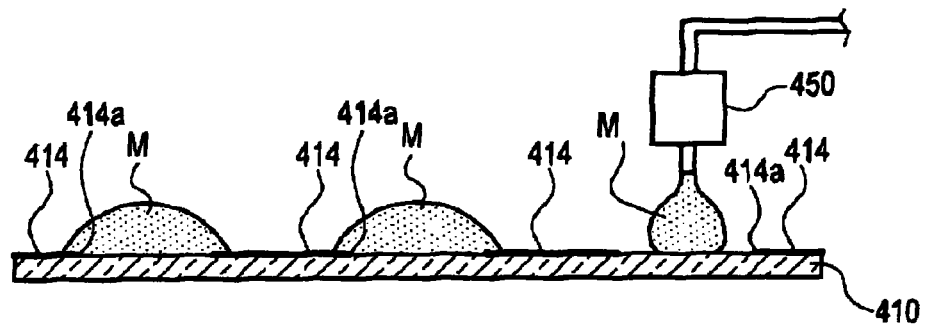
FIGS. 10A to 10C are schematic views showing the process of molding a lens on a substrate having thereon a patterned light-blocking film.
Figure 10B:
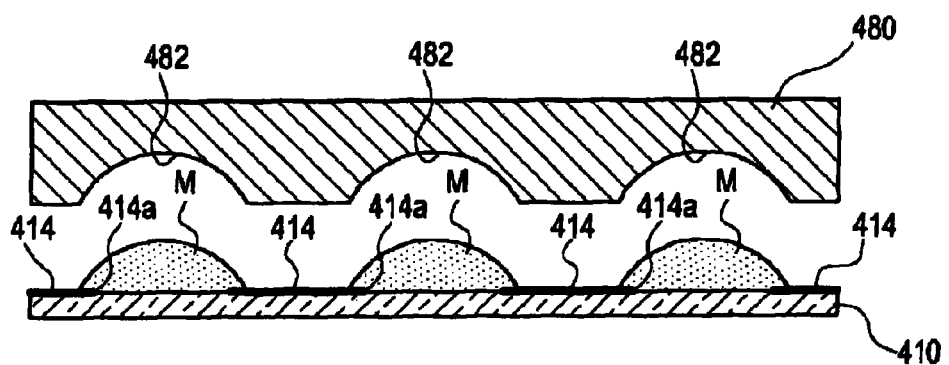
Figure 10C:
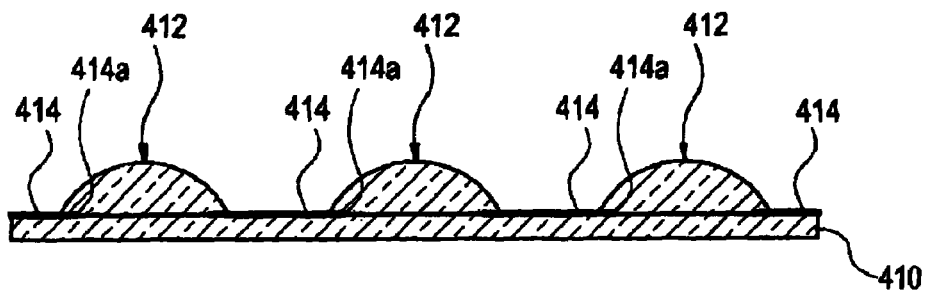

FIGS. 10A to 10C are schematic views showing the process of first forming a patterned light-blocking film 414 and next molding a lens 412.

In the example of the wafer-level lens array shown in FIGS. 5 to 8, a patterned light-blocking film 414 is formed on a substrate 410 having provided thereon a lens 412, but in the following procedure, a patterned light-blocking film 414 is first formed on a substrate 410 and a lens 412 is then molded on the substrate 410.

—Formation of Light-Blocking Film—

As shown in FIG. 9A, first, a light-blocking coating layer forming step of coating a polymerizable composition on a substrate 410 to form a light-blocking coating layer 414A is performed.

Thereafter, drying of the light-blocking coating layer 414A formed on the substrate 410 is performed using a hot plate, an oven or the like at a temperature of 50 to 140° C. for 10 to 300 seconds. The dry thickness of the polymerizable composition may be arbitrarily selected according to the performance such as desired light-blocking effect but is generally from 0.1 μm to less than 50 μm.

Next, as shown in FIG. 9B, an exposure step of patternwise exposing the light-blocking coating layer 414A formed in the light-blocking coating layer forming step, through a mask 470 is performed. The mask 470 has a predetermined mask pattern.

In the exposure of this step, the light-blocking coating layer 414 is pattern-exposed, whereby only the portion irradiated with light out of the light-blocking coating layer 414A is cured. Here, a mask pattern allowing for irradiation with light only on the light-blocking coating layer 414A in the region excluding the site working out to a lens opening 414a of a lens 412 when the lens 412 is molded in the later step, is used. By this method, the light-blocking coating layer 414A only in the region excluding the site working out to a lens opening 414a of a lens 412 is cured by the irradiation with light. As for the radiation which can be used for the exposure, an ultraviolet ray such as g-line, h-line and i-line is preferably used, similarly to the procedure described earlier.

Subsequently, alkali development (development step) is performed, whereby the light-blocking coating layer 414A only in the region corresponding to a lens opening 414a of a lens 412, which is the light-blocking coating layer 414A region uncured in the pattern exposure above, is dissolved out into an aqueous alkali solution. At this time, as shown in FIG. 9C, the photocured light-blocking coating layer 414A in the region excluding the region for a lens opening 414a of a lens 412 remains on the substrate 410 and forms a light-blocking film 414.

As for the alkali agent in the aqueous alkali solution that is the developer, the same as in the procedure described earlier may be used.

After the development, the excess developer is removed by washing, and the film is then dried.

Also in this embodiment, after performing the above-described light-blocking coating layer forming step, exposure step and development step, a curing step of curing the formed light-blocking film by post-baking and/or exposure may be provided, if desired.

The polymerizable composition of the present invention can be easily cleaned and removed with a known cleaning solution even when it attaches, for example, to a nozzle at the discharge port of the coating apparatus, a piping area of the coating apparatus, or the interior of the coating apparatus. In this case, in order to more efficiently perform the cleaning and removal, a solvent described above as the solvent contained in the polymerizable composition of the present invention is preferably used for the cleaning solution.

Furthermore, cleaning solutions described, for example, in JP-A-7-128867, JP-A-7-146562, JP-A-8-278637, JP-A-2000-273370, JP-A-2006-85140, JP-A-2006-291191, JP-A-2007-2101, JP-A-2007-2102 and JP-A-2007-281523 may be also suitably used as the cleaning solution for cleaning and removing the polymerizable composition of the present invention.

As the cleaning solution, an alkylene glycol monoalkyl ether carboxylate or an alkylene glycol monoalkyl ether is preferably used.

One of these solvent usable as the cleaning solution may be used alone, or two or more thereof may be mixed and used.

In the case of mixing two or more solvents, a mixed solvent obtained by mixing a hydroxyl group-containing solvent and a hydroxyl group-free solvent is preferred. The mass ratio between the hydroxyl group-containing solvent and the hydroxyl group-free solvent is from 1/99 to 99/1, preferably from 10/90 to 90/10, more preferably from 20/80 to 80/20. The mixed solvent is preferably a mixed solvent of propylene glycol monomethyl ether acetate (PGMEA, another name: 1-methoxy-2-acetoxypropane) and propylene glycol monomethyl ether (PGME, another name: 1-methoxy-2-propanol) in a ratio of 60/40.

Incidentally, in order to enhance the permeability of the cleaning solution into the polymerizable composition, a surfactant described above as the surfactant which can be incorporated into the polymerizable composition may be added to the cleaning solution.

—Formation of Lens—

A step of forming a lens 412 after the formation of the light-blocking film 414 is described below.

As shown in FIG. 10A, a molding material M constituting the lens 412 is dropped by a dispenser 450 on the substrate 410 having formed thereon the patterned light-blocking film 414. The molding material M is supplied to cover the region corresponding to a lens opening 414a of a lens 412, including a part of the light-blocking film 414 edge adjacent to the opening.

After supplying the molding material M to the substrate 410, as shown in FIG. 10B, a mold 480 for molding lenses is disposed on the substrate 410 surface side to which the molding material M is supplied. In the mold 480, concaves 482 for transferring the lens 412 shape are provided according to the desired number of lenses 412.

The mold 480 is pressed against the molding material M on the substrate 410 to deform the molding material M along the lines of the concave shape. In the state of the mold 480 being pressed against the molding material M, when the molding material M is a thermosetting resin or an ultraviolet-curable resin, the mold is externally irradiated with heat or ultraviolet ray to cure the molding material M.

After curing the molding material M, the substrate 410 and lenses 412 are separated from the mold 480 to obtain a wafer-level lens having, as shown in FIG. 10C, a patterned light-blocking film 414 on a substrate 410.

In this way, the wafer-level lens may have not only a configuration where the patterned light-blocking film 414 is provided, as shown in FIG. 7, in the region excluding a lens surface 412a of a lens 412, but also a configuration where the light-blocking film 414 is provided, as shown in FIG. 10C, in the region excluding a lens opening 414a of a lens 412.

In the wafer-level lens, the light-blocking film 414 being patternwise formed on at least one surface of the substrate 410 sufficiently blocks light in the regions excluding the lens surface 412a or lens opening 414a of the 412 and at the same time, suppress the generation of reflected light. Accordingly, when the wafer-level lens is applied to an imaging module with a solid-state imaging device, a trouble such as ghost or flare associated with reflected light can be prevented from occurring during imaging.

Also, the light-blocking film 414 is provided on the substrate surface, eliminating the need to fix a separate light-blocking member or the like on the wafer-level lens, and the rise in the production cost can be suppressed.

Incidentally, in the case of a configuration where a structure with an uneven surface is provided around the lens, a trouble such as ghost may be likely to occur due to reflection or diffusion of light incident on the structure. To get rid of this trouble, when a configuration of, as shown in FIG. 7, providing a patterned light-blocking film 414 in the region excluding a lens surface 412a of a lens 412 is employed, light can be blocked except for the lens surface 412a and the optical performance can be improved.

EXAMPLES

The present invention is described below by referring to Examples, but the present invention is not limited to these Examples by any means.

<Preparation of Binder Solution A>

A 1,000 mL-volume three-neck flask was charged with 159 g of 1-methoxy-2-propanol and heated to 85° C. under nitrogen flow, and a solution prepared by adding 63.4 g of benzyl methacrylate, 72.3 g of methacrylic acid and 4.15 g of V-601 (produced by Wako Pure Chemical Industries, Ltd.) to 159 g of 1-methoxy-2-propanol was added dropwise thereto over 2 hours. After the completion of dropwise addition, the mixture was further heated for 5 hours and thereby reacted.

Subsequently, the heating was stopped, and a benzyl methacrylate/methacrylic acid copolymer (30/70 by mol) was obtained.

Thereafter, 120.0 g out of the copolymer solution was transferred to a 300 mL-volume three-neck flask, and 16.6 g of glycidyl methacrylate and 0.16 g of p-methoxyphenol were added and dissolved by stirring. After the dissolution, 3.0 g of triphenylphosphine was added, and the mixture was heated to 100° C., thereby performing an addition reaction. Disappearance of glycidyl methacrylate was confirmed by gas chromatography, and heating was stopped. Furthermore, 38 g of 1-methoxy-2-propanol was added to prepare Binder Solution A having an acid group content of 2 meq/g (acid value: 112 mgKOH/g), a crosslinking group content of 2.23 meq/g, a weight average molecular weight of 24,000 (in terms of polystyrene by GPC method) and a solid content of 46 mass %.

<Preparation of Binder Solution B>

In a 500 ml-volume three-neck round-bottom flask equipped with a condenser and a stirrer, an isocyanate compound shown below and two kinds of diol compounds shown below were dissolved in a molar ratio shown below in 100 ml of N,N-dimethylacetamide. Thereto, 0.1 g of dibutyltin dilaurate was added, and the mixture was heated with stirring at 100° C. for 8 hours. The resulting solution was diluted with 100 ml of N,N-dimethylformamide and 200 ml of methyl alcohol and stirred for 30 minutes. The reaction solution was poured in 3 liter of water with stirring to precipitate a white polymer. This polymer was separated by filtration, washed with water and dried under vacuum to obtain Urethane-Based Resin P-1. Subsequently, 1-methoxy-2-propanol was added to the urethane-based resin to prepare Binder Solution B having an acid group content of 1.3 meq/g, a crosslinking group content of 1.59 meq/g, a weight average molecular weight of 15,000 (in terms of polystyrene by GPC method) and a solid content of 46 mass %.

1. The viscosity of the composition was 1,020 mPa·s (the solid content concentration of the composition was 50 mass %).

| | |
|---|---|
| Binder Solution A (alkali-soluble binder) | 45.0 parts by mass |
| Dipentaerythritol hexaacrylate (KAYARAD DPHA, trade name, produced by Nippon Kayaku Co., Ltd.) (polymerizable compound) | 10.7 parts by mass |
| Irgacure OXE02 (produced by Ciba Specialty Chemicals) (polymerization initiator) | 1.50 parts by mass |
| Liquid dispersion shown below (filler, alkali-soluble binder) | 35.7 parts by mass |
| Megaface F-780 (produced by DIC Corporation) (surfactant) | 0.13 parts by mass |
| YMF-02 (produced by Sumitomo Metal Mining Co., Ltd., cesium tungsten oxide (a 18.5 mass % liquid dispersion of $Cs_{0.33}WO_3$ (average dispersed particle diameter: 800 nm or less)) | 24.0 parts by mass |

| Polymer No. | Diisocyanate Compound Used (mol %) | Diol Compound Used (mol %) | Weight Average Molecular Weight |
|---|---|---|---|
| P-1 | 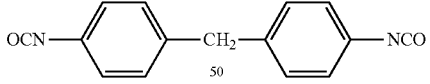 | 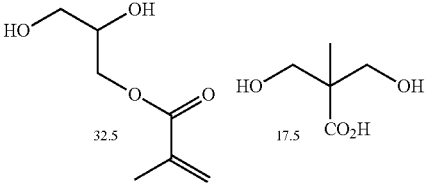 | 15,000 |

<Preparation of Binder Solution C>

A 1,000 mL-volume three-neck flask was charged with 159 g of 1-methoxy-2-propanol and heated to 85° C. under nitrogen flow, and 159 g of a 1-methoxy-2-propanol solution containing 138 g of benzyl methacrylate and 4.15 g of V-601 (produced by Wako Pure Chemical Industries, Ltd.) was added dropwise thereto over 2 hours. After the completion of dropwise addition, the mixture was further heated for 5 hours and thereby reacted.

Subsequently, the heating was stopped, and a benzyl methacrylate polymer was obtained.

Thereafter, 120.0 g out of the copolymer solution above was transferred to a 300 mL-volume three-neck flask, and 42.0 g of glycidyl methacrylate and 0.16 g of p-methoxyphenol were added and dissolved by stirring. After the dissolution, 3.0 g of triphenylphosphine was added, and the mixture was heated to 100° C., thereby performing an addition reaction. Disappearance of glycidyl methacrylate was confirmed by gas chromatography, and heating was stopped. Furthermore, 38 g of 1-methoxy-2-propanol was added to prepare Binder Solution C having an acid group content of 0 meq/g (acid value: 0 mgKOH/g), a crosslinking group content of 3.8 meq/g, a weight average molecular weight of 24,000 (in terms of polystyrene by GPC method) and a solid content of 46 mass %.

Preparation of Polymerizable Composition Solution

Example 1

The components in the following formulation were mixed to obtain the polymerizable composition solution of Example -continued

| | |
|---|---|
| Compound (6-1) (ultraviolet absorber) (maximum absorption wavelength: 369 nm, $A_{550}/A_{max}$: 0) | 0.09 parts by mass |

As for the liquid dispersion above, 30 parts by mass of silica (SO—C2, produced by Admatechs Company Limited) (filler), 48.2 parts by mass of Binder Solution A and 59.0 parts by mass of propylene glycol monomethyl ether acetate were previously mixed, the mixture was then dispersed using zirconia beads of 1.0 mm in diameter by a motor mill M-250 (manufactured by Eiger) at a circumferential velocity of 9 m/s for 3 hours, and the thus-prepared liquid dispersion was used.

Example 2

The composition of Example 2 was obtained according to the same formulation as in Example 1 except for replacing Irgacure OXE02 by Compound (B) shown below. The viscosity of the composition of Example 2 was 1,000 mPa·s.

(Compound B)

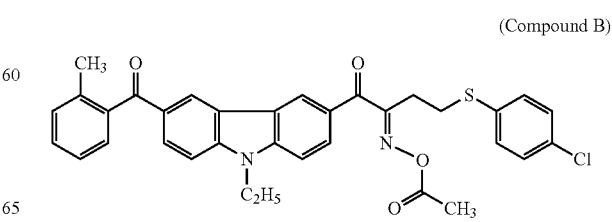

Example 3

The composition of Example 3 was obtained according to the same formulation as in Example 1 except for replacing dipentaerythritol hexaacrylate by tricyclodecane dimethanol diacrylate (A-DCP, trade name, produced by Shin-Nakamura Chemical Co., Ltd.). The viscosity of the composition of Example 3 was 880 mPa·s.

Example 4

The composition of Example 4 was obtained according to the same formulation as in Example 1 except for replacing Irgacure OXE02 (produced by Ciba Specialty Chemicals) by Compound B and replacing dipentaerythritol hexaacrylate by tricyclodecane dimethanol diacrylate (A-DCP, trade name, produced by Shin-Nakamura Chemical Co., Ltd.). The viscosity of the composition of Example 4 was 900 mPa·s.

Example 5

The composition of Example 5 was obtained according to the same formulation as in Example 4 except for replacing Binder Solution A (including Binder Solution A in the liquid dispersion) by Binder Solution B. The viscosity of the composition of Example 5 was 700 mPa·s.

Example 6

The composition of Example 6 was obtained according to the same formulation as in Example 5 except for not using silica in the liquid dispersion. The viscosity of the composition of Example 6 was 500 mPa·s.

Example 7

The components in the following formulation were mixed to obtain the polymerizable composition solution of Example 7. The viscosity of the composition was 910 mPa·s (the solid content concentration of the composition was 50 mass %).

| | |
|---|---|
| Binder Solution A (alkali-soluble binder) | 45.0 parts by mass |
| Dipentaerythritol hexaacrylate (KAYARAD DPHA, trade name, produced by Nippon Kayaku Co., Ltd.) (polymerizable compound) | 10.7 parts by mass |
| Irgacure OXE02 (produced by Ciba Specialty Chemicals) (polymerization initiator) | 1.50 parts by mass |
| Epotohto YDF-170 (produced by Tohto Kasei Co., Ltd., bisphenol F-type epoxy resin) (crosslinking agent) | 5.00 parts by mass |
| The same liquid dispersion as the liquid dispersion in Example 1 (filler, alkali-soluble binder) | 35.7 parts by mass |
| Megaface F-780 (produced by DIC Corporation) (surfactant) | 0.13 parts by mass |
| KHF-7 (produced by Sumitomo Metal Mining Co., Ltd., a lanthanum boride liquid dispersion at a concentration of 3.5 mass % (average particle diameter: 0.3 μm)) | 18.0 parts by mass |
| Compound (6-1) (ultraviolet absorber) (maximum absorption wavelength: 369 nm, $A_{550}/A_{max}$: 0) | 0.09 parts by mass |

Example 8

The composition of Example 8 was obtained according to the same formulation as in Example 4 except for replacing 0.09 parts by mass of Compound (6-1) by 0.45 parts by mass of Compound (1-10) (TINUVIN 326, ultraviolet absorber, produced by BASF Japan) (maximum absorption wavelength: 348 nm, $A_{550}/A_{max}$: 0). The viscosity of the composition of Example 8 was 870 mPa·s.

Example 9

The composition of Example 9 was obtained according to the same formulation as in Example 4 except for replacing 0.09 parts by mass of Compound (6-1) by 0.24 parts by mass of Compound (3-47) (TINUVIN 460, ultraviolet absorber, produced by BASF Japan) (maximum absorption wavelength: 349 nm, $A_{550}/A_{max}$: 0). The viscosity of the composition of Example 9 was 880 mPa·s.

Example 10

The composition of Example 10 was obtained according to the same formulation as in Example 4 except for replacing 0.09 parts by mass of Compound (6-1) by 0.78 parts by mass of Compound (9-8) (maximum absorption wavelength: 332 nm, $A_{550}/A_{max}$: 0.15). The viscosity of the composition of Example 10 was 910 mPa·s.

Example 11

The composition of Example 11 was obtained according to the same formulation as in Example 4 except for replacing 0.09 parts by mass of Compound (6-1) by 0.60 parts by mass of Compound (9-7) (maximum absorption wavelength: 404 nm, $A_{550}/A_{max}$: 0). The viscosity of the composition of Example 11 was 850 mPa·s.

Example 12

The composition of Example 12 was obtained according to the same formulation as in Example 4 except for replacing 0.09 parts by mass of Compound (6-1) by 0.36 parts by mass of Compound (5-5) (maximum absorption wavelength: 407 nm, $A_{550}/A_{max}$: 0) and 0.06 parts by mass of Compound (9-1) (maximum absorption wavelength: 424 nm and 446 nm, $A_{550}/A_{max}$: 0). The viscosity of the composition of Example 12 was 890 mPa·s.

Comparative Example 1

The composition of Comparative Example 1 was obtained according to the same formulation as in Example 4 except for replacing YMF-02 by Carbon Black Liquid Dispersion A shown below. The carbon black has absorption over an almost entire region between a wavelength of 300 nm and a wavelength of 450 nm, and assuming that the maximum absorbance between 300 nm and 450 nm is 1, its absorbance at a wavelength of 550 nm greatly exceeds 0.3.

(Preparation of Carbon Black Liquid Dispersion A)

The components in Formulation I below were subjected to a high-viscosity dispersion treatment using twin rolls to obtain a dispersion. At this time, the viscosity of the dispersion was 70,000 mPa·s.

Thereafter, the mixture of Formulation II below was added to the dispersion, and these were stirred in a homogenizer under the condition of 3,000 rpm for 3 hours. The obtained mixed solution was subjected to a fine dispersion treatment for 4 hours by a disperser (Dispermat, trade name, manufactured by GETZMANN) using zirconia beads of 0.3 mm in diameter to prepare Carbon Black Liquid Dispersion A. At this time, the viscosity of the mixed solution was 37 mPa·s.

| (Formulation I) | |
| --- | --- |
| Carbon black (Pigment Black 7) having an average primary particle diameter of 15 nm | 23 parts by mass |
| A propylene glycol monomethyl ether acetate 45 mass % solution of benzyl methacrylate/methacrylic acid copolymer (benzyl methacrylate unit/methacrylic acid unit = 67/33 (mol %), Mw: 28,000) | 22 parts by mass |
| Solsperse 5000 (produced by The Lubrizol Corporation) | 1.2 parts by mass |
| (Formulation II) | |
| A propylene glycol monomethyl ether acetate 45 mass % solution of benzyl methacrylate/methacrylic acid copolymer (benzyl methacrylate unit/methacrylic acid unit = 67/33 (mol %), Mw: 28,000) | 22 parts by mass |
| Propylene glycol monomethyl ether acetate | 200 parts by mass |

Comparative Example 2

The composition of Comparative Example 2 was obtained according to the same formulation as in Comparative Example 1 except for changing the content of carbon black (Pigment Black 7) having an average primary particle diameter of 15 nm in (Formulation I) to 5 parts by mass.

Comparative Example 3

The composition of Comparative Example 3 was obtained according to the same formulation as in Example 4 except for replacing Binder Solution A (including Binder Solution A in the liquid dispersion) by Binder Solution C.

<Evaluation of Polymerizable Composition for Solder Resist>

(Resist Pattern Formation: Condition A)

Each of the polymerizable compositions obtained in Examples 1 to 12 and Comparative Examples 1 to 3 was coated on a silicon wafer by a spin coating method to have a film thickness of 25 µm and then heated on a hot plate at 120° C. for 2 minutes to obtain a photosensitive layer.

The obtained photosensitive layer was irradiated with light of a high-pressure mercury lamp (manufactured by Ushio Inc.) through a photomask having a pattern of 300 µm in diameter by changing the exposure dose in steps of 50 mJ/cm² in the range of 50 to 2,000 mJ/cm².

The photosensitive laser after the exposure was subjected to puddle development at 25° C. for 40 seconds by using an aqueous 2.38 mass % tetramethylammonium hydroxide solution, then rinsed by spin shower and further washed with pure water to obtain an infrared-blocking solder resist pattern. A minimum exposure dose for obtaining a circle of 300 µm in diameter when applying a development process for 60 seconds was measured and taken as a proper exposure dose. As the numerical value of proper exposure dose is smaller, the sensitivity and pattern formability can be judged as better. Exposure and development were performed using the proper exposure dose to form a pattern, and the pattern was evaluated based on the following evaluation standards. However, with respect to Comparative Example 1, since sufficient resolution was not obtained and the proper exposure amount could not be calculated, the exposure was performed with an dose of 200 mJ/cm² (Comparative Example 1-1) and an exposure dose of 10,000 mJ/cm² (Comparative Example 1-2). Similarly, with respect to Comparative Examples 2 and 3, since sufficient resolution was not obtained and the proper exposure dose could not be calculated, the exposure was performed with an exposure dose of 200 mJ/cm².

[Evaluation Standards]

A: A pattern was formed on a substrate with a sufficient adhesion force and the cross-sectional shape of the pattern exhibited a good rectangular profile (skirt shape could not be confirmed).

B: A kind of a pattern was formed but the cross-sectional shape of the pattern did not exhibit a good rectangular profile and the adherence to the substrate was also not at a satisfactory level.

C: A kind of a pattern was formed but the cross-sectional shape of the pattern did not exhibit a good rectangular profile and a skirt shape was also confirmed. Furthermore, the adherence to the substrate was not at a satisfactory level.

CC: A kind of a pattern was formed but the adherence to the substrate was insufficient and a pattern stably adhering on the substrate could not be formed.

CCC: A pattern could not be resolved.

(Resist Pattern Formation: Condition B)

A pattern was formed in the same manner as in Condition A except for using the silicon wafer after forming a copper layer of 10 µm in thickness on the silicon wafer and subjecting the copper layer surface to a surface roughening treatment by a chemical polishing treatment, and evaluated (here, the exposure dose used to obtain the objective pattern for evaluation was the proper exposure dose determined with respect to each of Examples and Comparative Examples of Condition A).

(Evaluations of Infrared-Blocking Effect and Visible Light Transparency)

Each of the polymerizable compositions of Examples 1 to 12 and Comparative Examples 1 to 3 was spin-coated on a glass substrate to form a photosensitive layer (polymerizable composition layer) coating having a film thickness of 25 µm, and the transmittance at a wavelength of 1,200 nm of the coating was measured using Ultraviolet-Visible-Near Infrared Spectrophotometer UV3600 (manufactured by Shimadzu Corporation). As the numerical value is smaller, the infrared-blocking effect is judged as higher. When the transmittance is 2% or less, the coating can be said to exhibit a practically good infrared-blocking effect.

Furthermore, the transmittance at a wavelength of 550 nm of the coating above was measured using Ultraviolet-Visible-Near Infrared Spectrophotometer UV3600 (manufactured by Shimadzu Corporation). As the numerical value is larger, the visible light transparency is judged as higher. When the transmittance of visible light is 30% or more, the coating can be said to exhibit a practically good visible light transparency.

(Evaluation of Durability Against High Temperature and High Humidity (Evaluation of Insulation Reliability): HAST Test)

On a silicon wafer as a base material, where wiring is formed in a comb form with a copper thickness of 12 µm and copper line/space=50 µm/50 µm, each of the polymerizable compositions of Examples 1 to 12 and Comparative Examples 1 to 3 was coated by a spin coating method to have a thickness of 20 µm on the copper. Thereafter, the coating was heated at 100° C. for 2 minutes on a hot plate to obtain a photosensitive layer.

The obtained photosensitive layer was irradiated with light of a high-pressure mercury lamp at the proper exposure dose determined with respect to each of Examples and Comparative Examples of (Resist Pattern Formation: Condition A).

The photosensitive laser after the exposure was subjected to puddle development at 25° C. for 40 seconds by using an aqueous 2.38 mass % tetramethylammonium hydroxide solution, then rinsed by spin shower, further washed with pure water and thereafter, heat-treated (post-baking) at 150° C. for 1 hour to form a solder resist pattern (permanent pattern). The formed permanent pattern was subjected to a HAST test and evaluated for dendrite and insulation resistance (Ω). In the HAST test, using a high acceleration tester, a voltage of 10 V was applied to an electronic part module for 200 hours in an atmosphere of a temperature of 130° C. and a relative humidity of 85%, the insulation resistance (Ω) of the conductor bump was measured under the same conditions, and the conductor bump was observed for dendrite and evaluated as follows.

[Evaluation Standards]
AA: Absolutely no change in wiring.
A: Dendrite was not observed but anode wiring was slightly changed.
B: Dendrite was not observed but anode wiring was scarcely recognized.
C: Dendrite was observed.

The results of the evaluations above are shown in the Table below.

In Comparative Example 3 not containing an alkali-soluble binder, a pattern could not be resolved.

On the other hand, in the case of using the compositions of Examples, satisfactory results could be obtained in each of the evaluation items above.

Example 4-2

With respect to the polymerizable composition of Example 4, pattern formation was performed in the same manner as in (Resist Pattern Formation: Condition A), (Resist Pattern Formation: Condition B) and (Evaluation of Durability Against High Temperature and High Humidity (Evaluation of Insulation Reliability): HAST test) except for changing the high-pressure mercury lamp to an i-line stepper.

Example 11-2

With respect to the polymerizable composition of Example 11, pattern formation was performed in the same manner as in (Resist Pattern Formation: Condition A), (Resist Pattern For-

TABLE 1

|   | Infrared-Blocking Effect (1200 nm) | Visible Light Transparency (550 nm) | Proper Exposure Amount (mJ/cm$^2$) | Insulation Reliability L/S = 50 μm/50 μm (10 V 200 hr) | Pattern Profile (Condition A) | Pattern Profile (Condition B) |
|---|---|---|---|---|---|---|
| Example 1 | <1% | 62% | 300 | A | A | A |
| Example 2 | <1% | 63% | 200 | A | A | A |
| Example 3 | <1% | 61% | 300 | AA | A | A |
| Example 4 | <1% | 62% | 200 | AA | A | A |
| Example 5 | <1% | 62% | 200 | AA | A | A |
| Example 6 | <1% | 60% | 200 | B | A | A |
| Example 7 | <1% | 62% | 200 | A | A | A |
| Example 8 | <1% | 63% | 200 | AA | A | A |
| Example 9 | <1% | 61% | 200 | AA | A | A |
| Example 10 | <1% | 62% | 200 | AA | A | A |
| Example 11 | <1% | 61% | 200 | AA | A | A |
| Example 12 | <1% | 61% | 200 | AA | A | A |
| Comparative Example 1-1 | <1% | <1% | 200*[1] | could not be evaluated | CC | CC |
| Comparative Example 1-2 | <1% | <1% | 10000*[1] | could not be evaluated | B | C |
| Comparative Example 2 | 60% | 30% | 200*[1] | A | B | C |
| Comparative Example 3 | <1% | 62% | 200*[1] | could not be evaluated | CCC | CCC |

*[1]Since the proper exposure dose could not be measured, the exposure dose was set to 200 mJ/cm$^2$ (Comparative Example 1-1, Comparative Example 2 and Comparative Example 3) or 10,000 mJ/cm$^2$ (Comparative Example 1-2).

The carbon black used in the polymerizable compositions of Comparative Examples 1 and 2 is a material having both the infrared-blocking property and the property having an absorption wavelength between 300 nm and 450 nm, but with respect to Comparative Example 1, in Comparative Example 1-1 where pattern formation was attempted with the same exposure dose as in Examples, satisfactory results were not obtained in the visible light transparency and pattern profile, and in Comparative Example 1-2 where pattern formation was attempted by greatly increasing the exposure dose, satisfactory results were still not obtained in the visible light transparency and pattern profile, though the pattern profile was slightly improved.

Also, in Comparative Example 2, where the amount of carbon black used was decreased, the pattern profile was slightly improved, satisfactory results could not be obtained in the infrared-blocking effect and the visible light transparency.

In this way, in all of the evaluation items above, satisfactory results could not be obtained by the composition containing carbon black.

mation: Condition B) and (Evaluation of Durability Against High Temperature and High Humidity (Evaluation of Insulation Reliability): HAST test) except for changing the high-pressure mercury lamp to an h-line laser exposure machine (INPREX, manufactured by Fujifilm Corporation).

The evaluation results of Example 4-2 and Example 11-2 are shown in the Table below.

TABLE 2

|   | Proper Exposure Dose (mJ/cm$^2$) | Insulation Reliability L/S = 50 μm/ 50 μm (10 V, 200 hr) | Pattern Profile (Condition A) | Pattern Profile (Condition B) |
|---|---|---|---|---|
| Example 4-2 | 200 | AA | A | A |
| Example 11-2 | 400 | AA | A | A |

As seen above, it was confirmed that also when a light source other than a high-pressure mercury lamp was used, satisfactory results could be obtained in each of the evaluation items by using the polymerizable composition of the present invention.

INDUSTRIAL APPLICABILITY

According to the present invention, a polymerizable composition exhibiting high light-blocking effect in the infrared region and high light transparency in the visible region and being capable of forming a pattern with a rectangular cross-sectional shape as well as excellent durability (for example, durability against high temperature/high humidity, or adherence to substrate) by alkali development, can be provided.

Furthermore, according to the present invention, a polymerizable composition ensuring that the pattern obtained has a rectangular cross-sectional shape even when provided on a substrate surface without high light reflectivity or on a substrate surface with high light reflectivity (for example, metal surface), can be provided.

The entire disclosure of each and every foreign patent application from which the benefit of foreign priority has been claimed in the present application is incorporated herein by reference, as if fully set forth.

| [Description of Reference Numerals and Signs] | |
|---|---|
| 10 | Silicon substrate |
| 12 | Imaging device |
| 13 | Interlayer insulating film |
| 14 | Base layer |
| 15 | Color filter |
| 16 | Overcoat |
| 17 | Microlens |
| 18 | Light-blocking film |
| 20 | Adhesive |
| 22 | Insulating film |
| 23 | Metal electrode |
| 24 | Solder resist layer |
| 26 | Internal electrode |
| 27 | Device surface electrode |
| 30 | Glass substrate |
| 40 | Imaging lens |
| 41 | Adhesive |
| 42 | Infrared cut filter |
| 43 | Adhesive |
| 44 | Light-blocking and electromagnetic shield |
| 45 | Adhesive |
| 50 | Lens holder |
| 60 | Solder ball |
| 70 | Circuit substrate |
| 100 | Solid-state imaging device substrate |
| 200 | Camera module |
| 410 | Substrate |
| 412, 420 | Lens |
| 412a | Lens surface |
| 412b | Lens edge |
| 414 | Light-blocking film |
| 414A | Light-blocking coating layer |
| 414a | Lens opening |
| 450 | Dispenser |
| 460, 480 | Mold |
| 462, 482 | Concave |
| 470 | Mask |

The invention claimed is:

1. A polymerizable composition containing:
(A) a polymerization initiator,
(B) a polymerizable compound,
(C) at least either a metal boride or a tungsten compound selected from the group consisting of a tungsten oxide-based compound, a tungsten boride-based compound and a tungsten sulfide-based compound,
(D) a compound having a maximum absorption wavelength between 300 nm and 450 nm and setting the maximum absorbance between 300 nm and 450 nm to 1, having an absorbance of 0.3 or less at a wavelength of 550 nm, and
(E) an alkali-soluble binder.

2. The polymerizable composition as claimed in claim 1, wherein the alkali-soluble binder has an acid group.

3. The polymerizable composition as claimed in claim 1, wherein the alkali-soluble binder has a crosslinking group.

4. The polymerizable composition as claimed in claim 1, wherein the alkali-soluble binder is a (meth)acrylic resin or a urethane-based resin.

5. The polymerizable composition as claimed in claim 4, wherein the alkali-soluble binder is a urethane-based resin.

6. The polymerizable composition as claimed in claim 1, wherein the polymerizable composition contains the tungsten oxide-based compound and the tungsten oxide-based compound is represented by the following formula (I):

$$M_xW_yO_z \qquad (I)$$

wherein M represents a metal, W represents tungsten, O represents oxygen,
$0.001 \le x/y \le 1.1$, and
$2.2 \le z/y \le 3.0$.

7. The polymerizable composition as claimed in claim 6, wherein the M is an alkali metal.

8. The polymerizable composition as claimed in claim 1, wherein the polymerizable composition contains the metal boride and the metal boride is at least one member selected from the group consisting of lanthanum boride, praseodymium boride, neodymium boride, cerium boride, yttrium boride, titanium boride, zirconium boride, hafnium boride, vanadium boride, tantalum boride, chromium boride, molybdenum boride and tungsten boride.

9. The polymerizable composition as claimed in claim 8, wherein the metal boride is lanthanum boride.

10. The polymerizable composition as claimed in claim 1, wherein the compound (D) is an ultraviolet absorber,
wherein the compound (D) is a compound represented by any one of the following formulae (1) to (8):

Formula (1):

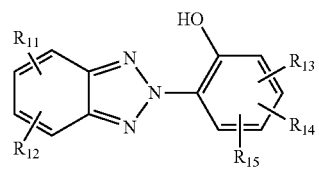

in the formula, each of $R_{11}$, $R_{12}$, $R_{13}$, $R_{14}$ and $R_{15}$ independently represents a hydrogen atom, a halogen atom, an alkyl group, an alkoxy group, an aryl group, an aryloxy group, an alkenyl group, a nitro group, an amino group, a carboxy group or a salt thereof, a sulfo group or a salt thereof, an alkylthio group, an arylthio group, an acyl group, an oxycarbonyl group, a cyano group, a heterocyclic group, a sulfonyl group, a sulfinyl group, an acyloxy group, a carbamoyl group, a sulfamoyl group or a hydroxy group,
any one of $R_{11}$ to $R_{15}$ may combine with any one of $R_{11}$ to $R_{15}$ in another compound represented by formula (1) to form a dimer:

Formula (2):

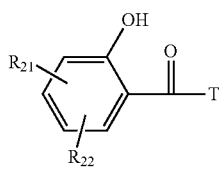

in the formula, each of $R_{21}$ and $R_{22}$ independently represents a hydrogen atom, a halogen atom, an alkyl group, an alkenyl group, an aryl group, an alkoxy group, an aryloxy group, an alkylthio group, an arylthio group, an amino group, a hydroxy group, a cyano group, a nitro group, a carbamoyl group, a sulfamoyl group, a carboxyl group or a salt thereof, a sulfo group or a salt thereof, a sulfonyl group, an acyloxy group, an acyl group or an oxycarbonyl group, T represents an aryl group, a heterocyclic group or an aryloxy group, either one of $R_{21}$ and $R_{22}$ may combine with either one of $R_{21}$ and $R_{22}$ in another compound represented by formula (2) to form a dimer:

Formula (3):

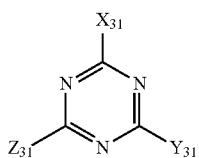

in the formula, each of $X_{31}$, $Y_{31}$ and $Z_{31}$ independently represents a substituted or unsubstituted alkyl group, an aryl group, an alkoxy group, an aryloxy group, an alkylthio group, an arylthio group, an amino group or a heterocyclic group, provided that at least one of $X_{31}$, $Y_{31}$ and $Z_{31}$ represents a group represented by the following formula (a):

Formula (a):

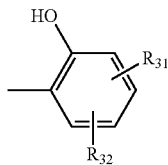

in the formula, each of $R_{31}$ and $R_{32}$ independently represents a hydrogen atom, a halogen atom, a substituted or unsubstituted alkyl group, an alkenyl group, an aryl group, an alkoxy group, an aryloxy group, an acyloxy group, an alkylthio group, an arylthio group, an amino group, an acyl group, a hydroxy group, an oxycarbonyl group, a carbamoyl group or a sulfamoyl group, adjacent $R_{31}$ and $R_{32}$ may combine with each other to form a ring:

Formula (4):

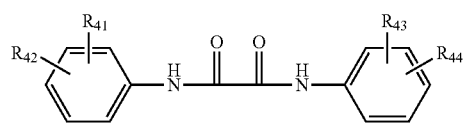

in the formula, each of $R_{41}$ to $R_{44}$ independently represents a hydrogen atom, a halogen atom, an alkyl group, an alkoxy group, an aryl group, an aryloxy group, an alkenyl group, a nitro group, an amino group, a carboxy group or a salt thereof, a sulfo group or a salt thereof, an alkylthio group, an arylthio group, an acyl group, an oxycarbonyl group, a cyano group, a heterocyclic group, a sulfonyl group, a sulfinyl group, an acyloxy group, a carbamoyl group, a sulfamoyl group or a hydroxy group:

Formula (5):

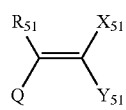

in the formula, Q represents an aryl group or a heterocyclic group, $R_{51}$ represents a hydrogen atom or an alkyl group, each of $X_{51}$ and $Y_{51}$ independently represents a cyano group, —$COOR_{52}$, —$CONR_{52}R_{53}$, —$COR_{52}$, —$SO_2R_{52}$ or —$SO_2R_{52}R_{53}$, and each of $R_{52}$ and $R_{53}$ independently represents a hydrogen atom, an alkyl group or an aryl group, $X_{51}$ and $Y_{51}$ may combine with each other to form a 5- or 6-membered ring, when $X_{51}$ and $Y_{51}$ are a carboxyl group, they may be in a salt form:

Formula (6):

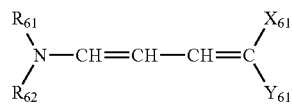

in the formula, each of $R_{61}$ and $R_{62}$ independently represents a hydrogen atom, an alkyl group, an aryl group, or a nonmetallic atom group necessary for forming a 5- or 6-membered ring by combining with each other, either one of $R_{61}$ and $R_{62}$ may combine with the methine group next to the nitrogen atom to form a 5- or 6-membered ring, $X_{61}$ and $Y_{61}$, which may be the same or different, have the same meanings as $X_{51}$ and $Y_{51}$ in formula (5), $X_{61}$ and $Y_{61}$ may combine with each other to form a 5- or 6-membered ring, any one of $R_{61}$, $R_{62}$, $X_{61}$ and $Y_{61}$ may combine with any one of $R_{61}$, $R_{62}$, $X_{61}$ and $Y_{61}$ in another compound represented by formula (6) to form a dimer:

Formula (7):

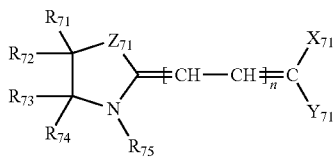

in the formula, each of $R_{71}$ to $R_{74}$ independently represents a hydrogen atom, an alkyl group or an aryl group, $R_{71}$ and $R_{74}$ may form together a double bond, and when $R_{71}$ and $R_{74}$ form together a double bond, $R_{72}$ and $R_{73}$ may combine to form a benzene ring or a naphthalene ring, $R_{75}$ represents an alkyl group or an aryl group, $Z_{71}$ represents an oxygen atom, a sulfur atom, a methylene group, an ethylene group, $>N-R_{76}$ or $>C(R_{77})(R_{78})$, $R_{76}$ represents an alkyl group or an aryl group, each of $R_{77}$ and $R_{78}$ independently represents a hydrogen atom or an alkyl group, $X_{71}$ and $Y_{71}$, which may be the same or different, have the same meanings as $X_{51}$ and $Y_{51}$ in formula (5), $X_{71}$ and $Y_{71}$ may combine with each other to form a 5- or 6-membered ring, n represents 0 or 1:

Formula (8):

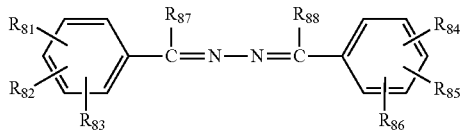

in the formula, each of $R_{81}$ to $R_{86}$ independently represents a hydrogen atom, a halogen atom, an alkyl group, an alkoxy group, an aryl group, an aryloxy group, an alkenyl group, a nitro group, an amino group, a carboxy group or a salt thereof, a sulfo group or a salt thereof, an alkylthio group, an arylthio group, an acyl group, an oxycarbonyl group, a cyano group, a heterocyclic group, a sulfonyl group, a sulfinyl group, an acyloxy group, a carbamoyl group, a sulfamoyl group or a hydroxy group, each of $R_{87}$ and $R_{88}$ independently represents a hydrogen atom, an alkyl group or an aryl group, and $R_{87}$ and $R_{88}$ may combine with each other to form a 5- or 6-membered ring.

11. The polymerizable composition as claimed in claim 1, wherein the polymerizable compound is a polyfunctional polymerizable compound having a plurality of polymerizable groups within the molecule, wherein the polymerizable compound is an ester monomer of an aliphatic polyhydric alcohol compound with an unsaturated carboxylic acid.

12. The polymerizable composition as claimed in claim 1, which further contains a filler.

13. A method for preparing a solder resist, comprising:
utilizing the polymerizable composition according to claim 1.

14. The polymerizable composition as claimed in claim 13, wherein the solid content concentration is from 30 to 80 mass % and the viscosity at 25° C. is from 10 to 3,000 mPa·s.

15. The polymerizable composition as claimed in claim 10, wherein the compound (D) is a compound represented by any one of the formulae (1), (3), (5), (6) and (7).

* * * * *